United States Patent
Park et al.

(10) Patent No.: US 11,961,844 B2
(45) Date of Patent: Apr. 16, 2024

(54) PIXEL AND DISPLAY DEVICE INCLUDING THE SAME

(71) Applicant: Samsung Display Co., LTD., Yongin-si (KR)

(72) Inventors: Do Yeong Park, Yongin-si (KR); Won Jun Lee, Yongin-si (KR); Sung Chul Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/121,698

(22) Filed: Mar. 15, 2023

(65) Prior Publication Data

US 2023/0326931 A1    Oct. 12, 2023

(30) Foreign Application Priority Data

Apr. 8, 2022 (KR) .................. 10-2022-0044040

(51) Int. Cl.
*H01L 27/12* (2006.01)
*G09G 3/3233* (2016.01)
*H01L 25/16* (2023.01)

(52) U.S. Cl.
CPC ......... *H01L 27/124* (2013.01); *G09G 3/3233* (2013.01); *H01L 25/167* (2013.01); *G09G 2300/0842* (2013.01); *G09G 2300/0861* (2013.01); *G09G 2330/028* (2013.01); *H01L 27/1255* (2013.01)

(58) Field of Classification Search
CPC . H01L 27/124; H01L 25/167; H01L 27/1255; H01L 33/20; H01L 33/62; H01L 25/0753; H01L 27/1248; H01L 33/38; G09G 3/3233; G09G 2300/0842; G09G 2300/0861; G09G 2330/028; G09G 3/32;
(Continued)

(56) References Cited

U.S. PATENT DOCUMENTS 10,249,603 B2    4/2019    Cho et al.
10,276,630 B2    4/2019    Lee et al.
(Continued)

FOREIGN PATENT DOCUMENTS

EP          3 675 165         7/2020
KR    10-2018-0009014         1/2018
(Continued)

*Primary Examiner* — Abhishek Sarma
(74) *Attorney, Agent, or Firm* — KILE PARK REED & HOUTTEMAN PLLC

(57) ABSTRACT

A pixel may include a first sub-pixel, a third sub-pixel, and a second sub-pixel arranged in a second direction, and each including an emission area and a non-emission area. Each of the first sub-pixel, the second sub-pixel, and the third sub-pixel may include a pixel circuit including at least one transistor and a storage capacitor, a first alignment electrode disposed on the pixel circuit, a second alignment electrode extending spaced apart from the first alignment electrode, a light emitting element disposed between the second alignment electrode and the first alignment electrode, and including a first end adjacent to the second alignment electrode and a second end adjacent to the first alignment electrode, and a bridge pattern spaced apart from the first alignment electrode and the second alignment electrode, and electrically connected to the storage capacitor.

20 Claims, 26 Drawing Sheets

(58) Field of Classification Search
CPC ..... G09G 2300/0426; G09G 2300/043; G09G 2300/0809
See application file for complete search history.

(56) References Cited

U.S. PATENT DOCUMENTS

| | | |
|---|---|---|
| 10,340,419 B2 | 7/2019 | Kim et al. |
| 2021/0265329 A1 | 8/2021 | Woo et al. |
| 2022/0102422 A1 | 3/2022 | Lee et al. |
| 2022/0173297 A1* | 6/2022 | Son .................. H01L 25/167 |
| 2022/0392923 A1 | 12/2022 | Oh et al. |
| 2023/0055222 A1 | 2/2023 | Jeong et al. |

FOREIGN PATENT DOCUMENTS

| | | |
|---|---|---|
| KR | 10-2018-0011404 | 2/2018 |
| KR | 10-1987196 | 6/2019 |
| WO | 2021/096070 | 5/2021 |
| WO | 2021/162180 | 8/2021 |

\* cited by examiner

PIXEL AND DISPLAY DEVICE INCLUDING THE SAME

CROSS-REFERENCE TO RELATED APPLICATION(S)

This application claims priority to and benefits of Korean patent application number 10-2022-0044040 under 35 U.S.C. 119, filed on Apr. 8, 2022 in the Korean Intellectual Property Office, the entire contents of which are incorporated herein by reference.

BACKGROUND

1. Technical Field

Various embodiments of the present disclosure relate to a pixel and a display device including the pixel.

2. Description of Related Art

Recently, as interest in information display increases, research and development of display devices has been continuously conducted.

SUMMARY

Various embodiments of the present disclosure are directed to a pixel having improved reliability, and a display device including such a pixel.

A pixel in accordance with an embodiment may include a first sub-pixel, a third sub-pixel, and a second sub-pixel arranged in a second direction, and each including an emission area and a non-emission area. Each of the first sub-pixel, the second sub-pixel, and the third subpixel may include a pixel circuit including at least one transistor and a storage capacitor, a first alignment electrode disposed on the pixel circuit, and extending in the second direction, a second alignment electrode extending in the second direction, and spaced apart from the first alignment electrode in a first direction intersecting the second direction, a light emitting element disposed between the second alignment electrode and the first alignment electrode, and including a first end adjacent to the second alignment electrode and a second end adjacent to the first alignment electrode, and a bridge pattern spaced apart from the first alignment electrode and the second alignment electrode, and electrically connected to the storage capacitor. In an embodiment, the bridge pattern may include a first bridge pattern electrically connected to the storage capacitor of the first sub-pixel, a second bridge pattern electrically connected to the storage capacitor of the second sub-pixel, and a third bridge pattern electrically connected to the storage capacitor of the third sub-pixel. In a plan view, the first bridge pattern, the third bridge pattern, and the second bridge pattern may be located at a same column.

In an embodiment, each of the first, second, and third sub-pixels may further include a first electrode and a second electrode which may be electrically connected to the light emitting element and may be spaced apart from each other in the first direction. The first electrode of the first sub-pixel may overlap the first bridge pattern. The first electrode of the second sub-pixel may overlap the second bridge pattern. The first electrode of the third sub-pixel may overlap the third bridge pattern.

In an embodiment, the first electrode of the first sub-pixel may be electrically connected to the first bridge pattern through a first contactor. The first electrode of the second sub-pixel may be electrically connected to the second bridge pattern through a second contactor. The first electrode of the third sub-pixel may be electrically connected to the third bridge pattern through a third contactor. The first contactor, the third contactor, and the second contactor may be arranged in the second direction in an order listed.

In an embodiment, the storage capacitor may include a lower electrode, and an upper electrode overlapping the lower electrode. The first bridge pattern may be electrically connected to the upper electrode of the storage capacitor of the first sub-pixel through a first via hole. The second bridge pattern may be electrically connected to the upper electrode of the storage capacitor of the second sub-pixel through a second via hole. The third bridge pattern may be electrically connected to the upper electrode of the storage capacitor of the third sub-pixel through a third via hole.

In an embodiment, the first contactor may overlap the upper electrode of the first sub-pixel. The second contactor may overlap the upper electrode of the second sub-pixel. The third contactor may overlap the upper electrode of the third sub-pixel.

In an embodiment, each of the first sub-pixel, the second sub-pixel, and the third sub-pixel may further include an auxiliary line spaced apart from the first alignment electrode, the second alignment electrode, and the first to the third bridge patterns. The auxiliary line may be electrically connected to the second electrode of each of the first sub-pixel, the second sub-pixel, and the third sub-pixel.

In an embodiment, the pixel may further include a first power line to which a voltage of a first driving power supply may be supplied, and a second power line to which a voltage of a second driving power supply different from the voltage of the first driving power supply may be applied. The first power line may be electrically connected to the upper electrode of each of the first sub-pixel, the second sub-pixel, and the third sub-pixel. The second power line may be electrically connected to the auxiliary line.

In an embodiment, the first alignment electrode of the first sub-pixel, the first alignment electrode of the third sub-pixel, and the first alignment electrode of the second sub-pixel may be integrally formed and electrically connected to each other. The second alignment electrode of the first sub-pixel, the second alignment electrode of the third sub-pixel, and the second alignment electrode of the second sub-pixel may be integrally formed and electrically connected to each other.

In an embodiment, the pixel may further include a bank pattern disposed under each of the first alignment electrode and the second alignment electrode, an insulating layer disposed on the first alignment electrode and the second alignment electrode, and a first bank disposed on the insulating layer in the non-emission area. The first bank may include a vertical bank disposed between the first alignment electrode and the second alignment electrode in at least the emission area, and extending in the second direction. In a cross-sectional view, a thickness of the vertical bank may be less than a thickness of the first bank.

In an embodiment, the first bank may be disposed neither between the first sub-pixel and the third sub-pixel nor between the third sub-pixel and the second sub-pixel.

In an embodiment, the first bank may further include first horizontal banks respectively disposed between the first sub-pixel and the third sub-pixel and between the third sub-pixel and the second sub-pixel, each of the first horizontal banks extending in the first direction and intersecting the vertical bank.

In an embodiment, the pixel may further include a bank pattern disposed on each of the first alignment electrode and the second alignment electrode, an insulating layer disposed on the bank pattern and including a first opening formed to expose an area of the bank pattern, and a first bank disposed in the non-emission area.

In an embodiment, the bank pattern and the first bank may be integrally formed and disposed on a same layer. The insulating layer may include a second opening formed to expose an area of the first bank.

In an embodiment, the first alignment electrode may include a 1-1-th alignment electrode, a 1-2-th alignment electrode, a 1-3-th alignment electrode, a 1-4-th alignment electrode, and a 1-5-th alignment electrode spaced apart from each other in the first direction and each extending in the second direction. The second alignment electrode may include a 2-1-th alignment electrode, a 2-2-th alignment electrode, a 2-3-th alignment electrode, a 2-4-th alignment electrode, and a 2-5-th alignment electrode spaced apart from each other in the first direction and each extending in the second direction. The first alignment electrode and the second alignment electrode may be alternately disposed in the first direction.

In an embodiment, the first electrode of each of the first sub-pixel, the second sub-pixel, and the third sub-pixel may overlap the 2-1-th alignment electrode, and the second electrode of a corresponding sub-pixel may overlap the 1-5-th alignment electrode.

In an embodiment, each of the first sub-pixel, the second sub-pixel, and the third sub-pixel may further include a first intermediate electrode disposed between the first electrode and the second electrode at a position spaced apart from the first and the second electrodes in the first direction, and overlapping the 1-1-th alignment electrode and the 2-2-th alignment electrode, a second intermediate electrode disposed between the first intermediate electrode and the second electrode at a position spaced apart from the first intermediate electrode and the second electrode in the first direction, and overlapping the 1-2-th alignment electrode and the 2-3-th alignment electrode, a third intermediate electrode disposed between the second intermediate electrode and the second electrode at a position spaced apart from the second intermediate electrode and the second electrode in the first direction, and overlapping the 1-3-th alignment electrode and the 2-4-th alignment electrode, and a fourth intermediate electrode disposed between the third intermediate electrode and the second electrode at a position spaced apart from the third intermediate electrode and the second electrode in the first direction, and overlapping the 1-4-th alignment electrode and the 2-5-th alignment electrode.

In an embodiment, the light emitting element of each of the first sub-pixel, the second sub-pixel, and the third sub-pixel may include a first light emitting element disposed between the 2-1-th alignment electrode and the 1-1-th alignment electrode, and including a first end electrically connected to the first electrode, and a second end electrically connected to the first intermediate electrode, a second light emitting element disposed between the 2-2-th alignment electrode and the 1-2-th alignment electrode, and including a first end electrically connected to the first intermediate electrode, and a second end electrically connected to the second intermediate electrode, a third light emitting element disposed between the 2-3-th alignment electrode and the 1-3-th alignment electrode, and including a first end electrically connected to the second intermediate electrode, and a second end electrically connected to the third intermediate electrode, a fourth light emitting element disposed between the 2-4-th alignment electrode and the 1-4-th alignment electrode, and including a first end electrically connected to the third intermediate electrode, and a second end electrically connected to the fourth intermediate electrode, and a fifth light emitting element disposed between the 2-5-th alignment electrode and the 1-5-th alignment electrode, and including a first end electrically connected to the fourth intermediate electrode, and a second end electrically connected to the second electrode.

In an embodiment, each of the first, the second, and the third sub-pixels may include a second bank disposed on the first bank in the non-emission area, a color conversion layer disposed over the first to the fifth light emitting elements in the emission area, and that converts a first color of light emitted from the first to the fifth light emitting elements to a second color of light, and a color filter disposed on the color conversion layer and that allows the second color of light to selectively pass therethrough.

In an embodiment, the second bank may further include second horizontal banks respectively disposed between the first sub-pixel and the third sub-pixel and between the third sub-pixel and the second sub-pixel, each of the second horizontal banks extending in the first direction.

A display device in accordance with an embodiment may include a substrate including a display area and a non-display area, and at least one pixel disposed in the display area, and including a first sub-pixel, a third sub-pixel, and a second sub-pixel each including an emission area and a non-emission area and arranged in a second direction. Each of the first sub-pixel, the second sub-pixel, and the third sub-pixel may include a pixel circuit including at least one transistor and a storage capacitor, a first alignment electrode disposed on the pixel circuit, and extending in the second direction, a second alignment electrode extending in the second direction, and spaced apart from the first alignment electrode in a first direction intersecting the second direction, a light emitting element disposed between the second alignment electrode and the first alignment electrode, and including a first end adjacent to the second alignment electrode and a second end adjacent to the first alignment electrode, and a bridge pattern spaced apart from the first alignment electrode and the second alignment electrode, and electrically connected to the storage capacitor. In an embodiment, the bridge pattern may include a first bridge pattern electrically connected to the storage capacitor of the first sub-pixel, a second bridge pattern electrically connected to the storage capacitor of the second sub-pixel, and a third bridge pattern electrically connected to the storage capacitor of the third sub-pixel. In a plan view, the first bridge pattern, the third bridge pattern, and the second bridge pattern may be located at a same column.

DETAILED DESCRIPTION OF THE EMBODIMENTS

Figure 1:
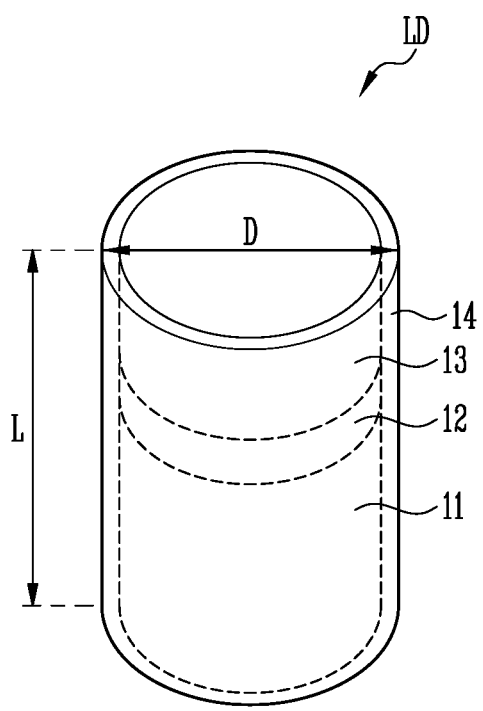
FIG. 1 is a schematic perspective view illustrating a light emitting element in accordance with an embodiment.

As the disclosure allows for various changes and numerous embodiments, only a limited number of particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", etc. when used in this disclosure, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In case that it is expressed that a first part such as a layer, a film, a region, or a plate is formed on a second part, the surface of the second part on which the first part is formed is not limited to an upper surface of the second part but may include other surfaces such as a side surface or a lower surface of the second part. Similarly, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) may intervene between the element and the other element.

Embodiments and required details of the disclosure are described with reference to the accompanying drawings in order to describe the disclosure in detail so that those having ordinary knowledge in the technical field to which the disclosure pertains can readily practice the disclosure. Furthermore, a singular form may include a plural form, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
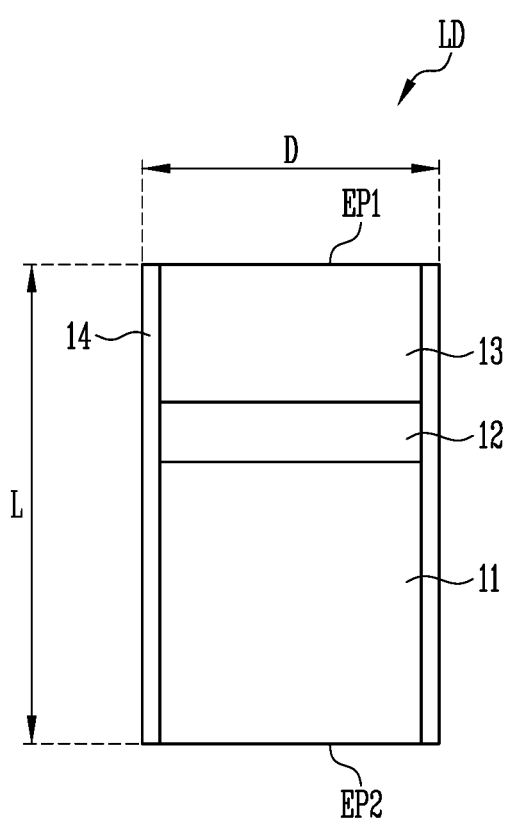
FIG. 2 is a schematic cross-sectional view illustrating the light emitting element of FIG. 1.

FIG. 1 is a schematic perspective view illustrating a light emitting element LD in accordance with an embodiment. FIG. 2 is a schematic cross-sectional view illustrating the light emitting element LD of FIG. 1.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stack pattern") formed by successively stacking the first semiconductor layer 11, the active layer 12, and the second semiconductor layer 13. In an embodiment, the type and/or shape of the light emitting element LD is not limited to the embodiments illustrated in FIGS. 1 and 2.

The light emitting element LD may be formed in a shape extending in a direction. If the direction in which the light emitting element LD extends is defined as a longitudinal direction, the light emitting element LD may have a first end EP1 and a second end EP2 that may be opposite to each other in the longitudinal direction. One semiconductor layer of the first semiconductor layer 11 and the second semiconductor layer 13 may be disposed on the first end EP1 of the light emitting element LD, and the other semiconductor layer of the first semiconductor layer 11 and the second semiconductor layer 13 may be disposed on the second end EP2 of the light emitting element LD. For example, the second semiconductor layer 13 may be disposed on the first end EP1 of the light emitting element LD, and the first semiconductor layer 11 may be disposed on the second end EP2 of the light emitting element LD.

The light emitting element LD may have various shapes. For example, as illustrated in FIG. 1, the light emitting element LD may have a rod-like shape, a bar-like shape, or a pillar-like shape which may be long in the longitudinal direction (i.e., to have an aspect ratio greater than 1). In another embodiment, the light emitting element LD may have a rod-like shape, a bar-like shape, or a pillar-like shape which may be short in the longitudinal direction (or has an aspect ratio less than 1). As another example, the light emitting element LD may have a rod-like shape, a bar-like shape, or a pillar-like shape having an aspect ratio of 1.

The light emitting element LD may include a light emitting diode (LED) fabricated to have a subminiature size, e.g., with a diameter D and/or a length L corresponding to a range from the nano scale (or the nanometer scale) to the micro scale (or the micrometer scale).

In case that the light emitting element LD is long (i.e., to have an aspect ratio greater than 1) in the longitudinal direction, the diameter D of the light emitting element LD may range from about 0.5 µm to about 6 µm, and the length L thereof may range from about 1 µm to about 10 µm. However, the diameter D and the length L of the light emitting element LD are not limited thereto. The size of the light emitting element LD may be changed to meet requirements (or design conditions) of a lighting device or a self-emissive display device to which the light emitting element LD may be applied.

The first semiconductor layer 11 may include, for example, at least one n-type semiconductor layer. For instance, the first semiconductor layer 11 may include an n-type semiconductor layer which includes at least one semiconductor material of InAlGaN, GaN, AlGaN, InGaN, AlN, and InN and may be doped with a first conductive dopant (or an n-type dopant) such as Si, Ge, and/or Sn. However, the constituent material of the first semiconductor layer 11 is not limited thereto, and various other materials may be used to form the first conductive semiconductor layer 11. In an embodiment, the first semiconductor layer 11 may include, in the longitudinal direction of the light emitting element LD, an upper surface which contacts the active layer 12, and a lower surface exposed to the outside.

The active layer 12 (or an emission layer) may be disposed (or located) on the first semiconductor layer 11, and may have a single or multiple quantum well structure. For example, in case that the active layer 12 has a multiple quantum well structure, the active layer 12 may be formed by periodically and repeatedly stacking a barrier layer (not shown), a strain reinforcing layer, and a well layer which may be provided as a unit. The strain reinforcing layer may have a lattice constant that may be less than that of the barrier layer so that strain, e.g., compressive strain, to be applied to the well layer may be further reinforced. However, the structure of the active layer 12 is not limited to that of the foregoing embodiment.

The active layer 12 may emit light having a wavelength ranging from 400 nm to 900 nm, and have a double hetero structure. In an embodiment, a clad layer doped with a conductive dopant may be formed over and/or under the active layer 12 in the longitudinal direction of the light emitting element LD. For example, the clad layer may be formed of an AlGaN layer or an InAlGaN layer. In an embodiment, material such as AlGaN or InAlGaN may be used to form the active layer 12, and various other materials may be used to form the active layer 12. The active layer 12 may include a first surface which contacts the first semiconductor layer 11, and a second surface which contacts the second semiconductor layer 13.

If an electric field having a certain voltage or more is applied between the opposite ends of the light emitting element LD, the light emitting element LD may emit light by coupling of electron-hole pairs in the active layer 12. Because light emission of the light emitting element LD may be controlled based on the foregoing principle, the light emitting element LD may be used as a light source (or a light emitting source) of various light emitting devices as well as a pixel of a display device.

The second semiconductor layer 13 may be disposed (or located) on the second surface of the active layer 12, and have include a semiconductor layer of a type different from that of the first semiconductor layer 11. For example, the second semiconductor layer 13 may include at least one p-type semiconductor layer. For instance, the second semiconductor layer 13 may include a p-type semiconductor layer which includes at least one semiconductor material of InAlGaN, GaN, AlGaN, InGaN, AlN, and InN, and may be doped with a second conductive dopant (or a p-type dopant) such as Mg, Zn, Ca, Sr, and/or Ba. However, the material for forming the second semiconductor layer 13 is not limited thereto, and various other materials may be used to form the second semiconductor layer 13. In an embodiment, the second semiconductor layer 13 may include, in the longitudinal direction of the light emitting element LD, a lower surface which contacts the second surface of the active layer 12, and an upper surface exposed to the outside.

In an embodiment, the first semiconductor layer 11 and the second semiconductor layer 13 may have different thicknesses in the longitudinal direction of the light emitting element LD. For example, the first semiconductor layer 11 may have a thickness that may be greater than that of the second semiconductor layer 13 in the longitudinal direction of the light emitting element LD. Hence, the active layer 12 of the light emitting element LD may be disposed (or located) at a position closer to the upper surface of the second semiconductor layer 13 than to the lower surface of the first semiconductor layer 11.

Although the first semiconductor layer 11 and the second semiconductor layer 13 may be formed of a single layer, the disclosure is not limited thereto. In an embodiment, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer which may be disposed (or located) between semiconductor layers having different lattice structures and thus may function as a buffer layer to reduce a difference in lattice constant. Although the TSBR layer may be formed of a p-type semiconductor layer such as p-GaInP, p-AlInP, and/or p-AlGaInP, the disclosure is not limited thereto.

In an embodiment, the light emitting element LD may further include a contact electrode (hereinafter referred to as 'first contact electrode') disposed (or located) over the second semiconductor layer 13, as well as including the first semiconductor layer 11, the active layer 12, and the second semiconductor layer 13. Furthermore, in an embodiment, the light emitting element LD may further include another contact electrode (hereinafter referred to as 'second contact electrode') disposed (or located) on an end of the first semiconductor layer 11.

Each of the first and second contact electrodes may be an ohmic contact electrode, but the disclosure is not limited thereto. In an embodiment, each of the first and second contact electrodes may be a Schottky contact electrode. The first and second contact electrodes may include conductive material. For example, the first and second contact electrodes may include opaque metal such as chrome (Cr), titanium (Ti), aluminum (Al), gold (Au), nickel (Ni), and oxides or alloys thereof, which may be used alone or in combination, but the disclosure is not limited thereto. In an embodiment, the first and second contact electrodes may also include transparent conductive oxides such as indium tin oxide (ITO), indium zinc oxide (IZO), zinc oxide ($ZnO_x$), indium gallium zinc oxide (IGZO), and indium tin zinc oxide (ITZO). Here, the zinc oxide ($ZnO_x$) may be zinc oxide (ZnO) and/or zinc peroxide ($ZnO_2$).

Materials included in the first and second contact electrodes may be the same as or different from each other. The first and second contact electrodes may be substantially transparent or translucent. Therefore, light generated from the light emitting element LD may pass through each of the first and second contact electrodes and be emitted outside the light emitting element LD. In some embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In an embodiment, the light emitting element LD may further include an insulating layer 14. However, in some embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to contacting conductive material other than the first and second semiconductor layers 11 and 13. Furthermore, the insulating layer 14 may reduce or minimize a surface defect of the light emitting element LD, thus enhancing the lifetime and emission efficiency of the light emitting element LD. In case that multiple light emitting elements LD are disposed (or located) in close contact with each other, the insulating layer 14 may reduce or prevent the likelihood of an undesired short-circuit from occurring between the light emitting elements LD. The presence or non-presence of the insulating layer 14 is not limited, so long as the active layer 12 may be prevented from short-circuiting with external conductive material.

The insulating layer 14 may be provided to enclose an overall outer circumferential surface of the emission stack including the first semiconductor layer 11, the active layer 12, and the second semiconductor layer 13.

Although in the foregoing embodiment the insulating layer 14 has been described as enclosing the entirety of the respective outer circumferential surfaces of the first semiconductor layer 11, the active layer 12, and the second semiconductor layer 13, the disclosure is not limited thereto. In an embodiment, in case that the light emitting element LD includes the first contact electrode, the insulating layer 14 may enclose the entirety of the respective outer circumferential surfaces of the first semiconductor layer 11, the active layer 12, the second semiconductor layer 13, and the first contact electrode. In an embodiment, the insulating layer 14 may not enclose the entirety of the outer circumferential surface of the first semiconductor layer 11, or may enclose only a portion of the outer circumferential surface of the first semiconductor layer 11 without enclosing another portion of the outer circumferential surface of the first semiconductor layer 11. Furthermore, in an embodiment, in case that the first contact electrode is disposed on the first end EP1 of the light emitting element LD and the second contact electrode is disposed on the second end EP2 of the light emitting element LD, the insulating layer 14 may allow at least one area of each of the first and second contact electrodes to be exposed.

The insulating layer 14 may include transparent insulating material. For example, the insulating layer 14 may include one or more insulating materials selected from the group of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($Co_xO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulation may be used as the material of the insulating layer 14.

The insulating layer 14 may be provided in the form of a single layer or in the form of multiple layers including double layers. For example, in case that the insulating layer 14 is formed of a double layer structure including a first layer and a second layer that may be successively stacked, the first layer and the second layer may be made of different materials (or substances) and be formed through different processes. In an embodiment, the first layer and the second layer may include the same material, and may be formed through a successive process.

In an embodiment, the light emitting element LD may be implemented as a light emitting pattern having a core-shell structure. The first semiconductor layer 11 may be disposed (or located) in a core of the light emitting element LD, i.e., a central portion of the light emitting element LD. The active layer 12 may be provided and/or formed to enclose the outer circumferential surface of the first semiconductor layer 11. The second semiconductor layer 13 may be provided and/or formed to enclose the active layer 12. Furthermore, the light emitting element LD may further include a contact electrode formed to enclose at least one side of the second semiconductor layer 13. In an embodiment, the light emitting element LD may further include an insulating layer 14 that may be provided on the outer circumferential surface of the light emitting pattern having a core-shell structure, and that has transparent insulating material. The light emitting element LD implemented as the light emitting pattern having the core-shell structure may be manufactured in a growth manner.

The light emitting element LD may be employed as a light emitting source (or a light source) for various display devices. The light emitting element LD may be fabricated through a surface treatment process. For example, the light emitting element LD may be surface-treated so that, in case that multiple light emitting elements LD are mixed with a fluidic solution (or solvent) and supplied to each pixel area (e.g., an emission area of each pixel or an emission area of each sub-pixel), the light emitting elements LD may be evenly distributed rather than unevenly aggregating in the solution.

An emission component (or a light emitting device or a light emitting unit) including the light emitting element LD described above may be used not only in a display device but also in various types of electronic devices each of which requires a light source. For instance, in case that multiple light emitting elements LD are disposed (or located) in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires or suitably uses a light source.

Figure 3:
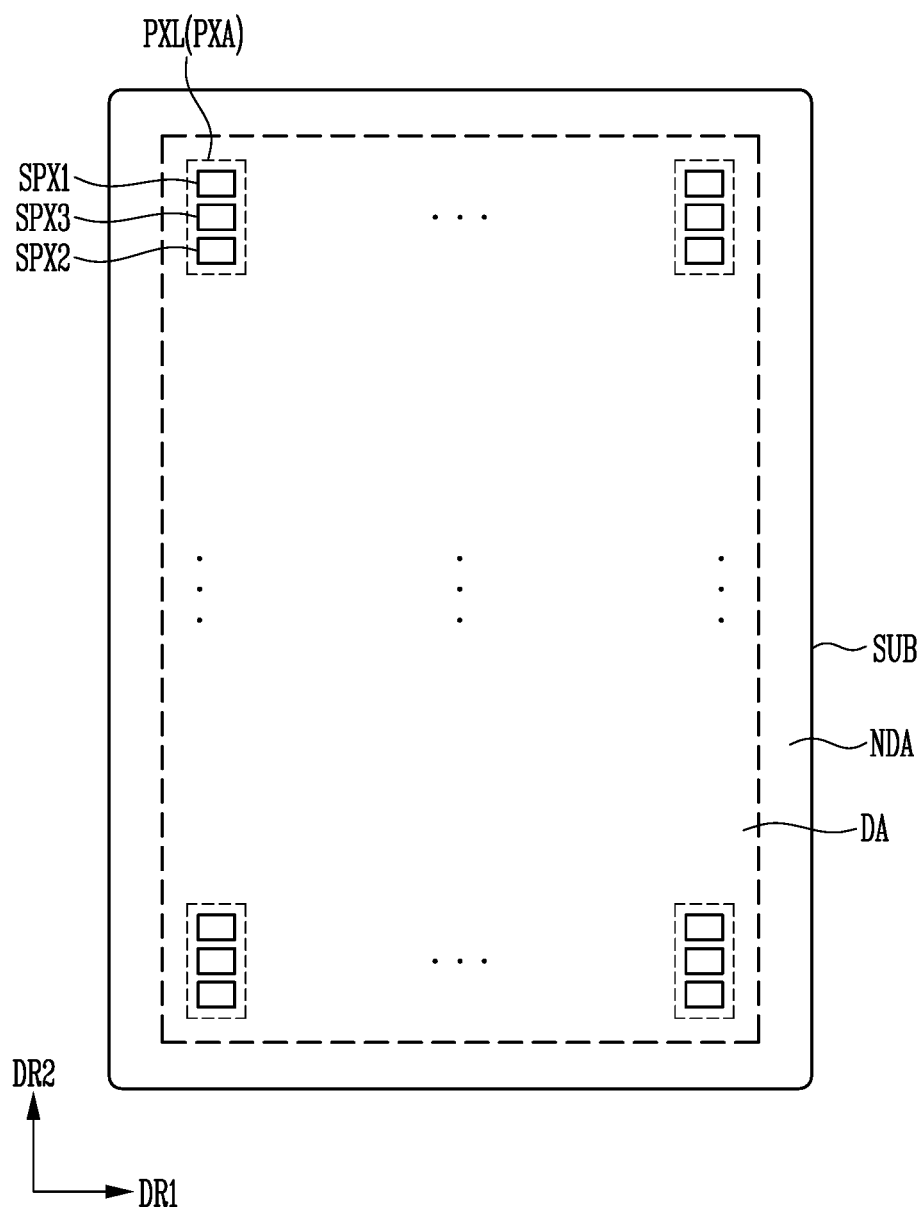
FIG. 3 is a schematic plan view illustrating a display device in accordance with an embodiment.

FIG. 3 is a schematic plan view illustrating a display device in accordance with an embodiment.

For convenience of description, FIG. 3 schematically illustrates the structure of the display device, focused on a display area DA on which an image may be displayed.

If the display device is an electronic device having a display surface on at least one surface thereof, e.g., a smartphone, a television, a tablet personal computer (PCP, a mobile phone, a video phone, an electronic-book reader, a desktop PC, a laptop PC, a netbook computer, a workstation, a server, a personal digital assistant (PDA), a portable multimedia player (PMP), an MP3 player, a medical appliance, a camera, or a wearable device, the disclosure may be applied to the display device.

Referring to FIGS. 1 to 3, the display device may include a substrate SUB, pixels PXL provided (or disposed) on the substrate SUB and each including at least one light emitting element LD, a driver provided (or disposed) on the substrate SUB and configured to drive the pixels PXL, and a line component provided to electrically connect the pixels PXL with the driver.

The display device may be classified as a passive matrix type display device and an active matrix type display device according to a method of driving the light emitting element LD. For example, in case that the display device is implemented as an active matrix type display device, each of the pixels PXL may include a driving transistor configured to control the amount of current to be supplied to the light emitting element LD, and a switching transistor configured to transmit a data signal to the driving transistor.

The display device may be provided in various forms, for example, in the form of a rectangular plate having two pairs of parallel sides, but the disclosure is not limited thereto. In case that the display device is provided in the form of a rectangular plate, one pair of sides of the two pairs of sides may be longer than the other. For convenience of description, there is illustrated the case where the display device has a rectangular shape with a pair of long sides and a pair of short sides. A direction in which the long sides extend is indicated as a second direction DR2, and a direction in which the short sides extend is indicated as a first direction DR1. In the display device provided in a rectangular planar shape, each corner on which one long side and one short side contact (or meet) each other may have a round shape. However, the disclosure is not limited thereto.

The substrate SUB may include a display area DA and a non-display area NDA.

The display area DA may be an area in which the pixels PXL for displaying an image may be provided. The non-display area NDA may be an area in which the driver configured to drive the pixels PXL and a portion of the line component for connecting the pixels PXL to the driver may be provided.

The non-display area NDA may be disposed adjacent to the display area DA. The non-display area NDA may be provided on at least one side of the display area DA. For example, the non-display area NDA may enclose the perimeter (or edges) of the display area DA. The line component connected to the pixels PXL, and the driver connected to the line component and configured to drive the pixels PXL may be provided in the non-display area NDA.

The line component may electrically connect the driver with the pixels PXL. The line component may include a fanout line connected with signal lines, e.g., a scan line, a data line, and an emission control line, which may be connected to each pixel PXL to provide signals to the pixel PXL. Furthermore, in an embodiment, the line component may include a fanout line connected to signal lines, e.g., a control line, and a sensing line, which may be connected to each pixel PXL to compensate in real time for variation in electrical characteristics of the pixel PXL. The line component may include a fanout line connected with power lines which may be configured to provide voltages to the respective pixels PXL and connected to the respective pixels PXL.

The substrate SUB may include transparent insulating material to allow light transmission. The substrate SUB may be a rigid substrate or a flexible substrate.

An area on the substrate SUB may be provided as the display area DA in which the pixels PXL may be disposed, and another area thereof may be provided as the non-display area NDA. For example, the substrate SUB may include a display area DA including pixel areas in which the respective pixels PXL may be disposed, and a non-display area NDA disposed around the perimeter of the display area DA (or adjacent to the display area DA).

The pixels PXL may be provided in the display area DA on the substrate SUB. In an embodiment, the pixels PXL may be arranged in the display area DA in a stripe arrangement manner or the like, but the disclosure is not limited thereto.

A first sub-pixel SPX1, a second sub-pixel SPX2, and a third sub-pixel SPX3 may be provided in each of the pixel areas PXA in which the respective pixels PXL may be provided. In an embodiment, the first sub-pixel SPX1 may be a red pixel (or a red sub-pixel), the second sub-pixel SPX2 may be a green pixel (or a green sub-pixel), and the third sub-pixel SPX3 may be a blue pixel (or a blue sub-pixel). However, the disclosure is not limited thereto. In an embodiment, the second sub-pixel SPX2 may be a red pixel, the first sub-pixel SPX1 may be a green pixel, and the third sub-pixel SPX3 may be a blue pixel. In another embodiment, the third sub-pixel SPX3 may be a red pixel, the first sub-pixel SPX1 may be a green pixel, and the second sub-pixel SPX2 may be a blue pixel.

The first sub-pixel SPX1 may include a first pixel circuit and a first emission component (or a first emission unit). The second sub-pixel SPX2 may include a second pixel circuit and a second emission component (or a second emission unit). The third sub-pixel SPX3 may include a third pixel circuit and a third emission component (or a third emission unit).

The first, second, and third pixel circuits and the first, second, and third emission components may be disposed on difference layers and overlap each other. For example, the first, second, and third pixel circuits may be disposed on a pixel circuit layer (e.g., refer to "PCL" of FIGS. 5 and 6) of a sub-pixel area in which the respective sub-pixels may be disposed. Each of the first, second, and third emission components may be disposed in the display element layer (e.g., refer to "DPL" of FIGS. 7 to 10) that overlaps the pixel circuit layer PCL in the corresponding sub-pixel.

A first alignment electrode (or a first alignment line) and a second alignment electrode (or a second alignment line) which may be spaced apart from each other may be disposed in the first, second, and third emission components. The light emitting element may be disposed between the first alignment electrode and the second alignment electrode. Components disposed in the pixel area PXA will be described below with reference to FIGS. 5 to 15.

Each of the pixels PXL may include one or more light emitting elements LD configured to be driven in response to a corresponding scan signal and a corresponding data signal. The light emitting element LD may have a small size ranging from the nano scale (or the nanometer scale) to the micro scale (the micrometer scale) and be connected in parallel to light emitting elements LD disposed adjacent thereto, but the disclosure is not limited thereto. The light emitting element LD may form a light source of each pixel PXL (or each sub-pixel).

Each pixel PXL (or each sub-pixel) may include at least one light source, e.g., the light emitting element LD illustrated in FIG. 1, which may be driven by a signal (e.g., a scan signal and a data signal) and/or a power supply (e.g., a first driving power supply and a second driving power supply). However, in an embodiment, the type of the light emitting element LD which may be used as a light source of each pixel PXL (or each sub-pixel) is not limited thereto.

The driver may supply a certain signal and a certain power voltage to each pixel PXL (or each sub-pixel) through the line component and thus control the operation of the pixel PXL (or the sub-pixel).

Figure 4:
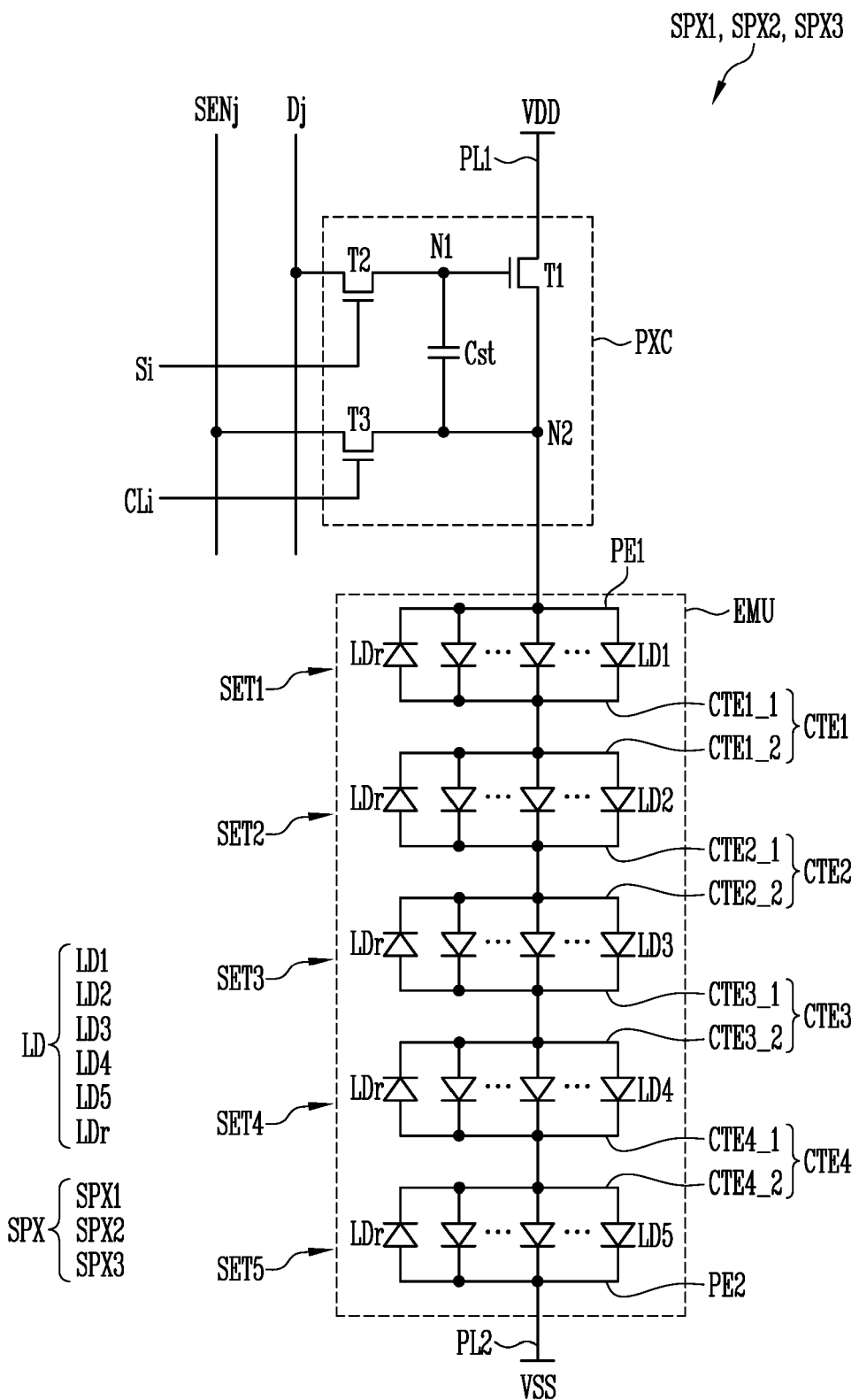
FIG. 4 is a schematic circuit diagram illustrating an electrical connection relationship of components included in each of first to third sub-pixels illustrated in FIG. 3.

FIG. 4 is a schematic circuit diagram illustrating an electrical connection relationship of components included in each of first to third sub-pixels SPX1, SPX2, and SPX3 illustrated in FIG. 3.

For example, FIG. 4 illustrates an electrical connection relationship of components included in each of the first to third sub-pixels SPX1, SPX2, and SPX3 which may be applied to an active matrix type display device in accordance with an embodiment. However, the electrical connection relationship of the first to third sub-pixels SPX1, SPX2, and SPX3 is not limited thereto. In the following embodiment, the term "sub-pixel SPX" or "sub-pixels SPX" will be used to collectively designate the first sub-pixel SPX1, the second sub-pixel SPX2, and/or the third sub-pixel SPX3.

Referring to FIGS. 1 to 4, the sub-pixel SPX may include an emission component EMU (or an emission unit) configured to generate light having a luminance corresponding to a data signal. Furthermore, the sub-pixel SPX may selectively further include a pixel circuit PXC configured to drive the emission component EMU.

In an embodiment, the emission component EMU may include light emitting elements LD electrically connected in parallel between a first power line PL1 which may be electrically connected to a first driving power supply VDD and configured to be supplied with a voltage of the first driving power supply VDD, and a second power line PL2 which may be electrically connected to a second driving power supply VSS and configured to be supplied with a voltage of the second driving power supply VSS. For example, the emission component EMU may include a first electrode PE1 (or a first pixel electrode) electrically connected to the first driving power supply VDD via the pixel circuit PXC and the first power line PL1, a second electrode PE2 (or a second pixel electrode) electrically connected to the second driving power supply VSS through the second power line PL2, and light emitting elements LD electrically connected in parallel to each other in the same direction between the first electrode PE1 and the second pixel electrode PE2. In an embodiment, the first electrode PE1 may be an anode, and the second electrode PE2 may be a cathode.

Each of the light emitting elements LD included in the emission component EMU may include a first end electrically connected to the first driving power supply VDD by the first electrode PE1, and a second end electrically connected to the second driving power supply VSS by the second electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the sub-pixel SPX.

As described above, the light emitting elements LD that may be electrically connected in parallel to each other in the same direction (e.g., in a forward direction) between the first electrode PE1 and the second electrode PE2 to which the voltages of the different power supplies may be supplied may form respective valid light sources.

The light emitting elements LD of the emission component EMU may emit light having a luminance corresponding to driving current supplied thereto through the pixel circuit PXC. For example, during each frame period, driving current that corresponds to a gray scale value of a corresponding frame data of the pixel circuit PXC may be supplied to the light emitting component EMU. The driving current supplied to the emission component EMU may be divided into parts which flow into the respective light emitting elements LD. Hence, each of the light emitting elements LD may emit light having a luminance corresponding to current applied thereto, so that the light emitting component EMU may emit light having a luminance corresponding to the driving current.

Although there has been described the embodiment in which the opposite ends of the light emitting elements LD may be electrically connected in the same direction between the first and second driving power supplies VDD and VSS, the disclosure is not limited thereto. In an embodiment, the emission component EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be electrically connected in parallel to each other between the first and second electrodes PE1 and PE2. Here, the reverse light emitting element LDr may be electrically connected between the first and second electrodes PE1 and PE2 in a direction opposite to that of the light emitting elements LD. Even if a certain driving voltage (e.g., a forward driving voltage) is applied between the first and second electrodes PE1 and PE2, the reverse light emitting element LDr remains disabled. Hence, current substantially does not flow through the reverse light emitting element LDr.

The pixel circuit PXC may be electrically connected to a scan line Si and a data line Dj of the corresponding sub-pixel SPX. The pixel circuit PXC may be electrically connected to a control line CLi and a sensing line SENj of the sub-pixel SPX. For example, in case that the sub-pixel SPX is disposed in an i-th row and a j-th column of the display area DA, the pixel circuit PXC of the sub-pixel SPX may be electrically connected to an i-th scan line Si, a j-th data line Dj, an i-th control line CLi, and a j-th sensing line SENj of the display area DA.

The pixel circuit PXC may include first to third transistors T1 to T3, and a storage capacitor Cst.

The first transistor T1 may be a driving transistor configured to control driving current to be applied to the emission component EMU, and may be electrically connected between the first driving power supply VDD and the emission component EMU. In detail, a first terminal of the first transistor T1 may be electrically connected to the first driving power supply VDD by the first power line PL1. A second terminal of the first transistor T1 may be electrically connected to a second node N2. A gate electrode of the first transistor T1 may be electrically connected to a first node N1. The first transistor T1 may control, in response to a voltage applied to the first node N1, the amount of driving current to be applied from the first driving power supply VDD to the emission component EMU through the second node N2. In an embodiment, the first terminal of the first transistor T1 may be a drain electrode, and the second terminal of the first transistor T1 may be a source electrode, and the disclosure is not limited thereto. In an embodiment, the first terminal may be a source electrode, and the second terminal may be a drain electrode.

The second transistor T2 may be a switching transistor configured to select a sub-pixel SPX in response to a scan signal and activate the sub-pixel SPX, and may be electrically connected between the data line Dj (e.g., the j-th data line) and the first node N1. A first terminal of the second transistor T2 may be electrically connected to the data line Dj. A second terminal of the second transistor T2 may be electrically connected to the first node N1. A gate electrode of the second transistor T2 may be electrically connected to the scan line Si (e.g., the i-th scan line). The first terminal and the second terminal of the second transistor T2 may be different terminals, and, for example, if the first terminal is a drain electrode, the second terminal may be a source electrode.

In case that a scan signal having a gate-on voltage (e.g., a high level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 may be connected to each other. The second transistor T2 may transmit a data signal to the gate electrode of the first transistor T1.

The third transistor T3 may obtain a sensing signal through the sensing line SENj by electrically connecting the first transistor T1 to the sensing line SENj (e.g., the j-th sensing line), and detect, using the sensing signal, characteristics of the sub-pixel SPX such as a threshold voltage of the first transistor T1. Information about the characteristics of each sub-pixel SPX may be used to convert image data such that a deviation in characteristic between sub-pixels SPX may be compensated for. A second terminal of the third transistor T3 may be electrically connected to the second terminal of the first transistor T1. A first terminal of the third transistor T3 may be electrically connected to the sensing line SENj. A gate electrode of the third transistor T3 may be electrically connected to the control line CLi (e.g., the i-th control line). Furthermore, the first terminal of the third transistor T3 may be electrically connected to an initialization power supply. The third transistor T3 may be an initialization transistor configured to initialize the second node N2, and may be turned on in case that a sensing control signal is supplied thereto from the control line CLi, so that the voltage of the initialization power supply may be transmitted to the second node N2. Hence, a second storage electrode of the storage capacitor Cst which may be electrically connected to the second node N2 may be initialized.

The storage capacitor Cst may include a first storage electrode (or a lower electrode) and a second storage electrode (or an upper electrode). The first storage electrode may be electrically connected to the first node N1. The second storage electrode may be electrically connected to the second node N2. The storage capacitor Cst may be charged with a data voltage corresponding to a data signal to be supplied to the first node N1 during a frame period. Hence, the storage capacitor Cst may store a voltage corresponding to a difference between a voltage of the gate electrode of the first transistor T1 and a voltage of the second node N2.

The emission component EMU may include at least one series set including light emitting elements LD which may be electrically connected in parallel to each other. In an embodiment, as illustrated in FIG. 4, the emission component EMU may have a series/parallel combination structure. For example, the emission component EMU may include a first series set SET1, a second series set SET2, a third series set SET3, a fourth series set SET4, and a fifth series set SET5.

The emission component EMU may include the first, second, third, fourth, and fifth series sets SET1, SET2, SET3, SET4, and SET5 which may be successively and electrically connected between the first driving power supply VDD and the second driving power supply VSS. Each of the first second, third, fourth, and fifth series sets SET1, SET2, SET3, SET4, and SET5 may include two electrodes PE1 and CTE1_1, CTE1_2 and CTE2_1, CTE2_2 and CTE3_1, and CTE3_2 and CTE4_1, CTE4_2 and PE2 that form an electrode pair of the corresponding series set, and light emitting elements LD electrically connected in parallel to each other in the same direction between the two electrodes PE1 and CTE1_1, CTE1_2 and CTE2_1, CTE2_2 and CTE3_1, CTE3_2 and CTE4_1, CTE4_2 and PE2.

The first series set SET1 may include a first electrode PE1 (or a first pixel electrode), a 1-1-th intermediate electrode CTE1_1, and at least one first light emitting element LD1 electrically connected between the first electrode PE1 and the 1-1-th intermediate electrode CTE1_1. Furthermore, the first series set SET1 may include a reverse light emitting element LDr electrically connected between the first electrode PE1 and the 1-1-th intermediate electrode CTE1_1 in a direction opposite to that of the first light emitting element LD1.

The second series set SET2 may include a 1-2-th intermediate electrode CTE1_2, a 2-1-th intermediate electrode CTE2_1, and at least one second light emitting element LD2 electrically connected between the 1-2-th intermediate electrode CTE1_2 and the 2-1-th intermediate electrode CTE2_1. Furthermore, the second series set SET2 may include a reverse light emitting element LDr electrically connected between the 1-2-th intermediate electrode CTE1_2 and the 2-1-th intermediate electrode CTE2_1 in a direction opposite to that of the second light emitting element LD2.

The 1-1-th intermediate electrode CTE1_1 and the 1-2-th intermediate electrode CTE1_2 may form a first intermediate electrode CTE1 that electrically connect the first series set SET1 and the second series set SET2 that may be successively provided. In case that the 1-1-th intermediate electrode CTE1_1 and the 1-2-th intermediate electrode CTE1_2 may be integrally provided, the 1-1-th intermediate electrode CTE1_1 and the 1-2-th intermediate electrode CTE1_2 may be respectively different areas of the first intermediate electrode CTE1.

The third series set SET3 may include a 2-2-th intermediate electrode CTE2_2, a 3-1-th intermediate electrode CTE3_1, and at least one third light emitting element LD3 which may be electrically connected between the 2-2-th intermediate electrode CTE2_2 and the 3-1-th intermediate electrode CTE3_1. Furthermore, the third series set SET3 may include a reverse light emitting element LDr electrically connected between the 2-2-th intermediate electrode CTE2_2 and the 3-1-th intermediate electrode CTE3_1 in a direction opposite to that of the third light emitting element LD3.

The 2-1-th intermediate electrode CTE2_1 and the 2-2-th intermediate electrode CTE2_2 may form a second intermediate electrode CTE2 that electrically connect the second series set SET2 and the third series set SET3 that may be successively provided. In case that the 2-1-th intermediate electrode CTE2_1 and the 2-2-th intermediate electrode CTE2_2 may be integrally provided, the 2-1-th intermediate electrode CTE2_1 and the 2-2-th intermediate electrode CTE2_2 may be respectively different areas of the second intermediate electrode CTE2.

The fourth series set SET4 may include a 3-2-th intermediate electrode CTE3_2, a 4-1-th intermediate electrode CTE4_1, and at least one fourth light emitting element LD4 which may be electrically connected between the 3-2-th intermediate electrode CTE3_2 and the 4-1-th intermediate electrode CTE4_1. Furthermore, the fourth series set SET4 may include a reverse light emitting element LDr electrically connected between the 3-2-th intermediate electrode CTE3_2 and the 4-1-th intermediate electrode CTE4_1 in a direction opposite to that of the fourth light emitting element LD4.

The 3-1-th intermediate electrode CTE3_1 and the 3-2-th intermediate electrode CTE3_2 may form a third intermediate electrode CTE3 which electrically connect the third series set SET3 and the fourth series set SET4 which may be successively provided. In case that the 3-1-th intermediate electrode CTE3_1 and the 3-2-th intermediate electrode CTE3_2 may be integrally provided, the 3-1-th intermediate electrode CTE3_1 and the 3-2-th intermediate electrode CTE3_2 may be respectively different areas of the third intermediate electrode CTE3.

The fifth series set SET5 may include a 4-2-th intermediate electrode CTE4_2, a second electrode PE2, and at least one third light emitting element LD5 which may be electrically connected between the 4-2-th intermediate electrode CTE4_2 and the second electrode PE2. Furthermore, the fifth series set SET5 may include a reverse light emitting element LDr electrically connected between the 4-2-th intermediate electrode CTE4_2 and the second electrode PE2 in a direction opposite to that of the fifth light emitting element LD5.

The 4-1-th intermediate electrode CTE4_1 and the 4-2-th intermediate electrode CTE4_2 may form a fourth intermediate electrode CTE4 which electrically connects the fourth series set SET4 and the fifth series set SET5 which may be successively provided. In case that the 4-1-th intermediate electrode CTE4_1 and the 4-2-th intermediate electrode CTE4_2 may be integrally provided, the 4-1-th intermediate electrode CTE4_1 and the 4-2-th intermediate electrode CTE4_2 may be respectively different areas of the fourth intermediate electrode CTE4.

In the foregoing embodiment, the first electrode PE1 of the first series set SET1 may be an anode of the emission component EMU of each sub-pixel SPX, and the second electrode PE2 of the fifth series set SET5 may be a cathode of the emission component EMU.

As described above, the emission component EMU of the sub-pixel SPX including the series sets SET1, SET2, SET3, SET4, and SET5 (or the light emitting elements LD) electrically connected to each other in a series/parallel combination structure may readily adjust driving current/voltage conditions in response to specifications of a product to which the emission component EMU may be applied.

Particularly, the emission component EMU of the sub-pixel SPX including the series sets SET1, SET2, SET3, SET4, and SET5 (or the light emitting elements LD) electrically connected to each other in a series/parallel combination structure may reduce driving current, compared to that of a emission component having a structure such that the light emitting elements LD may be electrically connected only in parallel to each other. Furthermore, the emission component EMU of the sub-pixel SPX including the series sets SET1, SET2, SET3, SET4, and SET5 connected to each other in a series/parallel combination structure may reduce driving current to be applied to the opposite ends of the emission component EMU, compared to that of an emission component having a structure such that all of the light emitting elements LD, the number of which may be the same as that of the emission component EMU, may be electrically connected in series to each other. Compared to the emission component having a structure such that all of the series sets may be electrically connected in series to each other, the emission component EMU of the sub-pixel SPX including the series sets SET1, SET2, SET3, SET4, and SET5 (or the light emitting elements LD) electrically connected to each other in a series/parallel combination structure may increase the number of light emitting elements LD included between the electrodes PE1, CTE1_1, CTE1_2, CTE2_1, CTE2_2, CTE3_1, CTE3_2, CTE4_1, CTE4_2, and PE2, under the same number of electrodes. The light output efficiency of the light emitting elements LD may be enhanced. Even if a defect is caused in a specific series set, the ratio of light emitting elements LD that cannot emit light due to the defect may be reduced, so that a reduction in the light output efficiency of the light emitting elements LD may be mitigated.

In the following embodiment, for the convenience of description, a horizontal direction in a plan view will be represented as a first direction DR1, a vertical direction in a vertical direction in a plan view will be represented as a second direction DR2, and a vertical direction in a sectional view will be represented as a third direction DR3.

Figure 5:
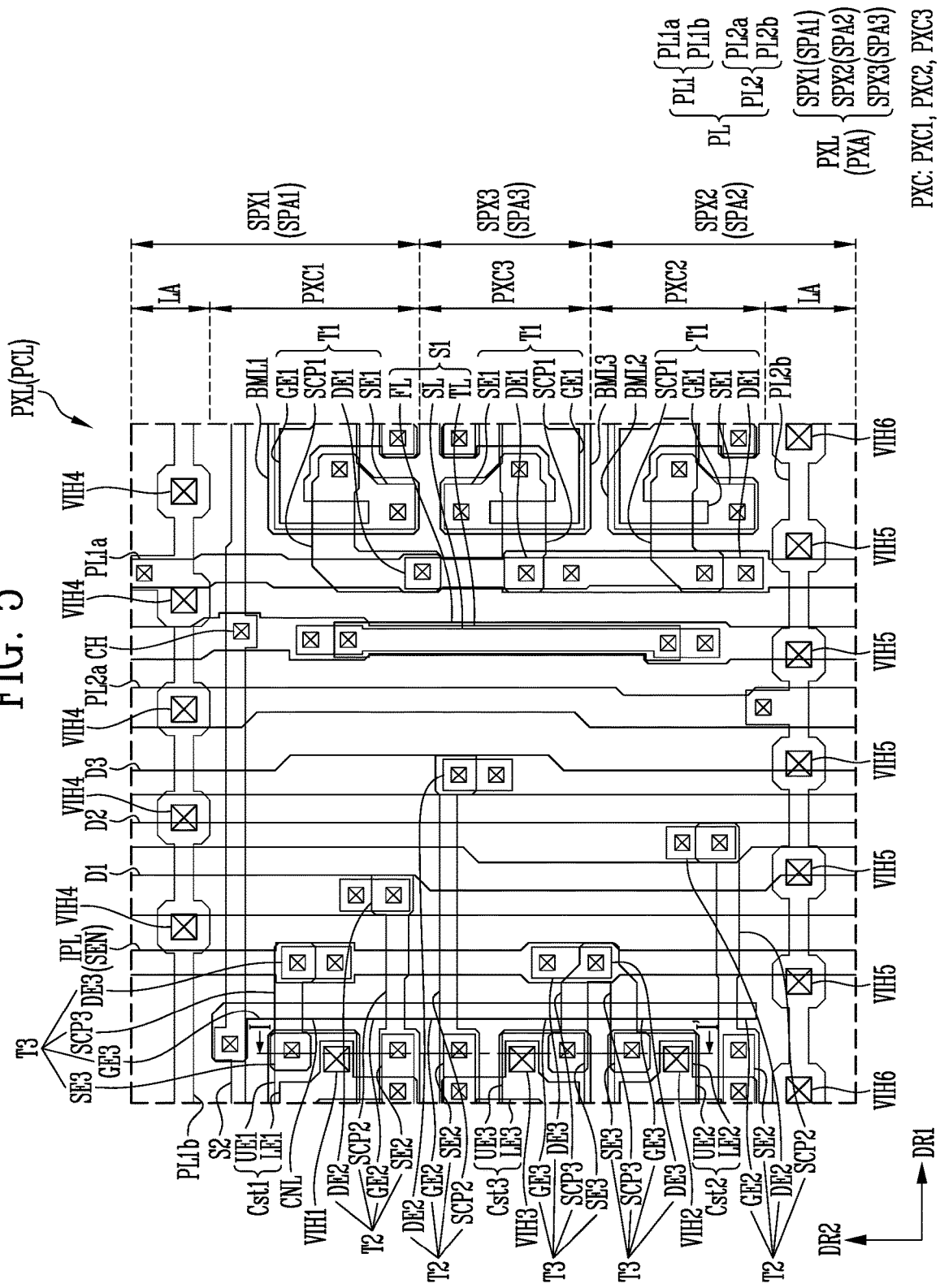
FIG. 5 is a schematic plan view illustrating a pixel circuit layer of a pixel in accordance with an embodiment.
Figure 6:
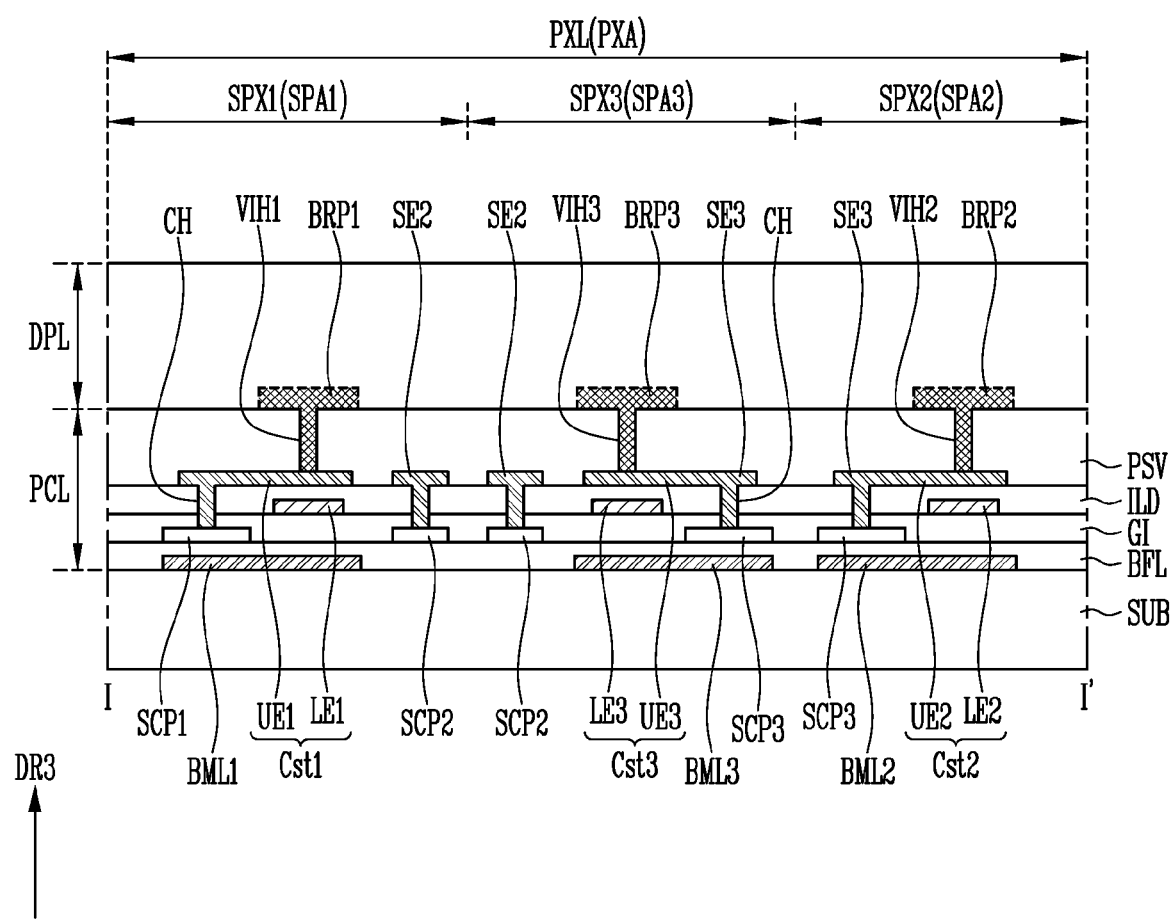
FIG. 6 is a schematic cross-sectional view taken along line I-I' of FIG. 5.

FIG. 5 is a schematic plan view illustrating the pixel circuit layer PCL of the pixel PXL in accordance with an embodiment. FIG. 6 is a schematic cross-sectional view taken along line I-I' of FIG. 5.

For example, FIG. 5 schematically illustrates an embodiment of the structure of the pixel circuit layer PCL, based on the pixel area PXA in which the pixel PXL may be disposed.

Although FIG. 6 simply illustrates the pixel circuit layer PCL of the pixel PXL, e.g., illustrating that each electrode is formed of a single electrode and each insulating layer is formed of a single insulating layer, the disclosure is not limited thereto.

In FIGS. 5 and 6, not only the components included in the pixel PXL but also an area in which the components may be provided (or located) may be embraced in the definition of the term "pixel PXL".

Referring to FIGS. 1 to 6, the pixel circuit layer PCL of the pixel PXL may include multiple pixel circuits PXC disposed in the pixel area PXA. For example, the pixel circuit layer PCL may include a first pixel circuit PXC1 disposed in the first sub-pixel area SPA1, a second pixel circuit PXC2 disposed in the second sub-pixel area SPA2, and a third pixel circuit PXC3 disposed in the third sub-pixel area SPA3. The first sub-pixel area SPA1 may be an area of the pixel area PXA in which the first sub-pixel SPX1 may be disposed. The second sub-pixel area SPA2 may be an area of the pixel area PXA in which the second sub-pixel SPX2 may be disposed. The third sub-pixel area SPA3 may be an area of the pixel area PXA in which the third sub-pixel SPX3 may be disposed.

The pixel area PXA may include a line area LA which may be provided around each of the first and second sub-pixel areas SPA1 and SPA2 and/or in a portion thereof. For example, the light area LA may be provided at an upper side of the first sub-pixel area SPA1 and a lower side of the second sub-pixel area SPA2. The line area LA may be an area in which lines extending in the first direction DR1 may be disposed. For example, a first horizontal power line PL1b and a second horizontal power line PL2b which extend in the first direction DR1 may be disposed in the line area LA.

The pixel circuit layer PCL may include one or more insulating layers disposed on the substrate SUB. For example, the pixel circuit layer PCL may include a buffer layer BFL, a gate insulating layer GI, an interlayer insulating layer ILD, and a passivation layer PSV which may be successively stacked on the substrate SUB in the third direction DR3.

The buffer layer BFL may be disposed on the overall surface of the substrate SUB. The buffer layer BFL may prevent impurities from diffusing into the transistors T1, T2, and T3 included in the first to third pixel circuits PXC1, PXC2, and PXC3. The buffer layer BFL may be an inorganic insulating layer including inorganic material. The buffer layer BFL may include at least one of silicon nitride ($SiN_x$), silicon oxide ($SiO_x$), silicon oxynitride ($SiO_xN_y$), and aluminum oxide ($AlO_x$). The buffer layer BFL may be provided in the form of a single layer structure, or provided in the form of a multilayer structure having two or more layers. In case that the buffer layer BFL is provided in the form of a multilayer structure, the respective layers may be formed of the same material or different materials. The buffer layer BFL may be omitted depending on the material of the substrate SUB or processing conditions.

The gate insulating layer GI may be disposed on the overall surface of the buffer layer BFL. The gate insulating layer GI may include the same material as that of the buffer layer BFL, or include suitable (or selected) material among the materials listed as examples as the constituent materials of the buffer layer BFL. The gate insulating layer GI may be an inorganic insulating layer including inorganic material.

The interlayer insulating layer ILD may be provided and/or formed on the overall surface of the gate insulating layer GI. The interlayer insulating layer ILD may include the same material as that of the buffer layer BFL, or may include one or more suitable (or selected) materials among materials listed as examples as the constituent material of the buffer layer BFL.

The passivation layer PSV may be provided and/or formed on the overall surface of the interlayer insulating layer ILD. The passivation layer PSV may be an inorganic insulating layer including inorganic material or an organic insulating layer including organic material. The inorganic insulating layer may include, for example, at least one of silicon oxide ($SiO_x$), silicon nitride ($SiN_x$), silicon oxynitride ($SiO_xN_y$), and aluminum oxide ($AlO_x$). The organic insulating layer may include, for example, at least one of polyacrylate resins, epoxy resins, phenolic resins, polyamide resins, polyimide resins, unsaturated polyester resins, polyphenylene ether resins, poly-phenylene sulfide resins, and benzocyclobutene resin.

The passivation layer PSV may be partially open to allow some components of each of the first, second, and third pixel circuits PXC1, PXC2, and PXC3 to be exposed. For example, the passivation layer PSV may be partially open to include a fourth via hole VIH4 through which an area of the first horizontal power line PL1b of the pixel circuit layer PCL may be exposed. The passivation layer PSV may be partially open to include a fifth via hole VIH5 through which an area of the second horizontal power line PL2b of the pixel circuit layer PCL may be exposed. The passivation layer PSV may be partially open to include a sixth via hole VIH6 through which another area of the second horizontal power line PL2b of the pixel circuit layer PCL may be exposed.

The passivation layer PSV may be partially open to include a first via hole VIH1 through which a first upper electrode UE1 of the first pixel circuit PXC1 may be exposed, a second via hole VIH2 through which a second upper electrode UE2 of the second pixel circuit PXC2 may be exposed, and a third via hole VIH3 through which a third upper electrode UE3 of the third pixel circuit PXC3 may be exposed.

The pixel circuit layer PCL may include one or more conductive layers disposed between the above-mentioned insulating layers. For example, the pixel circuit layer PCL may include a first conductive layer disposed between the substrate SUB and the buffer layer BFL, a second conductive layer disposed on the gate insulating layer GI, and a third conductive layer disposed on the interlayer insulating layer ILD.

The first conductive layer may have a single-layer structure formed of one of or a combination selected from the group of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag), or a combination thereof, which may be low resistance material, to reduce line resistance. Each of the second and third conductive layers may include the same material as that of the first conductive layer, or include one or more suitable materials among the materials listed as examples as the constituent material of the first conductive layer, but the disclosure is not limited thereto.

In an embodiment, the substrate SUB may include transparent insulating material to allow light transmission. The substrate SUB may be a rigid substrate or a flexible substrate.

For example, the rigid substrate may be one or more of a glass substrate, a quartz substrate, a glass ceramic substrate, and a crystalline glass substrate.

The flexible substrate may be either a film substrate or a plastic substrate which includes polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may further include contact holes CH formed to electrically connect circuit elements, electrodes, and/or lines which may be disposed in the pixel circuit layer PCL on the substrate SUB. For convenience sake, in FIG. 5, only one contact hole is indicated by reference character CH, as a representative example of contact holes CH for connecting specific components in the pixel circuit layer PCL.

The pixel circuit layer PCL may further include lines which may be disposed on the substrate SUB and electrically connected to the pixels PXL. For example, the pixel circuit layer PCL may include scan lines S1 and S2, data lines D1, D2, and D3, a power line PL, and an initialization power line IPL.

The scan lines S1 and S2 may include a first scan line S1 and a second scan line S2 which may be spaced apart from each other.

The first scan line S1 may extend in the second direction DR2. A signal (e.g., a scan signal or a control signal) may be applied to the first scan line S1. In an embodiment, the first scan line S1 may have a multilayer structure formed by successively stacking a first layer FL, a second layer SL, and a third layer TL. The first layer FL may correspond to the first conductive layer, the second layer SL may correspond to the second conductive layer, and the third layer TL may correspond to the third conductive layer. The first layer FL, the second layer SL, and the third layer TL may be electrically connected to each other through a corresponding contact hole CH. In an embodiment, the first scan line S1 may have a single layer structure including only the first layer FL formed of the first conductive layer. A scan signal and/or a control signal may be supplied to the first scan line S1.

The second scan line S2 may extend in the first direction DR1 intersecting the direction in which the first scan line S1 extends. The second scan line S2 may be formed of a single layer including the third conductive layer. The second scan line S2 may be electrically connected with the first scan line S1 through the corresponding contact hole CH. The second scan line S2 may be electrically connected with a connection line CNL through the corresponding contact hole CH.

The connection line CNL may be formed of the second conductive layer, and be electrically connected with the second scan line S2 through the corresponding contact hole CH. Therefore, a certain signal applied to the second scan line S2 may be transmitted to the connection line CNL. The connection line CNL may be electrically and/or physically connected to some components of each of the first, second, and third pixel circuits PXC1, PXC2, and PXC3 through the corresponding contact hole CH. For example, the connection line CNL may be electrically and/or physically connected to the second gate electrode GE2 of the second transistor T2 and the third gate electrode GE3 of the third transistor T3 of the corresponding pixel circuit PXC.

The data lines D1, D2, and D3 may include a first data line D1, a second data line D2, and a third data line D3 which may be spaced apart from each other in the first direction DR1, and extend in the second direction DR2. Each of the first, second, and third data lines D1, D2, and D3 may be supplied with a corresponding data signal. In an embodiment, each of the first, second, and third data lines D1, D2, and D3 may be formed of a single layer including the first conductive layer. In an embodiment, each of the first, second, and third data lines D1, D2, and D3 may have a multilayer structure formed by stacking at least two or more conductive layers among the first, second, and third conductive layers.

The first, second, and third data lines D1, D2, and D3 may be respectively connected to the first, second, and third pixel circuits PXC1, PXC2, and PXC3 through the corresponding contact holes CH. For example, the first data line D1 may be electrically connected to the second transistor T2 of the first pixel circuit PXC1 through the corresponding contact hole CH. The second data line D2 may be electrically connected to the second transistor T2 of the second pixel circuit PXC2 through the corresponding contact hole CH. The third data line D3 may be electrically connected to the second transistor T2 of the third pixel circuit PXC3 through the corresponding contact hole CH.

The power line PL may include a first power line PL1 and a second power line PL2 which may be spaced apart from each other.

The first power line PL1 may include a first vertical power line PL1$a$ extending in the second direction DR2, and a first horizontal power line PL1$b$ extending in the first direction DR1. A voltage of the first driving power supply VDD may be applied to the first power line PL1.

The first vertical power line PL1$a$ and the first horizontal power line PL1$b$ may be disposed on different layers and be electrically connected to each other through the corresponding contact hole CH. For example, the first vertical power line PL1$a$ may correspond to the first conductive layer. The first horizontal power line PL1$b$ may correspond to the third conductive layer. The first vertical power line PL1$a$ and the first horizontal power line PL1$b$ may be electrically connected to each other through the corresponding contact hole CH. The first power line PL1 may have a mesh structure because the first vertical power line PL1$a$ and the first horizontal power line PL1$b$ may be electrically connected to each other.

In an embodiment, the first horizontal power line PL1$b$ may be electrically connected to some components of the display element layer DPL through the fourth via hole VIH4 passing through the passivation layer PSV. For example, the first horizontal power line PL1$b$ may be electrically connected to the first alignment electrode (refer to "ALE1" of FIG. 7) of the display element layer DPL through the fourth via hole VIH4 passing through the passivation layer PSV.

The second power line PL2 may include a second vertical power line PL2$a$ extending in the second direction DR2, and a second horizontal power line PL2b extending in the first direction DR1. A voltage of the second driving power supply VSS may be applied to the second power line PL2.

The second vertical power line PL2a and the second horizontal power line PL2b may be disposed on different layers and be electrically connected to each other through a corresponding contact hole CH. For example, the second vertical power line PL2a may correspond to the first conductive layer. The second horizontal power line PL2b may correspond to the third conductive layer. The second vertical power line PL2a and the second horizontal power line PL2b may be electrically connected to each other through the corresponding contact hole CH. The second power line PL2 may have a mesh structure because the second vertical power line PL2a and the second horizontal power line PL2b may be electrically connected to each other.

In an embodiment, the second horizontal power line PL2b may be electrically connected to some components of the display element layer DPL through the fifth via hole VIH5 passing through the passivation layer PSV. For example, the second horizontal power line PL2b may be electrically connected to the second alignment electrode (refer to "ALE2" of FIG. 7) of the display element layer DPL through the fifth via hole VIH5 passing through the passivation layer PSV. Furthermore, the second horizontal power line PL2b may be electrically connected to some components of the display element layer DPL through the sixth via hole VIH6 passing through the passivation layer PSV. For example, the second horizontal power line PL2b may be electrically connected to an auxiliary line (refer to "SUL" of FIG. 7) of the display element layer DPL through the sixth via hole VIH6 passing through the passivation layer PSV.

The initialization power line IPL may extend in the second direction DR2, and be formed of the first conductive layer. A voltage of the initialization power supply may be applied to the initialization power line IPL during a certain period. Hence, the voltage of the initialization power supply may be applied to each of the first, second, and third sub-pixels SPX1, SPX2, and SPX3. In an embodiment, the initialization power line IPL may be used as a sensing line SEN for detecting characteristics of each of the first, second, and third sub-pixels SPX1, SPX2, and SPX3 from the third transistor T3 of the corresponding sub-pixel during a certain period.

The first pixel circuit PXC1, the second pixel circuit PXC2, and the third pixel circuit PXC3 may have a substantially similar or same structure. Hereinafter, the first pixel circuit PXC1 among the first to third pixel circuits PXC1, PXC2, and PXC3 will be described as a representative example, and descriptions of the second and third pixel circuits PXC2 and PXC3 will be simplified.

The first pixel circuit PXC1 may include a first transistor T1, a second transistor T2, a third transistor T3, and a first storage capacitor Cst1.

The first transistor T1 may include a first gate electrode GE1, a first semiconductor pattern SCP1, a first source electrode SE1, and a first drain electrode DE1.

The first gate electrode GE1 may be formed of the second conductive layer, and electrically connected to a second source electrode SE2 of the second transistor T2 through the corresponding contact hole CH.

The first semiconductor pattern SCP1 may include a channel area which overlaps the first gate electrode GE1. Furthermore, the first semiconductor pattern SCP1 may include a first contact area (or a source area) and a second contact area (or a drain area) which may be respectively disposed on opposite sides of the channel area. The first semiconductor pattern SCP1 may be a semiconductor layer formed of poly silicon, amorphous silicon, an oxide semiconductor, or the like, or a combination thereof. The channel area may be an undoped semiconductor layer. Each of the first and second contact areas may be a semiconductor layer doped with an impurity.

The first semiconductor pattern SCP1 may be disposed between the buffer layer BFL and the gate insulating layer GI. For example, the first semiconductor pattern SCP1 may be disposed on the buffer layer BFL and enclosed by the gate insulating layer GI.

The first source electrode SE1 may be formed of the third conductive layer and overlap the first gate electrode GE1 in the first sub-pixel area SPA1. The first source electrode SE1 may be electrically connected to the first contact area of the first semiconductor pattern SCP1 through the corresponding contact hole CH. Furthermore, the first source electrode SE1 may be electrically connected to a first bottom metal pattern BML1 through the corresponding contact hole CH.

The first bottom metal pattern BML1 may be formed of the first conductive layer and overlap the first gate electrode GE1 and the first source electrode SE1 in the first sub-pixel area SPA1. If the first bottom metal pattern BML1 is electrically connected to the first source electrode SE1 through the corresponding contact hole CH, a driving range of a voltage to be supplied to the first gate electrode GE1 may be increased. Furthermore, because the first bottom metal pattern BML1 may be electrically connected to the first transistor T1, the first bottom metal pattern BML1 may be prevented from floating.

The first drain electrode DE1 may be formed of the third conductive layer, extend in the second direction DR2, and overlap the first vertical power line PL1a. The first drain electrode DE1 may be electrically connected to the second contact area of the first semiconductor pattern SCP1 through the corresponding contact hole CH. Furthermore, the first drain electrode DE1 may be electrically connected to the first vertical power line PL1a through the corresponding contact hole CH.

The second transistor T2 may include a second gate electrode GE2, a second semiconductor pattern SCP2, a second source electrode SE2, and a second drain electrode DE2.

The second gate electrode GE2 may be formed of the second conductive layer, and may be integrally provided with the connection line CNL. The second gate electrode GE2 may be supplied with a signal, e.g., a scan signal, applied to the second scan line S2.

The second semiconductor pattern SCP2 may include a channel area which overlaps the second gate electrode GE2. Furthermore, the second semiconductor pattern SCP2 may include a first contact area (or a source area) and a second contact area (or a drain area) which may be respectively disposed on opposite sides of the channel area. The second semiconductor pattern SCP2 may be a semiconductor layer formed of poly silicon, amorphous silicon, an oxide semiconductor, or the like, or a combination thereof. The channel area may be an undoped semiconductor layer. Each of the first and second contact areas may be a semiconductor layer doped with an impurity.

The second semiconductor pattern SCP2 may be disposed on the same layer as the first semiconductor pattern SCP1. For example, the second semiconductor pattern SCP2 may be disposed between the buffer layer BFL and the gate insulating layer GI.

The second source electrode SE2 may be formed of the third conductive layer, and overlap the first gate electrode GE1 of the first transistor T1. The second source electrode SE2 may be electrically connected to the first contact area of the second semiconductor pattern SCP2 through the corresponding contact hole CH. Furthermore, the second source electrode SE2 may be electrically connected to the first gate electrode GE1 through the corresponding contact hole CH.

The second drain electrode DE2 may be formed of the third conductive layer, and overlap the first data line D1. The second drain electrode DE2 may be electrically connected to the second contact area of the second semiconductor pattern SCP2 through the corresponding contact hole CH. Furthermore, the second drain electrode DE2 may be electrically connected to the first data line D1 through the corresponding contact hole CH.

The third transistor T3 may include a third gate electrode GE3, a third semiconductor pattern SCP3, a third source electrode SE3, and a third drain electrode DE3.

The third gate electrode GE3 may be formed of the second conductive layer, and may be integrally provided with the connection line CNL. The third gate electrode GE3 may be supplied with a signal, e.g., a control signal, applied to the second scan line S2.

The third semiconductor pattern SCP3 may include a channel area which overlaps the third gate electrode GE3. Furthermore, the third semiconductor pattern SCP3 may include a first contact area (or a source area) and a second contact area (or a drain area) which may be respectively disposed on opposite sides of the channel area. The third semiconductor pattern SCP3 may be a semiconductor layer formed of poly silicon, amorphous silicon, an oxide semiconductor, or the like, or a combination thereof. The channel area may be an undoped semiconductor layer. Each of the first and second contact areas may be a semiconductor layer doped with an impurity.

The third semiconductor pattern SCP3 may be disposed on the same layer as the first and second semiconductor patterns SCP1 and SCP2. For example, the third semiconductor pattern SCP3 may be disposed between the buffer layer BFL and the gate insulating layer GI.

The third source electrode SE3 may be formed of the third conductive layer, and may be integrally provided with the first source electrode SE1. The third source electrode SE3 may be electrically connected to the first contact area of the third semiconductor pattern SCP3 through the corresponding contact hole CH. Furthermore, the third source electrode SE3 may be electrically connected to the first bottom metal pattern BML1 through the corresponding contact hole CH.

The third drain electrode DE3 may be formed of the third conductive layer, and may be electrically connected to the second contact area of the third semiconductor pattern SCP3 through the corresponding contact hole CH. Furthermore, the third drain electrode DE3 may be electrically connected to the initialization power line IPL through the corresponding contact hole CH.

The first storage capacitor Cst1 may include a first lower electrode LE1 (or a first storage electrode) and a first upper electrode UE1 (or a second storage electrode). The first lower electrode LE1 may be integrally formed with the first gate electrode GE1. The first upper electrode UE1 may overlap the first lower electrode LE1. The first upper electrode UE1 may be formed of the third conductive layer, and may be integrally provided with the first and third source electrodes SE1 and SE3.

The first upper electrode UE1, the first source electrode SE1, and the third source electrode SE3 may be electrically connected to the first bottom metal pattern BML1 through the corresponding contact hole CH. In an embodiment, the first upper electrode UE1 may be electrically connected to some components of the display element layer DPL through the first via hole VIH1 passing through the passivation layer PSV. For example, the first upper electrode UE1 may be electrically connected to a first bridge pattern BRP1 of the display element layer DPL through the first via hole VIH1 passing through the passivation layer PSV.

The second pixel circuit PXC2 may include a first transistor T1, a second transistor T2, a third transistor T3, and a second storage capacitor Cst2.

The first transistor T1 may include a first gate electrode GE1, a first semiconductor pattern SCP1, a first source electrode SE1, and a first drain electrode DE1. The first transistor T1 may further include a second bottom metal pattern BML2 which may be electrically connected to the first source electrode SE1 through the corresponding contact hole CH.

The second bottom metal pattern BML2 may be formed of the first conductive layer, and may overlap the first transistor T1. The second bottom metal pattern BML2 may be electrically connected to the first source electrode SE1 through the corresponding contact hole CH.

The second transistor T2 may include a second gate electrode GE2, a second semiconductor pattern SCP2, a second source electrode SE2, and a second drain electrode DE2.

The second drain electrode DE2 may be formed of the third conductive layer, and may overlap the second data line D2. The second drain electrode DE2 may be electrically connected to the second contact area of the second semiconductor pattern SCP2 through the corresponding contact hole CH. Furthermore, the second drain electrode DE2 may be electrically connected to the second data line D2 through the corresponding contact hole CH.

The third transistor T3 may include a third gate electrode GE3, a third semiconductor pattern SCP3, a third source electrode SE3, and a third drain electrode DE3.

The second storage capacitor Cst2 may include a second lower electrode LE2 (or a first storage electrode) and a second upper electrode UE2 (or a second storage electrode). The second lower electrode LE2 may be integrally formed with the first gate electrode GE1. The second upper electrode UE2 may overlap the second lower electrode LE2. The second upper electrode UE2 may be formed of the third conductive layer, and may be integrally provided with the first and third source electrodes SE1 and SE3.

The second upper electrode UE2, the first source electrode SE1, and the third source electrode SE3 may be electrically connected to the second bottom metal pattern BML2 through the corresponding contact hole CH. In an embodiment, the second upper electrode UE2 may be electrically connected to some components of the display element layer DPL through the second via hole VIH2 passing through the passivation layer PSV. For example, the second upper electrode UE2 may be electrically connected to a second bridge pattern BRP2 of the display element layer DPL through the second via hole VIH2 passing through the passivation layer PSV.

The third pixel circuit PXC3 may include a first transistor T1, a second transistor T2, a third transistor T3, and a third storage capacitor Cst3.

The first transistor T1 may include a first gate electrode GE1, a first semiconductor pattern SCP1, a first source electrode SE1, and a first drain electrode DE1. The first transistor T1 may further include a third bottom metal pattern BML3 which may be electrically connected to the first source electrode SE1 through the corresponding contact hole CH.

The third bottom metal pattern BML3 may be formed of the first conductive layer, and may overlap the first transistor T1. The third bottom metal pattern BML3 may be electrically connected to the first source electrode SE1 through the corresponding contact hole CH.

The second transistor T2 may include a second gate electrode GE2, a second semiconductor pattern SCP2, a second source electrode SE2, and a second drain electrode DE2.

The second drain electrode DE2 may be formed of the third conductive layer, and may overlap the third data line D3. The second drain electrode DE2 may be electrically connected to the second contact area of the second semiconductor pattern SCP2 through the corresponding contact hole CH. Furthermore, the second drain electrode DE2 may be electrically connected to the third data line D3 through the corresponding contact hole CH.

The third transistor T3 may include a third gate electrode GE3, a third semiconductor pattern SCP3, a third source electrode SE3, and a third drain electrode DE3.

The third storage capacitor Cst3 may include a third lower electrode LE3 (or a first storage electrode) and a third upper electrode UE3 (or a second storage electrode).

The third lower electrode LE3 may be integrally formed with the first gate electrode GE1.

The third upper electrode UE3 may overlap the third lower electrode LE3. The third upper electrode UE3 may be formed of the third conductive layer, and may be integrally provided with the first and third source electrodes SE1 and SE3. In an embodiment, the third upper electrode UE3 may be electrically connected to some components of the display element layer DPL through the third via hole VIH3 passing through the passivation layer PSV. For example, the third upper electrode UE3 may be electrically connected to a third bridge pattern BRP3 of the display element layer DPL through the third via hole VIH3 passing through the passivation layer PSV.

The first upper electrode UE1, the third upper electrode UE3, and the second upper electrode UE2 may be arranged in the second direction DR2 in the order listed. The first upper electrode UE1, the third upper electrode UE3, and the second upper electrode UE2 may be located at the same column.

In an embodiment, the first upper electrode UE1 of the first storage capacitor Cst1, the second upper electrode UE2 of the second storage capacitor Cst2, and the third upper electrode UE3 of the third storage capacitor Cst3 may be disposed at positions spaced apart from the connection line CNL to which a signal (e.g., a scan signal and/or a control signal) may be applied. In other words, the first upper electrode UE1, the second upper electrode UE2, and the third upper electrode UE3 may not overlap the connection line CNL. Because each of the first, second, and third upper electrodes UE1, UE2, and UE3 does not overlap the connection line CNL, parasitic capacitance may not be formed between each of the first, second, and third upper electrodes UE1, UE2, and UE3 and the connection line CNL.

Each of the first, second, and third pixel circuits PXC1, PXC2, and PXC3 may be covered with the passivation layer PSV.

The passivation layer PSV may include via holes located in the pixel area PXA in which each pixel PXL may be disposed. For example, the passivation layer PSV may include a first via hole VIH1, a second via hole VIH2, a third via hole VIH3, a fourth via hole VIH4, a fifth via hole VIH5, and a sixth via hole VIH6.

The first via hole VIH1 may expose an area of the first upper electrode UE1. The second via hole VIH2 may expose an area of the second upper electrode UE2. The third via hole VIH3 may expose an area of the third upper electrode UE3. The fourth via hole VIH4 may expose an area of the first horizontal power line PL1$b$. The fifth via hole VIH5 may expose an area of the second horizontal power line PL2$b$. The sixth via hole VIH6 may expose another area of the second horizontal power line PL2$b$.

The display element layer DPL including the light emitting element LD described with reference to FIGS. 1 and 2 may be disposed on the pixel circuit layer PCL. Some components of the display element layer DPL may be electrically connected to some components of the pixel circuit layer PCL through the corresponding via holes. For example, the first alignment electrode ALE1 of the display element layer DPL may be electrically connected to the first horizontal power line PL1$b$ through the fourth via hole VIH4. The second alignment electrode ALE2 of the display element layer DPL may be electrically connected to the second horizontal power line PL2$b$ through the fifth via hole VIH5. The auxiliary line SUL of the display element layer DPL may be electrically connected to the second horizontal power line PL2$b$ through the sixth via hole VIH6. The first bridge pattern BRP1 of the display element layer DPL may be electrically connected to the first upper electrode UE1 through the first via hole VIH1. The second bridge pattern BRP2 of the display element layer DPL may be electrically connected to the second upper electrode UE2 through the second via hole VIH2. The third bridge pattern BRP3 of the display element layer DPL may be electrically connected to the third upper electrode UE3 through the third via hole VIH3.

Detailed description of an electrical connection relationship between the pixel circuit layer PCL and the display element layer DPL will be made below with reference to FIGS. 7 to 15.

Figure 8:
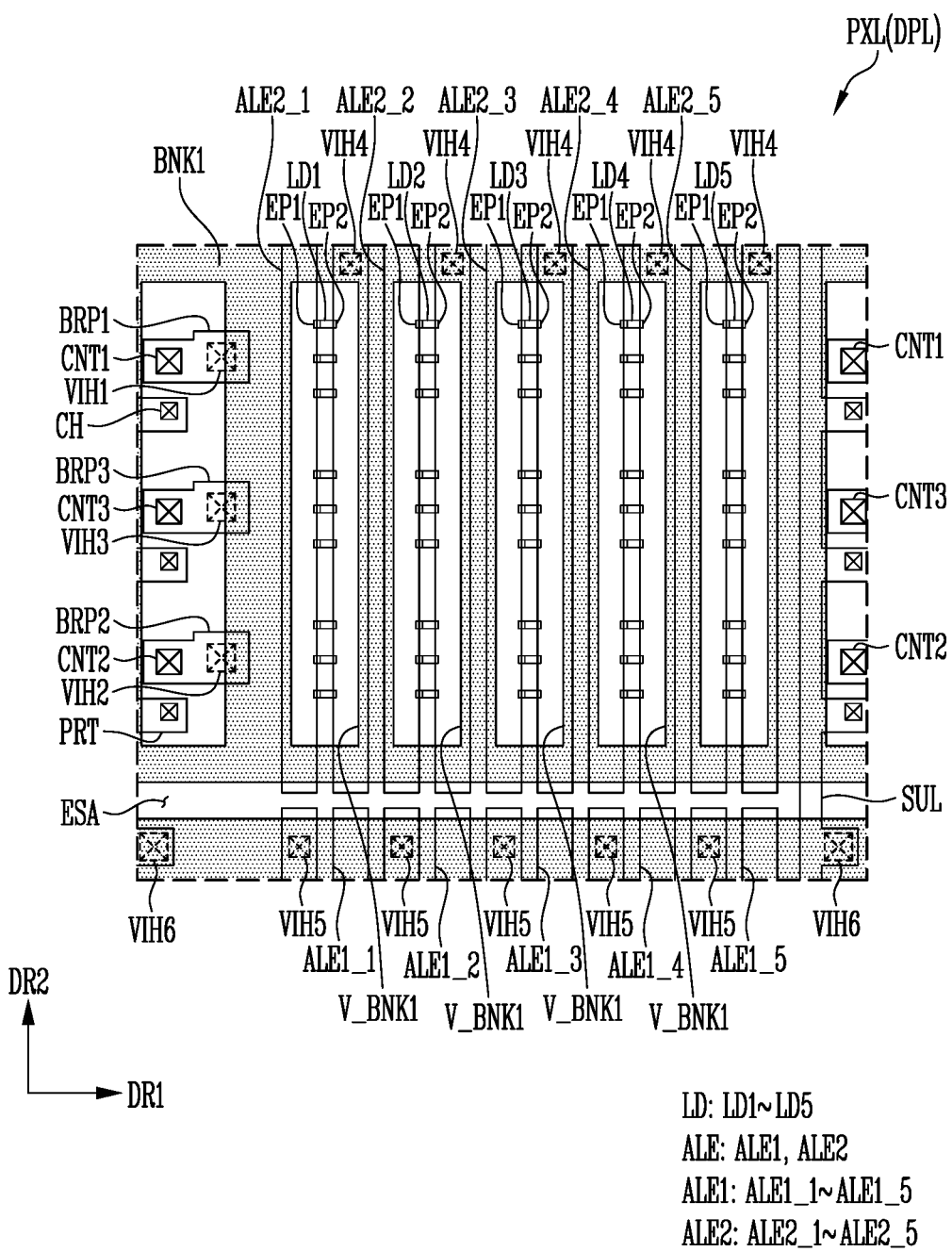
FIG. 8 is a schematic plan view illustrating only a bridge pattern, first and second alignment electrodes, light emitting elements, and an auxiliary line which are included in the pixel of FIG. 7.
Figure 9:
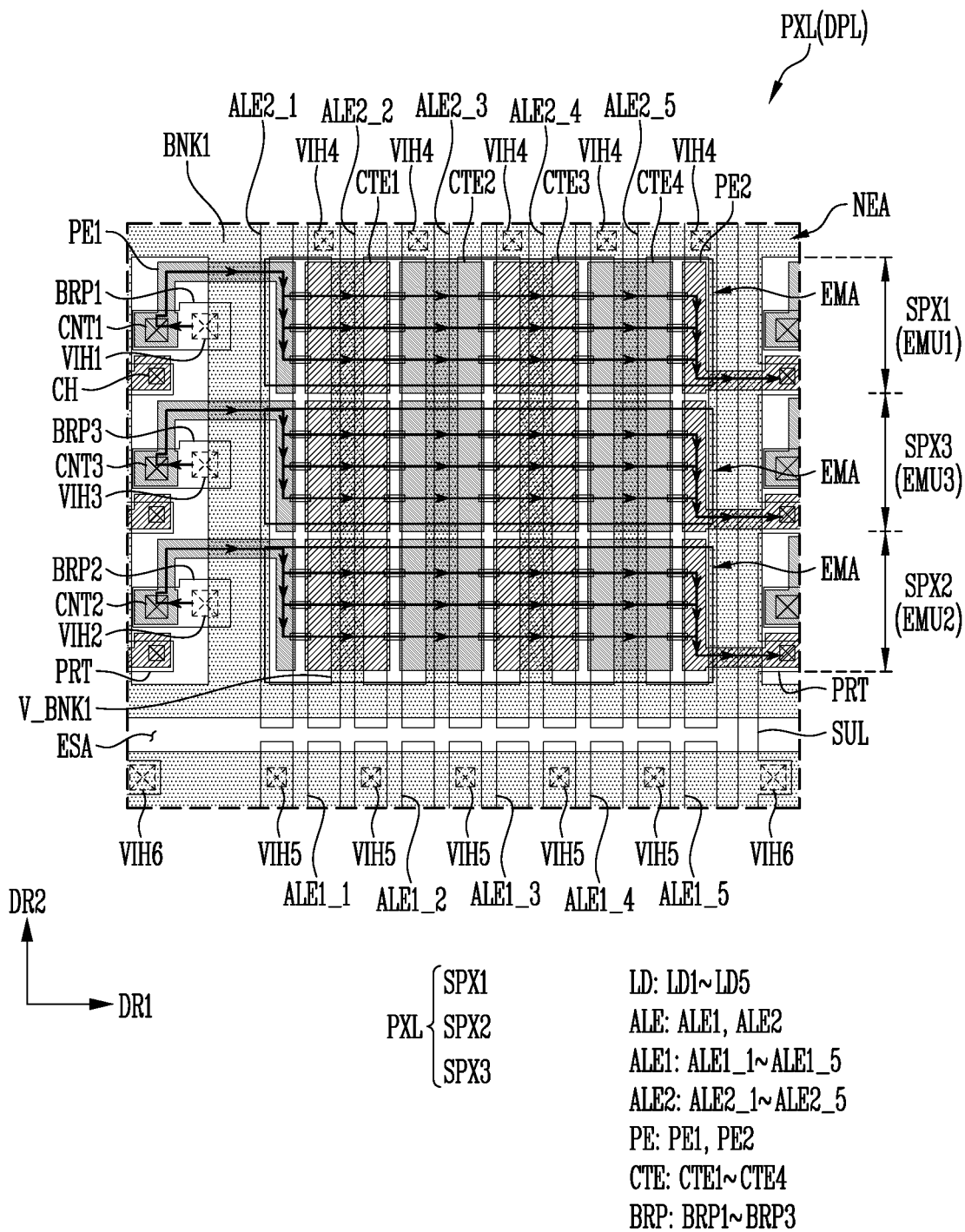
FIG. 9 is a schematic plan view illustrating a flow of driving current that flows through the pixel shown in FIG. 7.

Hereinafter, components of the display element layer DPL will be described with reference to FIGS. 7 to 9.

Figure 7:
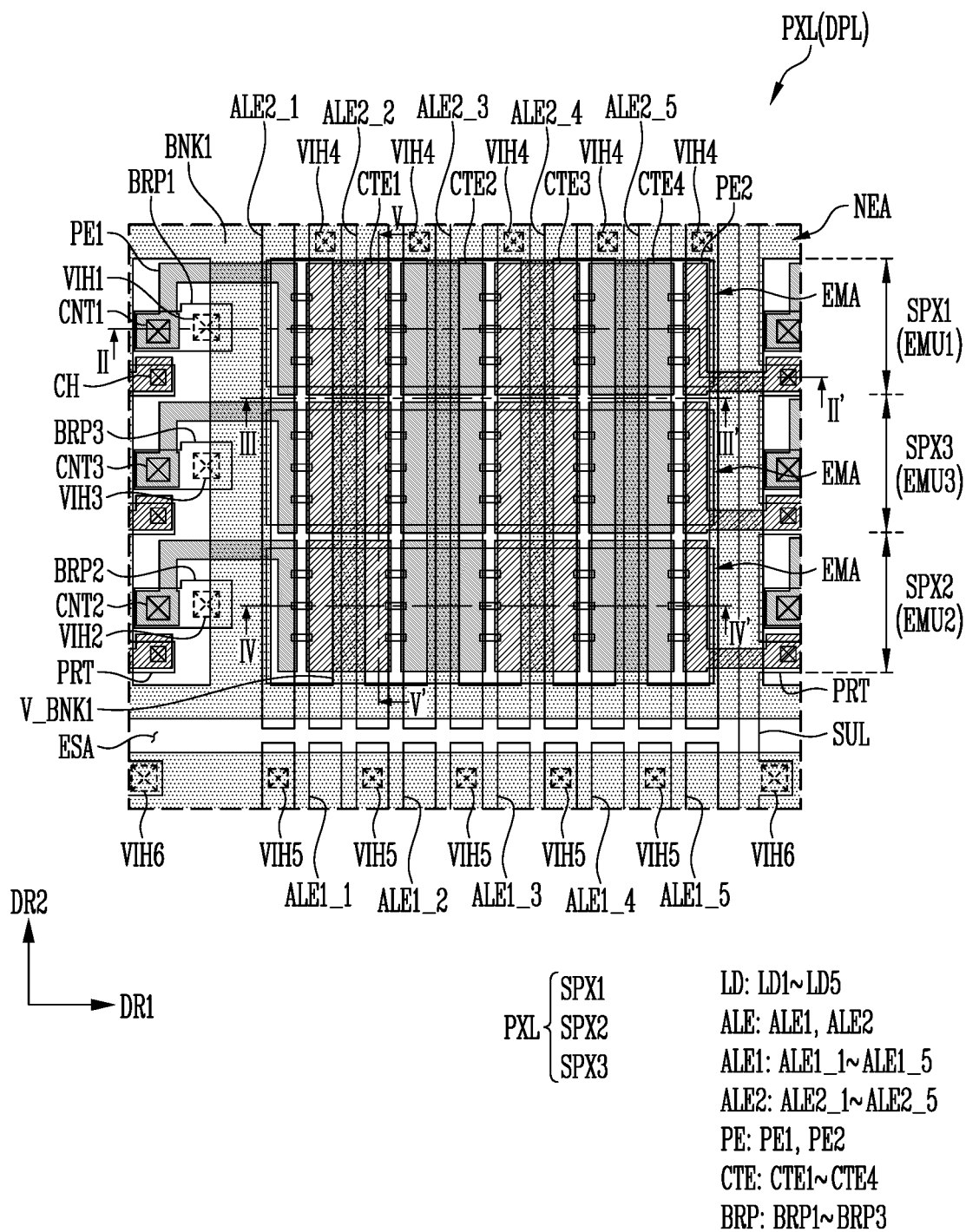
FIG. 7 is a schematic plan view illustrating a display element layer of a pixel in accordance with an embodiment.

FIG. 7 is a schematic plan view illustrating the display element layer DPL of the pixel PXL in accordance with an embodiment. FIG. 8 is a schematic plan view illustrating only a bridge pattern BRP, first and second alignment electrodes ALE1 and ALE2, light emitting elements LD, and an auxiliary line SUL which may be included in the pixel PXL of FIG. 7. FIG. 9 is a schematic plan view illustrating a flow of driving current that flows through the pixel PXL shown in FIG. 7.

Referring to FIGS. 1 to 9, the display element layer DPL of the pixel PXL may include emission components EMU1, EMU2, and EMU3 disposed in the pixel area PXA. For example, the display element layer DPL may include a first emission component EMU1, a second emission component EMU2, and a third emission component EMU3.

Each of the first, second, and third emission components EMU1, EMU2, and EMU3 may include light emitting elements LD which may be electrically connected to a pixel circuit and configured to emit light, and electrodes (or electrode patterns) that may be electrically connected to the light emitting elements LD. For example, the first emission component EMU1 may include light emitting elements LD which may be electrically connected to the first pixel circuit PXC1, and electrodes which may be electrically connected to the light emitting elements LD. The second emission component EMU2 may include light emitting elements LD which may be electrically connected to the second pixel circuit PXC2, and electrodes which may be electrically connected to the light emitting elements LD. The third emission component EMU3 may include light emitting elements LD which may be electrically connected to the third pixel circuit PXC3, and electrodes which may be electrically connected to the light emitting elements LD. The first pixel circuit PXC1 and the first emission component EMU1 may form a first sub-pixel SPX1. The second pixel circuit PXC2 and the second emission component EMU2 may form a second sub-pixel SPX2. The third pixel circuit PXC3 and the third emission component EMU3 may form a third sub-pixel SPX3.

Each of the first, second, and third sub-pixels SPX1, SPX2, and SPX3 may include an emission area EMA, and a non-emission area NEA which encloses at least one side of the emission area EMA.

The display element layer DPL may include a first bank BNK1 disposed in the non-emission area NEA.

The first bank BNK1 may be a structure that defines (or partitions) the emission area EMA of each pixel PXL, and may be a pixel defining layer. For example, the first bank BNK1 may be a structure which defines the emission area EMA of each of adjacent pixels PXL. The first bank BNK1 may define a supply position of light emitting elements LD during a process of supplying (or inputting) the light emitting elements LD to each of the adjacent pixels PXL. For example, because the emission area EMA of each of the adjacent pixels PXL may be partitioned (or defined) by the first bank BNK1, a mixed solution (e.g., ink) including a target amount and/or type of light emitting elements LD may be supplied (or input) to the emission area EMA.

In an embodiment, the first bank BNK1 may include at least one light block material and/or reflective material (or scattering material), thus preventing a light leakage defect in which light (or rays) leaks between adjacent sub-pixels. In an embodiment, the first bank BNK1 may include transparent material (or substance). The transparent material may include, for example, polyamides resin, polyimides resin, and the like, or a combination thereof, but the disclosure is not limited thereto. In an embodiment, in order to enhance the efficiency of light emitted from each of the adjacent pixels PXL, a separate reflective material layer may be provided and/or formed on the first bank BNK1.

In an embodiment, the first bank BNK1 may include a vertical bank V_BNK1. The vertical bank V_BNK1 may be disposed between adjacent alignment electrodes ALE in at least emission area EMA. For example, the vertical bank V_BNK1 may be disposed between the first alignment electrode ALE1 and the second alignment electrode ALE2 in the emission area EMA of each sub-pixel. The vertical bank V_BNK1 may be formed through the same process as the first bank BNK1, and may have the same material as that of the first bank BNK1. In an embodiment, the vertical bank V_BNK1 may be a structure configured to prevent the light emitting elements LD from being aligned in an undesired area (e.g., between a side (or the right side) of the first alignment electrode ALE1 and a side (or the left side) of the second alignment electrode ALE2).

The first bank BNK1 including the vertical bank V_BNK1 may be processed by liquid-repellent treatment so that the first bank BNK1 may have liquid repellency. For example, the surface of the first bank BNK1 may be fluorinated by fluorine-based gas plasma, thus having liquid repellency (or hydrophobicity). Because the first bank BNK1 has liquid repellency, the light emitting elements LD may not be aligned in an area in which the first bank BNK1 may be disposed, during a process of supplying the light emitting elements LD to each pixel PXL.

In an embodiment, the first bank BNK1 may not be disposed between sub-pixels adjacent to each other in the second direction DR2. For example, the first bank BNK1 may be disposed neither between the first sub-pixel SPX1 and the third sub-pixel SPX3 nor between the third sub-pixel SPX3 and the second sub-pixel SPX2.

Because the first bank BNK1 may not be disposed between the sub-pixels adjacent to each other in the second direction DR2, ink including multiple light emitting elements LD may be supplied (or discharged) to an area other than the non-emission area NEA in each pixel PXL through a nozzle of an inkjet printing device at the step of aligning the light emitting elements LD. For example, ink including multiple light emitting elements LD may be supplied to the overall surfaces of the emission area EMA of the first sub-pixel SPX1, the emission area EMA of the third sub-pixel SPX3, and the emission area EMA of the second sub-pixel SPX2. Hence, an ink supply surface area (or an ink discharge surface area) of each pixel PXL may be increased. Therefore, the amount of ink to be supplied to each pixel PXL may be increased, so that the number of light emitting elements LD aligned in the corresponding pixel PXL may be increased. Thus, the number of valid light sources provided in each pixel PXL may be increased, and the light output efficiency of the corresponding pixel PXL may be enhanced.

An electrode separation area ESA may be disposed in the non-emission area NEA of each pixel PXL. The electrode separation area ESA may be an area in which an alignment electrode ALE in each pixel PXL may be separated from an alignment electrode ALE provided in a pixel PXL disposed adjacent thereto in the second direction DR2

The display element layer DPL may include electrodes PE (or pixel electrodes) provided in the emission area EMA of each of the first, second, and third sub-pixels SPX1, SPX2, and SPX3, light emitting elements LD electrically connected to the electrodes PE, and the alignment electrodes ALE provided at positions corresponding to the electrodes PE. For example, a first electrode PE1 (or a first pixel electrode), a second electrode PE2 (or a second pixel electrode), the light emitting elements LD, and first and second alignment electrodes ALE1 and ALE2 may be disposed in the emission area EMA of each sub-pixel area. Furthermore, first, second, third, and fourth intermediate electrodes CTE1, CTE2, CTE3, and CTE4 may be disposed in the emission area EMA. The number, shape, size, arrangement structure, and the like of the electrodes PE and/or the alignment electrodes ALE may be changed in various ways depending on the structures of the first, second, and third sub-pixels SPX1, SPX2, and SPX3 (particularly, the first, second, and third emission components EMU1, EMU2, and EMU3).

The first emission component EMU1, the second emission component EMU2, and the third emission component EMU3 may have a substantially similar or same structure. Hereinafter, configurations of the display element layer DPL will be described, based on the first sub-pixel SPX1 including the first emission component EMU1.

In an embodiment, based on a surface of the substrate SUB on which the first sub-pixel SPX1 may be provided (or located), the alignment electrodes ALE, the light emitting elements LD, and the electrodes PE may be provided in the order listed, but the disclosure is not limited thereto. In an embodiment, the positions and formation sequence of electrodes that forms the first sub-pixel SPX1 (or the first emission component EMU1) may be changed in various ways.

The alignment electrodes ALE may include the first alignment electrode ALE1 and the second alignment electrode ALE2 which may be spaced apart from each other in the first direction DR1. In an embodiment, the first alignment electrode ALE1 and the second alignment electrode ALE2 may extend in the second direction DR2.

Each of the first alignment electrode ALE1 and the second alignment electrode ALE2 may include alignment electrodes. For example, the first alignment electrode ALE1 may include 1-1-th, 1-2-th, 1-3-th, 1-4-th, and 1-5-th alignment electrodes ALE1_1, ALE1_2, ALE1_3, ALE1_4, and ALE1_5 which extend in the second direction DR2. The second alignment electrode ALE2 may include 2-1-th, 2-2-th, 2-3-th, 2-4-th, and 2-5-th alignment electrodes ALE2_1, ALE2_2, ALE2_3, ALE2_4, and ALE2_5 which extend in the second direction DR2 and may be spaced apart from the first alignment electrode ALE1.

The first alignment electrode ALE1 and the second alignment electrode ALE2 may be alternately arranged in the first direction DR1 in at least the emission area EMA. For example, in the emission area EMA, the 2-1-th alignment electrode ALE2_1, the 1-1-th alignment electrode ALE1_1, the 2-2-th alignment electrode ALE2_2, the 1-2-th alignment electrode ALE1_2, the 2-3-th alignment electrode ALE2_3, the 1-3-th alignment electrode ALE1_3, the 2-4-th alignment electrode ALE2_4, the 1-4-th alignment electrode ALE1_4, the 2-5-th alignment electrode ALE2_5, and the 1-5-th alignment electrode ALE1_5 may be arranged in the first direction DR1 in the order listed.

In the emission area EMA, each of the first alignment electrode ALE1 and the second alignment electrode ALE2 may be disposed at a position spaced apart from an alignment electrode ALE adjacent thereto in the first direction DR1. For example, the 2-1-th alignment electrode ALE2_1 may be disposed at a position spaced apart from the 1-1-th alignment electrode ALE1_1 in the first direction DR1. The 1-1-th alignment electrode ALE1_1 may be disposed at a position spaced apart from the 2-1-th and 2-2-th alignment electrodes ALE2_1 and ALE2_2 in the first direction DR1. The 2-2-th alignment electrode ALE2_2 may be disposed at a position spaced apart from the 1-1-th and 1-2-th alignment electrodes ALE1_1 and ALE1_2 in the first direction DR1. The 1-2-th alignment electrode ALE1_2 may be disposed at a position spaced apart from the 2-2-th and 2-3-th alignment electrodes ALE2_2 and ALE2_3 in the first direction DR1. The 2-3-th alignment electrode ALE2_3 may be disposed at a position spaced apart from the 1-2-th and 1-3-th alignment electrodes ALE1_2 and ALE1_3 in the first direction DR1. The 1-3-th alignment electrode ALE1_3 may be disposed at a position spaced apart from the 2-3-th and 2-4-th alignment electrodes ALE2_3 and ALE2_4 in the first direction DR1. The 2-4-th alignment electrode ALE2_4 may be disposed at a position spaced apart from the 1-3-th and 1-4-th alignment electrodes ALE1_3 and ALE1_4 in the first direction DR1. The 1-4-th alignment electrode ALE1_4 may be disposed at a position spaced apart from the 2-4-th and 2-5-th alignment electrodes ALE2_4 and ALE2_5 in the first direction DR1. The 2-5-th alignment electrode ALE2_5 may be disposed at a position spaced apart from the 1-4-th and 1-5-th alignment electrodes ALE1_4 and ALE1_5 in the first direction DR1.

Each of the first alignment electrode ALE1 and the second alignment electrode ALE2 may have a bar-like shape which extends in the second direction DR2 and has a certain width in the first direction DR1.

In an embodiment, the first alignment electrode ALE1 and the second alignment electrode ALE2 that may be provided in each pixel PXL may be separated from other electrodes (e.g., the first and second alignment electrodes ALE1 and ALE2 provided in an adjacent pixel PXL adjacent to the corresponding pixel PXL in the second direction DR2) after the light emitting elements LD have been supplied to and aligned in the emission area EMA during a process of fabricating the display device. For example, the first alignment element ALE1 may be separated from a first alignment electrode ALE1 provided in an adjacent pixel PXL adjacent to the corresponding pixel PXL in the second direction DR2 after the light emitting elements LD have been supplied to and aligned in the emission area EMA during the process of fabricating the display device. Furthermore, the second alignment element ALE2 may be separated from a second alignment electrode ALE2 provided in the adjacent pixel PXL adjacent to the corresponding pixel PXL in the second direction DR2 after the light emitting elements LD have been supplied to and aligned in the emission area EMA during the process of fabricating the display device.

In detail, the first alignment electrodes ALE1 provided in the pixel PXL may be electrically connected to the first alignment electrodes ALE1 provided in the adjacent pixels PXL adjacent to the pixel PXL in the second direction DR2 during the process of fabricating the display device, and thus being used as the first alignment line. The second alignment electrodes ALE2 provided in the pixel PXL may be electrically connected to the second alignment electrodes ALE2 provided in the adjacent pixels PXL adjacent to the pixel PXL in the second direction DR2 during the process of fabricating the display device, and thus be used as the second alignment line. Therefore, during a process of aligning the light emitting elements LD, a first alignment signal may be supplied to the first alignment line through the first horizontal power line PL1b, and a second alignment signal may be supplied to the second alignment line through the second horizontal power line PL2b. After the process of aligning the light emitting elements LD has been completed, a portion of each of the first and second alignment lines may be removed from the electrode separation area ESA (or each of the first and second alignment lines may be cut off). Therefore, the first and second alignment electrodes ALE1 and ALE2 of the pixels PXL disposed on the same pixel column may be electrically separated or disconnected from each other, whereby the pixels PXL may be individually driven.

The first alignment electrode ALE1 and the second alignment electrode ALE2 may extend in the second direction DR2 to the emission area EMA of the first sub-pixel SPX1, the emission area EMA of the third sub-pixel SPX3, and the emission area EMA of the second sub-pixel SPX2. For example, each of the first and second alignment electrodes ALE1 and ALE2 may be provided in common to the emission area EMA of each of the first, third, and second sub-pixels SPX1, SPX3, and SPX2.

In an embodiment, the first alignment electrode ALE1 may be electrically connected to a component of the pixel circuit layer PCL, for example, the first horizontal power line PL1b of the pixel circuit layer PCL, through the fourth via hole VIH4. For example, each of the 1-1-th, 1-2-th, 1-3-th, 1-4-th, and 1-5-th alignment electrodes ALE1_1, ALE1_2, ALE1_3, ALE1_4, and ALE1_5 may be electrically connected to the first horizontal power line PL1b through the corresponding fourth via hole VIH4. The second alignment electrode ALE2 may be electrically connected to a component of the pixel circuit layer PCL, for example, the second horizontal power line PL2*b* of the pixel circuit layer PCL, through the fifth via hole VIH5. For example, each of the 2-1-th, 2-2-th, 2-3-th, 2-4-th, and 2-5-th alignment electrodes ALE2_1, ALE2_2, ALE2_3, ALE2_4, and ALE2_5 may be electrically connected to the second horizontal power line PL2*b* through the corresponding fifth via hole VIH5.

In an embodiment, a vertical bank V_BNK1 of the first bank BNK1 may be disposed between the first alignment electrode ALE1 and the second alignment electrode ALE2. For example, vertical banks V_BNK1 may be respectively disposed between the 1-1-th alignment electrode ALE1_1 and the 2-2-th alignment electrode ALE2_2, between the 1-2-th alignment electrode ALE1_2 and the 2-3-th alignment electrode ALE2_3, between the 1-3-th alignment electrode ALE1_3 and the 2-4-th alignment electrode ALE2_4, and between the 1-4-th alignment electrode ALE1_4 and the 2-5-th alignment electrode ALE2_5.

The vertical bank V_BNK1 that may be disposed between the 1-1-th alignment electrode ALE1_1 and the 2-2-th alignment electrode ALE2_2 may overlap each of a side (or the left side) of the 1-1-th alignment electrode ALE1_1 and a side (or the right side) of the 2-2-th alignment electrode ALE2_2. The vertical bank V_BNK1 may cover an area between the 1-1-th alignment electrode ALE1_1 and the 2-2-th alignment electrode ALE2_2. Because the vertical bank V_BNK1 having liquid repellency (or processed by liquid-repellent treatment) covers the area between the 1-1-th alignment electrode ALE1_1 and the 2-2-th alignment electrode ALE2_2, the light emitting elements LD may not aligned in the area between the 1-1-th alignment electrode ALE1_1 and the 2-2-th alignment electrode ALE2_2 in case that the light emitting elements LD are supplied to the pixel PXL. Hence, the number of light emitting elements LD aligned in an undesired area may be minimized or reduced, so that removal of the light emitting elements LD from desired positions may be reduced.

The vertical bank V_BNK1 that may be disposed between the 1-2-th alignment electrode ALE1_2 and the 2-3-th alignment electrode ALE2_3 may overlap each of the left side of the 1-2-th alignment electrode ALE1_2 and the right side of the 2-3-th alignment electrode ALE2_3. The vertical bank V_BNK1 may cover an area between the 1-2-th alignment electrode ALE1_2 and the 2-3-th alignment electrode ALE2_3. Because the vertical bank V_BNK1 having liquid repellency (or processed by liquid-repellent treatment) covers the area between the 1-2-th alignment electrode ALE1_2 and the 2-3-th alignment electrode ALE2_3, the light emitting elements LD may not aligned in the area between the 1-2-th alignment electrode ALE1_2 and the 2-3-th alignment electrode ALE2_3 in case that the light emitting elements LD are inputted (or supplied) to the pixel PXL. Hence, the number of light emitting elements LD aligned in an undesired area may be minimized or reduced, so that removal of the light emitting elements LD from desired positions may be reduced.

The vertical bank V_BNK1 that may be disposed between the 1-3-th alignment electrode ALE1_3 and the 2-4-th alignment electrode ALE2_4 may overlap each of the left side of the 1-3-th alignment electrode ALE1_3 and the right side of the 2-4-th alignment electrode ALE2_4. The vertical bank V_BNK1 may cover an area between the 1-3-th alignment electrode ALE1_3 and the 2-4-th alignment electrode ALE2_4. Because the vertical bank V_BNK1 having liquid repellency (or processed by liquid-repellent treatment) covers the area between the 1-3-th alignment electrode ALE1_3 and the 2-4-th alignment electrode ALE2_4, the light emitting elements LD may not aligned in the area between the 1-3-th alignment electrode ALE1_3 and the 2-4-th alignment electrode ALE2_4 in case that the light emitting elements LD are inputted (or supplied) to the pixel PXL. Hence, the number of light emitting elements LD aligned in an undesired area may be minimized or reduced, so that removal of the light emitting elements LD from desired positions may be reduced.

The vertical bank V_BNK1 that may be disposed between the 1-4-th alignment electrode ALE1_4 and the 2-5-th alignment electrode ALE2_5 may overlap each of the left side of the 1-4-th alignment electrode ALE1_4 and the right side of the 2-5-th alignment electrode ALE2_5. The vertical bank V_BNK1 may cover an area between the 1-4-th alignment electrode ALE1_4 and the 2-5-th alignment electrode ALE2_5. Because the vertical bank V_BNK1 having liquid repellency (or processed by liquid-repellent treatment) covers the area between the 1-4-th alignment electrode ALE1_4 and the 2-5-th alignment electrode ALE2_5, the light emitting elements LD may not aligned in the area between the 1-4-th alignment electrode ALE1_4 and the 2-5-th alignment electrode ALE2_5 in case that the light emitting elements LD are inputted (or supplied) to the pixel PXL. Hence, the number of light emitting elements LD aligned in an undesired area may be minimized or reduced, so that removal of the light emitting elements LD from desired positions may be reduced.

In an embodiment, the vertical bank V_BNK1 may not be disposed between a side (or the left side) of the second alignment electrode ALE2 and a side (or the right side) of the first alignment electrode ALE1, and the light emitting elements LD may be aligned therebetween. For example, in lieu of the vertical bank V_BNK1, the light emitting elements LD may be aligned between the left side of the 2-1-th alignment electrode ALE2_1 and the right side of the 1-1-th alignment electrode ALE1_1, between the left side of the 2-2-th alignment electrode ALE2_2 and the right side of the 1-2-th alignment electrode ALE1_2, between the left side of the 2-3-th alignment electrode ALE2_3 and the right side of the 1-3-th alignment electrode ALE1_3, between the left side of the 2-4-th alignment electrode ALE2_4 and the right side of the 1-4-th alignment electrode ALE1_4, and between the left side of the 2-5-th alignment electrode ALE2_5 and the right side of the 1-5-th alignment electrode ALE1_5. The first end EP1 of each of the light emitting elements LD may be disposed adjacent to the second alignment electrode ALE2, and the second end EP2 of the corresponding light emitting element LD may be disposed adjacent to the first alignment electrode ALE1.

A bank pattern may be disposed under the first alignment electrode ALE1 and the second alignment electrode ALE2 to change the surface profiles (or the shapes) of the first and second alignment electrodes ALE1 and ALE2 such that light emitted from the light emitting elements LD may be guided in an image display direction of the display device. The bank pattern may be a support component for supporting each of the first and second alignment electrodes ALE1 and ALE2. The bank pattern will be described with reference to FIGS. 10 to 15.

A bridge pattern BRP spaced apart from the first and second alignment electrodes ALE1 and ALE2 may be disposed in the non-emission area NEA of each sub-pixel. For example, the first bridge pattern BRP1 spaced apart from the first and second alignment electrodes ALE1 and ALE2 may be disposed in the non-emission area NEA of the first sub-pixel SPX1. The second bridge pattern BRP2 spaced apart from the first and second alignment electrodes ALE1 and ALE2 may be disposed in the non-emission area NEA of the second sub-pixel SPX2. The third bridge pattern BRP3 spaced apart from the first and second alignment electrodes ALE1 and ALE2 may be disposed in the non-emission area NEA of the third sub-pixel SPX3.

The first bridge pattern BRP1 may be provided in the form of an island in the non-emission area NEA of the first sub-pixel SPX1. The first bridge pattern BRP1 may be electrically connected to the first upper electrode UE1 of the first sub-pixel SPX1 through the first via hole VIH1. Furthermore, the first bridge pattern BRP1 may be electrically connected to the first electrode PE1 (or the first pixel electrode) of the first sub-pixel SPX1 through a first contactor CNT1.

The second bridge pattern BRP2 may be provided in the form of an island in the non-emission area NEA of the second sub-pixel SPX2. The second bridge pattern BRP2 may be electrically connected to the second upper electrode UE2 of the second sub-pixel SPX2 through the second via hole VIH2. Furthermore, the second bridge pattern BRP2 may be electrically connected to the first electrode PE1 (or the first pixel electrode) of the second sub-pixel SPX2 through a second contactor CNT2.

The third bridge pattern BRP3 may be provided in the form of an island in the non-emission area NEA of the third sub-pixel SPX3. The third bridge pattern BRP3 may be electrically connected to the third upper electrode UE3 of the third sub-pixel SPX3 through the third via hole VIH3. Furthermore, the third bridge pattern BRP3 may be electrically connected to the first electrode PE1 (or the first pixel electrode) of the third sub-pixel SPX3 through a third contactor CNT3.

The first bridge pattern BRP1, the third bridge pattern BRP3, and the second bridge pattern BRP2 may be arranged in the second direction DR2 in the order listed. The first bridge pattern BRP1, the third bridge pattern BRP3, and the second bridge pattern BRP2 may be located at the same column in the second direction DR2. In an embodiment, the arrangement sequence of the first bridge pattern BRP1, the third bridge pattern BRP3, and the second bridge pattern BRP2 may correspond to the arrangement sequence of the first upper electrode UE1, the third upper electrode UE3, and the second upper electrode UE2 of the pixel circuit layer PCL. Furthermore, the first bridge pattern BRP1 may overlap the first upper electrode UE1. The third bridge pattern BRP3 may overlap the third upper electrode UE3. The second bridge pattern BRP2 may overlap the second upper electrode UE2.

Each of the first bridge pattern BRP1, the second bridge pattern BRP2, and the third bridge pattern BRP3 may be disposed at a position spaced apart from the bridge pattern BRP adjacent thereto in the second direction DR2. For example, the first bridge pattern BRP1 may be disposed at a position spaced apart from the third bridge pattern BRP3 in the second direction DR2. The third bridge pattern BRP3 may be disposed at a position spaced apart from the first and second bridge patterns BRP1 and BRP2 in the second direction DR2. The second bridge pattern BRP2 may be disposed at a position spaced apart from the third bridge pattern BRP3 in the second direction DR2.

The auxiliary line SUL may be located in the non-emission areas NEA of the first, second, and third sub-pixels SPX1, SPX2, and SPX3. The auxiliary line SUL may be disposed at a position spaced apart from the first to third bridge patterns BRP1, BRP2, and BRP3, the first alignment electrode ALE1, and the second alignment electrode ALE2.

The auxiliary line SUL may extend in the second direction DR2, and include a protrusion PRT which protrudes in the first direction DR1.

The auxiliary line SUL may be electrically connected to the second electrode PE2 (or the second pixel electrode) of each sub-pixel through the corresponding contact hole CH. For example, the auxiliary line SUL may be electrically connected to the second electrode PE2 of each of the first, second, and third sub-pixels SPX1, SPX2, and SPX3 through the corresponding contact hole CH. The contact hole CH may be formed by removing an area of an insulating layer (e.g., refer to "first insulating layer INS1" of FIG. 10) that may be located between the auxiliary line SUL and the second electrode PE2 of each of the first, second, and third sub-pixels SPX1, SPX2, and SPX3.

Furthermore, the auxiliary line SUL may be electrically connected to a component of the pixel circuit layer PCL, for example, the second horizontal power line PL2$b$ of the pixel circuit layer PCL, through the sixth via hole VIH6. The second electrode PE2 may be electrically connected with the second horizontal power line PL2$b$ through the auxiliary line SUL. Hence, a voltage of the second driving power supply VSS may be applied to the second electrode PE2. In an embodiment, the second electrode PE2 may be used as a driving electrode configured to drive the light emitting elements LD.

Although at least two to several tens of light emitting elements LD may be aligned and/or disposed in the emission area EMA (or the first sub-pixel area SPA1) of the first sub-pixel SPX1, the number of light emitting elements LD is not limited thereto. In an embodiment, the number of light emitting elements LD aligned and/or disposed in the emission area EMA may be changed in various ways.

The light emitting elements LD may be disposed between the second alignment electrode ALE2 and the first alignment electrode ALE1. In a plan view, each of the light emitting elements LD may include a first end EP1 and a second end EP2 which may be located (or face each other) on respective opposite ends of the light emitting element LD in the longitudinal direction thereof, e.g., in the first direction DR1. In an embodiment, the second semiconductor layer (refer to "13" of FIG. 1) including a p-type semiconductor layer may be disposed on the first end EP1, and the first semiconductor layer (refer to "11" of FIG. 1) including an n-type semiconductor layer may be disposed on the second end EP2. The first end EP1 of each of the light emitting elements LD may be disposed adjacent to the second alignment electrode ALE2, and the second end EP2 of the corresponding light emitting element LD may be disposed adjacent to the first alignment electrode ALE1. The light emitting elements LD may be electrically connected in parallel between the second alignment electrode ALE2 and the first alignment electrode ALE1.

The light emitting elements LD may be disposed at positions spaced apart from each other and aligned substantially parallel to each other. A distance by which the light emitting elements LD may be spaced apart from each other is not particularly limited. In an embodiment, multiple light emitting elements LD may be disposed adjacent to each other to form a group, and other multiple light emitting elements LD may be spaced apart from each other at regular intervals to form a group. The light emitting elements LD may be aligned in a direction with an uneven density.

Each of the light emitting elements LD may emit a light of color light and/or white light. Each of the light emitting elements LD may be aligned between the second alignment electrode ALE2 and the first alignment electrode ALE1 such that the longitudinal direction thereof may be parallel to the first direction DR1. The light emitting elements LD may be provided in a diffused form in ink and inputted (or supplied) to the emission area EMA (or the pixel area PXA) of the pixel PXL.

The light emitting elements LD may be inputted (or supplied) to the emission area EMA by an inkjet printing scheme, a slit coating scheme, or other various schemes. For example, the light emitting elements LD may be mixed with a volatile solvent and inputted (or supplied) to the emission area EMA by an inkjet printing scheme or a slit coating scheme. Here, if the first alignment electrode ALE1 and the second alignment electrode ALE2 may be respectively supplied with corresponding alignment signals, an electric field may be formed between the second alignment electrode ALE2 and the first alignment electrode ALE1. The light emitting elements LD may be aligned in a desired area, e.g., between the second alignment electrode ALE2 and the first alignment electrode ALE1, by the electric field. After the light emitting elements LD may be aligned, the solvent may be removed by a volatilization scheme or other schemes. In this way, the light emitting elements LD having the longitudinal direction parallel to the first direction DR1 may be reliably aligned between the second alignment electrode ALE2 and the first alignment electrode ALE1.

In an embodiment, the light emitting elements LD may include a first light emitting element LD1, a second light emitting element LD2, a third light emitting element LD3, a fourth light emitting element LD4, and a fifth light emitting element LD5.

The first light emitting element LD1 may be aligned between the 2-1-th alignment electrode ALE2_1 and the 1-1-th alignment electrode ALE1_1 and electrically connected to the first electrode PE1 and the first intermediate electrode CTE1. The first light emitting element LD1 may include a first end EP1 which may be disposed adjacent to the 2-1-th alignment electrode ALE2_1, and a second end EP2 which may be disposed adjacent to the 1-1-th alignment electrode ALE1_1.

The second light emitting element LD2 may be aligned between the 2-2-th alignment electrode ALE2_2 and the 1-2-th alignment electrode ALE1_2 and electrically connected to the first intermediate electrode CTE1 and the second intermediate electrode CTE2. The second light emitting element LD2 may include a first end EP1 which may be disposed adjacent to the 2-2-th alignment electrode ALE2_2, and a second end EP2 which may be disposed adjacent to the 1-2-th alignment electrode ALE1_2.

The third light emitting element LD3 may be aligned between the 2-3-th alignment electrode ALE2_3 and the 1-3-th alignment electrode ALE1_3 and electrically connected to the second intermediate electrode CTE2 and the third intermediate electrode CTE3. The third light emitting element LD3 may include a first end EP1 which may be disposed adjacent to the 2-3-th alignment electrode ALE2_3, and a second end EP2 which may be disposed adjacent to the 1-3-th alignment electrode ALE1_3.

The fourth light emitting element LD4 may be aligned between the 2-4-th alignment electrode ALE2_4 and the 1-4-th alignment electrode ALE1_4 and electrically connected to the third intermediate electrode CTE3 and the fourth intermediate electrode CTE4. The fourth light emitting element LD4 may include a first end EP1 which may be disposed adjacent to the 2-4-th alignment electrode ALE2_4, and a second end EP2 which may be disposed adjacent to the 1-4-th alignment electrode ALE1_4.

The fifth light emitting element LD5 may be aligned between the 2-5-th alignment electrode ALE2_5 and the 1-5-th alignment electrode ALE1_5 and electrically connected to the fourth intermediate electrode CTE4 and the second electrode PE2. The fifth light emitting element LD5 may include a first end EP1 which may be disposed adjacent to the 2-5-th alignment electrode ALE2_5, and a second end EP2 which may be disposed adjacent to the 1-5-th alignment electrode ALE1_5.

As described above, the first end EP1 of each of the first, second, third, fourth, and fifth light emitting elements LD1, LD2, LD3, LD4, and LD5 may be disposed adjacent to the corresponding second alignment electrode ALE2. The second end EP2 of each of the first, second, third, fourth, and fifth light emitting elements LD1, LD2, LD3, LD4, and LD5 may be disposed adjacent to the corresponding first alignment electrode ALE1. Hence, the second semiconductor layer 13 of the first light emitting element LD1, the second semiconductor layer 13 of the second light emitting element LD2, the second semiconductor layer 13 of the third light emitting element LD3, the second semiconductor layer 13 of the fourth light emitting element LD4, and the second semiconductor layer 13 of the fifth light emitting element LD5 may be oriented in the same direction so that the first, second, third, fourth, and fifth light emitting elements LD1, LD2, LD3, LD4, and LD5 may be electrically connected to each other.

In a plan view, the first light emitting element LD1 may be disposed on the left side of the corresponding emission area EMA, and the fifth light emitting element LD5 may be disposed on the right side of the corresponding emission area EMA. In a plan view, the third light emitting element LD3 may be disposed in an intermediate portion of the corresponding emission area EMA. In a plan view, the second light emitting element LD2 may be disposed in an area between an area in which the first light emitting element LD1 may be disposed and an area in which the third light emitting element LD3 may be disposed. The fourth light emitting element LD4 may be disposed in an area between an area in which the third light emitting element LD3 may be disposed and an area in which the fifth light emitting element LD5 may be disposed.

Each of the first, second, third, fourth, and fifth light emitting elements LD1, LD2, LD3, LD4, and LD5 may comprise multiple light emitting elements.

The first end EP1 of each of the first light emitting elements LD1 may be electrically connected to the first electrode PE1. The second end EP2 of each of the first light emitting elements LD1 may be electrically connected to the first intermediate electrode CTE1. The first end EP1 of each of the second light emitting elements LD2 may be electrically connected to the first intermediate electrode CTE1. The second end EP2 of each of the second light emitting elements LD2 may be electrically connected to the second intermediate electrode CTE2. The first end EP1 of each of the third light emitting elements LD3 may be electrically connected to the second intermediate electrode CTE2. The second end EP2 of each of the third light emitting elements LD3 may be electrically connected to the third intermediate electrode CTE3. The first end EP1 of each of the fourth light emitting elements LD4 may be electrically connected to the third intermediate electrode CTE3. The second end EP2 of each of the fourth light emitting elements LD4 may be electrically connected to the fourth intermediate electrode CTE4. The first end EP1 of each of the fifth light emitting elements LD5 may be electrically connected to the fourth intermediate electrode CTE4. The second end EP2 of each of the fifth light emitting elements LD5 may be electrically connected to the second electrode PE2.

Each of the first, second, third, fourth, and fifth light emitting elements LD1, LD2, LD3, LD4, and LD5 may be formed of a light emitting diode which may be made of material having an inorganic crystal structure and may have a subminiature size, e.g., ranging from the nano scale (or the nanometer scale) to the micro scale (or the micrometer scale).

The electrode PE (or the pixel electrode) and the intermediate electrode CTE may be provided in at least the emission area EMA of the pixel PXL (or the sub-pixel), and each may be provided at a position corresponding to at least one alignment electrode ALE and the light emitting elements LD. For example, each electrode PE and each intermediate electrode CTE may be formed on the corresponding alignment electrodes ALE and the corresponding light emitting elements LD to overlap the alignment electrodes ALE and the light emitting elements LD, and thus electrically connected to at least the light emitting elements LD.

The first electrode PE1 (or the first pixel electrode) may be formed on the 2-1-th alignment electrode ALE2_1 and the respective first ends EP1 of the first light emitting elements LD1, and thus electrically connected to the respective first ends EP1 of the first light emitting elements LD1. The first electrode PE1 may be electrically connected to the corresponding bridge pattern BRP. For example, the first electrode PE1 of the first sub-pixel SPX1 may be electrically connected to the first bridge pattern BRP1 through the first contactor CNT1. The first electrode PE1 of the second sub-pixel SPX2 may be electrically connected to the second bridge pattern BRP2 through the second contactor CNT2. The first electrode PE1 of the third sub-pixel SPX3 may be electrically connected to the third bridge pattern BRP3 through the third contactor CNT3.

The first electrode PE1 of the first sub-pixel SPX1, the first electrode PE1 of the second sub-pixel SPX2, and the first electrode PE1 of the third sub-pixel SPX3 may be disposed at positions spaced apart from each other, and may be electrically separated from each other.

The second electrode PE2 (or the second pixel electrode) may be formed on the 1-5-th alignment electrode ALE1_5 and the respective second ends EP2 of the fifth light emitting elements LD5, and thus electrically connected to the respective second ends EP2 of the fifth light emitting elements LD5. The second electrode PE2 may be electrically connected to the first, second, third, and fourth light emitting elements LD1, LD2, LD3, and LD4 via at least one intermediate electrode CTE and/or the light emitting elements LD. The second electrode PE2 may be electrically connected to the auxiliary line SUL. For example, the second electrode PE2 of the first sub-pixel SPX1 may be electrically connected to the protrusion PRT of the auxiliary line SUL through the corresponding contact hole CH in the non-emission area NEA of the first sub-pixel SPX1. The second electrode PE2 of the second sub-pixel SPX2 may be electrically connected to the protrusion PRT of the auxiliary line SUL through the corresponding contact hole CH in the non-emission area NEA of the second sub-pixel SPX2. The second electrode PE2 of the third sub-pixel SPX3 may be electrically connected to the protrusion PRT of the auxiliary line SUL through the corresponding contact hole CH in the non-emission area NEA of the third sub-pixel SPX3.

The second electrode PE2 of the first sub-pixel SPX1, the second electrode PE2 of the second sub-pixel SPX2, and the second electrode PE2 of the third sub-pixel SPX3 may be disposed at positions spaced apart from each other.

In an embodiment, the intermediate electrode CTE may include a first intermediate electrode CTE1, a second intermediate electrode CTE2, a third intermediate electrode CTE3, and a fourth intermediate electrode CTE4 which may be disposed at positions spaced apart from each other in the first direction DR1.

The first intermediate electrode CTE1 may be formed on the 1-1-th alignment electrode ALE1_1 and the respective second ends EP2 of the first light emitting elements LD1, and thus electrically connected to the second end EP2 of each first light emitting element LD1. Furthermore, the first intermediate electrode CTE1 may be formed on the 2-2-th alignment electrode ALE2_2 and the respective first ends EP1 of the second light emitting elements LD2, and thus electrically connected to the first end EP1 of each second light emitting element LD2. The first intermediate electrode CTE1 may be a first connection component configured to electrically connect the first light emitting elements LD1 (or the first series set SET1) and the second light emitting elements LD2 (or the second series set SET2).

The second intermediate electrode CTE2 may be formed on the 1-2-th alignment electrode ALE1_2 and the respective second ends EP2 of the second light emitting elements LD2, and thus electrically connected to the second end EP2 of each second light emitting element LD2. Furthermore, the second intermediate electrode CTE2 may be formed on the 2-3-th alignment electrode ALE2_3 and the respective first ends EP1 of the third light emitting elements LD3, and thus electrically connected to the first end EP1 of each third light emitting element LD3. The second intermediate electrode CTE2 may be a second connection component configured to electrically connect the second light emitting elements LD2 (or the second series set SET2) and the third light emitting elements LD3 (or the third series set SET3).

The third intermediate electrode CTE3 may be formed on the 1-3-th alignment electrode ALE1_3 and the respective second ends EP2 of the third light emitting elements LD3, and thus electrically connected to the second end EP2 of each third light emitting element LD3. Furthermore, the third intermediate electrode CTE3 may be formed on the 2-4-th alignment electrode ALE2_4 and the respective first ends EP1 of the fourth light emitting elements LD4, and thus electrically connected to the first end EP1 of each fourth light emitting element LD4. The third intermediate electrode CTE3 may be a third connection component configured to electrically connect the third light emitting elements LD3 (or the third series set SET3) and the fourth light emitting elements LD4 (or the fourth series set SET4).

The fourth intermediate electrode CTE4 may be formed on the 1-4-th alignment electrode ALE1_4 and the respective second ends EP2 of the fourth light emitting elements LD4, and thus electrically connected to the second end EP2 of each fourth light emitting element LD4. Furthermore, the fourth intermediate electrode CTE4 may be formed on the 2-5-th alignment electrode ALE2_5 and the respective first ends EP1 of the fifth light emitting elements LD5, and thus electrically connected to the first end EP1 of each fifth light emitting element LD5. The fourth intermediate electrode CTE4 may be a fourth connection component configured to electrically connect the fourth light emitting elements LD4 (or the fourth series set SET4) and the fifth light emitting elements LD5 (or the fifth series set SET5).

Each of the first, second, third, and fourth intermediate electrodes CTE1, CTE2, CTE3, and CTE4 may be provided in a rectangular shape in the corresponding emission area EMA and have the same length (or width) in the second direction DR2, but the disclosure is not limited thereto. In an embodiment, the first, second, third, and fourth intermediate electrodes CTE1, CTE2, CTE3, and CTE4 may be disposed in only the emission area EMA of each sub-pixel and may not extend to the non-emission area NEA. In the case where the first, second, third, and fourth intermediate electrodes CTE1, CTE2, CTE3, and CTE4 are disposed in the emission area EMA of each sub-pixel without extending to the non-emission area NEA, the size (or the surface area) of the non-emission area NEA of each sub-pixel may be reduced so that the size (or the surface area) of the emission area EMA of the corresponding sub-pixel may be further increased. Consequently, the light output efficiency of each sub-pixel may be further enhanced.

The first electrode PE1 and the first intermediate electrode CTE1, along with the first light emitting elements LD1 electrically connected in parallel therebetween, may form the first series set SET1 of the corresponding sub-pixel (or each of the first, second, and third emission components EMU1, EMU2, and EMU3). The first intermediate electrode CTE1 and the second intermediate electrode CTE2, along with the second light emitting elements LD2 electrically connected in parallel therebetween, may form the second series set SET2 of the corresponding sub-pixel. The second intermediate electrode CTE2 and the third intermediate electrode CTE3, along with the third light emitting elements LD3 electrically connected in parallel therebetween, may form the third series set SET3 of the corresponding sub-pixel. The third intermediate electrode CTE3 and the fourth intermediate electrode CTE4, along with the fourth light emitting elements LD4 electrically connected in parallel therebetween, may form the fourth series set SET4 of the corresponding sub-pixel. The fourth intermediate electrode CTE4 and the second electrode PE2, along with the fifth light emitting elements LD5 electrically connected in parallel therebetween, may form the fifth series set SET5 of the corresponding sub-pixel. The first electrode PE1 may be an anode of the corresponding sub-pixel (or each of the first, second, and third emission component EMU1, EMU2, and EMU3), and the second electrode PE2 may be a cathode of the corresponding sub-pixel (or each of the first, second, and third emission component EMU1, EMU2, and EMU3).

Arranged in the first direction DR1 (or the horizontal direction) in each sub-pixel, the first electrode PE1, the first intermediate electrode CTE1, the second intermediate electrode CTE2, the third intermediate electrode CTE3, the fourth intermediate electrode CTE4, and the second electrode PE2, along with the light emitting elements LD disposed therebetween, may embody an emission component including first, second, third, fourth, and fifth series sets SET1, SET2, SET3, SET4, and SET5. For example, each of the first, second, and third emission components EMU1, EMU2, and EMU3 may include a first series set SET1, a second series set SET2, a third series set SET3, a fourth series set SET4, and a fifth series set SET5, which may be successively arranged in the horizontal direction (or the first direction DR1). In each of the first, second, and third emission components EMU1, EMU2, and EMU3, the surface area of the non-emission area NEA disposed between two series sets adjacent to each other may be reduced, so that the light output efficiency may be further enhanced, compared to that of an emission component including multiple series sets which may be arranged in the vertical direction.

The first electrode PE1 of the first sub-pixel SPX1 may be electrically connected to the first bridge pattern BRP1 through the first contactor CNT1. The first bridge pattern BRP1 may be electrically connected to the first upper electrode UE1 of the first pixel circuit PXC1 through the first via hole VIH1. The first electrode PE1 of the first sub-pixel SPX1 may be electrically connected to the first upper electrode UE1 through the first contactor CNT1, the first bridge pattern BRP1, and the first via hole VIH1.

The first electrode PE1 of the second sub-pixel SPX2 may be electrically connected to the second bridge pattern BRP2 through the second contactor CNT2. The second bridge pattern BRP2 may be electrically connected to the second upper electrode UE2 of the second pixel circuit PXC2 through the second via hole VIH2. The first electrode PE1 of the second sub-pixel SPX2 may be electrically connected to the second upper electrode UE2 through the second contactor CNT2, the second bridge pattern BRP2, and the second via hole VIH2.

The first electrode PE1 of the third sub-pixel SPX3 may be electrically connected to the third bridge pattern BRP3 through the third contactor CNT3. The third bridge pattern BRP3 may be electrically connected to the third upper electrode UE3 of the third pixel circuit PXC3 through the third via hole VIH3. The first electrode PE1 of the third sub-pixel SPX3 may be electrically connected to the third upper electrode UE3 through the third contactor CNT3, the third bridge pattern BRP3, and the third via hole VIH3.

The first electrode PE1 and the second electrode PE2 of each of the first, second, and third sub-pixels SPX1, SPX2, and SPX3 may be driving electrodes provided to drive the light emitting elements LD.

In each sub-pixel during each frame period, driving current may flow from the first electrode PE1 to the second electrode PE2 via the first light emitting element LD1, the first intermediate electrode CTE1, the second light emitting element LD2, the second intermediate electrode CTE2, the third light emitting element LD3, the third intermediate electrode CTE3, the fourth light emitting element LD4, the fourth intermediate electrode CTE4, and the fifth light emitting element LD5.

For example, in the case in which driving current flows from the first power line PL1 to the second power line PL2 by the first transistor T1 included in the first pixel circuit PXC1, the driving current may be drawn into the first emission component EMU1 through the first via hole VIH1. Driving current may be supplied to the first electrode PE1 through the first via hole VIH1. The driving current flows to the first intermediate electrode CTE1. Hence, in the first series set SET1, the first light emitting elements LD1 each may emit light at a luminance corresponding to current distributed to each first light emitting element LD1. Driving current that flows through the first intermediate electrode CTE1 may flow to the second intermediate electrode CTE2 via the second light emitting elements LD2. Hence, in the second series set SET2, the second light emitting elements LD2 each may emit light at a luminance corresponding to current distributed to each second light emitting element LD2. Driving current that flows through the second intermediate electrode CTE2 may flow to the third intermediate electrode CTE3 via the third light emitting elements LD3. Hence, in the third series set SET1, the third light emitting elements LD3 each may emit light at a luminance corresponding to current distributed to each third light emitting element LD3. Driving current that flows through the third intermediate electrode CTE3 may flow to the fourth intermediate electrode CTE4 via the fourth light emitting elements LD4. Hence, in the fourth series set SET4, the fourth light emitting elements LD4 each may emit light at a luminance corresponding to current distributed to each fourth light emitting element LD4. Driving current that flows through the fourth intermediate electrode CTE4 may flow to the second electrode PE2 via the fifth light emitting elements LD5. Hence, in the fifth series set SET5, the fifth light emitting elements LD5 each may emit light at a luminance corresponding to current distributed to each fifth light emitting element LD5. In this way, the driving current of the first sub-pixel SPX1 may flow successively via the first light emitting elements LD1 of the first series set SET1, the second light emitting elements LD2 of the second series set SET2, the third light emitting elements LD3 of the third series set SET3, the fourth light emitting elements LD4 of the fourth series set SET4, and the fifth light emitting elements LD5 of the fifth series set SET5. Therefore, the first sub-pixel SPX1 may emit light having a luminance corresponding to a data signal supplied during each frame period.

In an embodiment, the first contactor CNT1 may be located in an area in which the first bride pattern BRP1 and the first electrode PE1 of the first sub-pixel SPX1 overlap each other. The second contactor CNT2 may be located in an area in which the second bridge pattern BRP2 and the first electrode PE1 of the second sub-pixel SPX2 overlap each other. The third contactor CNT3 may be located in an area in which the third bridge pattern BRP3 and the first electrode PE1 of the third sub-pixel SPX3 overlap each other. In a plan view, the first contactor CNT1, the third contactor CNT3, and the second contactor CNT2 may be arranged in the second direction DR2 in the order listed. The foregoing arrangement order may be the same as the arrangement order of the first bridge pattern BRP1 (or the first upper electrode UE1), the third bridge pattern BRP3 (or the third upper electrode UE3), and the second bridge pattern BRP2 (or the second upper electrode UE2).

Each of the first, second, and the third contactors CNT1, CNT2, and CNT3 may be an anode contactor of the corresponding sub-pixel. The anode contactor may be a connection point at which the pixel circuit PXC of the pixel circuit layer PCL and the emission component of the display element layer DPL may be electrically connected to each other. The first contactor CNT1 may be a connection point at which the first upper electrode UE1 of the first pixel circuit PXC1 and the first electrode PE1 of the first emission component EMU1 may be connected to each other. The second contactor CNT2 may be a connection point at which the second upper electrode UE2 of the second pixel circuit PXC2 and the first electrode PE1 of the second emission component EMU2 may be electrically connected to each other. The third contactor CNT3 may be a connection point at which the third upper electrode UE3 of the third pixel circuit PXC3 and the first electrode PE1 of the third emission component EMU3 may be electrically connected to each other.

According to the foregoing embodiment, because each of the first, second, and third upper electrodes UE1, UE2, and UE3 do not overlap and may be spaced apart from the connection line CNL to which a signal, e.g., a scan signal and/or a control signal may be applied, parasitic capacitance may not be formed between each of the first, second, and third upper electrodes UE1, UE2, and UE3 and the connection line CNL. Therefore, a defect which may occur because of the parasitic capacitance may be prevented, so that the reliability of the pixel PXL may be enhanced.

According to the foregoing embodiment, the number of light emitting elements LD which may be aligned in an undesired area may be minimized or reduced by the vertical bank V_BNK1 which may be disposed between the first alignment electrode ALE1 and the second alignment electrode ALE2. Therefore, in the foregoing embodiment, removal of the light emitting elements LD from the corrected positions may be reduced, so that the number of valid light sources of the pixel PXL may be further increased, whereby the light output efficiency of the pixel PXL may be enhanced.

According to the foregoing embodiment, the second semiconductor layer 13 of the first light emitting element LD1, the second semiconductor layer 13 of the second light emitting element LD2, the second semiconductor layer 13 of the third light emitting element LD3, the second semiconductor layer 13 of the fourth light emitting element LD4, and the second semiconductor layer 13 of the fifth light emitting element LD5 may be oriented in the same direction so that the first, second, third, fourth, and fifth light emitting elements LD1, LD2, LD3, LD4, and LD5 may be more reliably electrically connected in series to each other.

According to the foregoing embodiment, because the first bank BNK1 may not be disposed between sub-pixels adjacent to each other in the second direction DR2, the ink supply surface area of each pixel PXL may be further increased. Hence, the amount of ink to be supplied to the corresponding pixel PXL may be increased, whereby the number of valid light sources of each pixel PXL may be further increased. Consequently, the light output efficiency of each pixel PXL may be further enhanced.

Hereinafter, the stacked structure of the pixel PXL in accordance with the foregoing embodiment will be described with reference to FIGS. 10 to 15.

Figure 10:
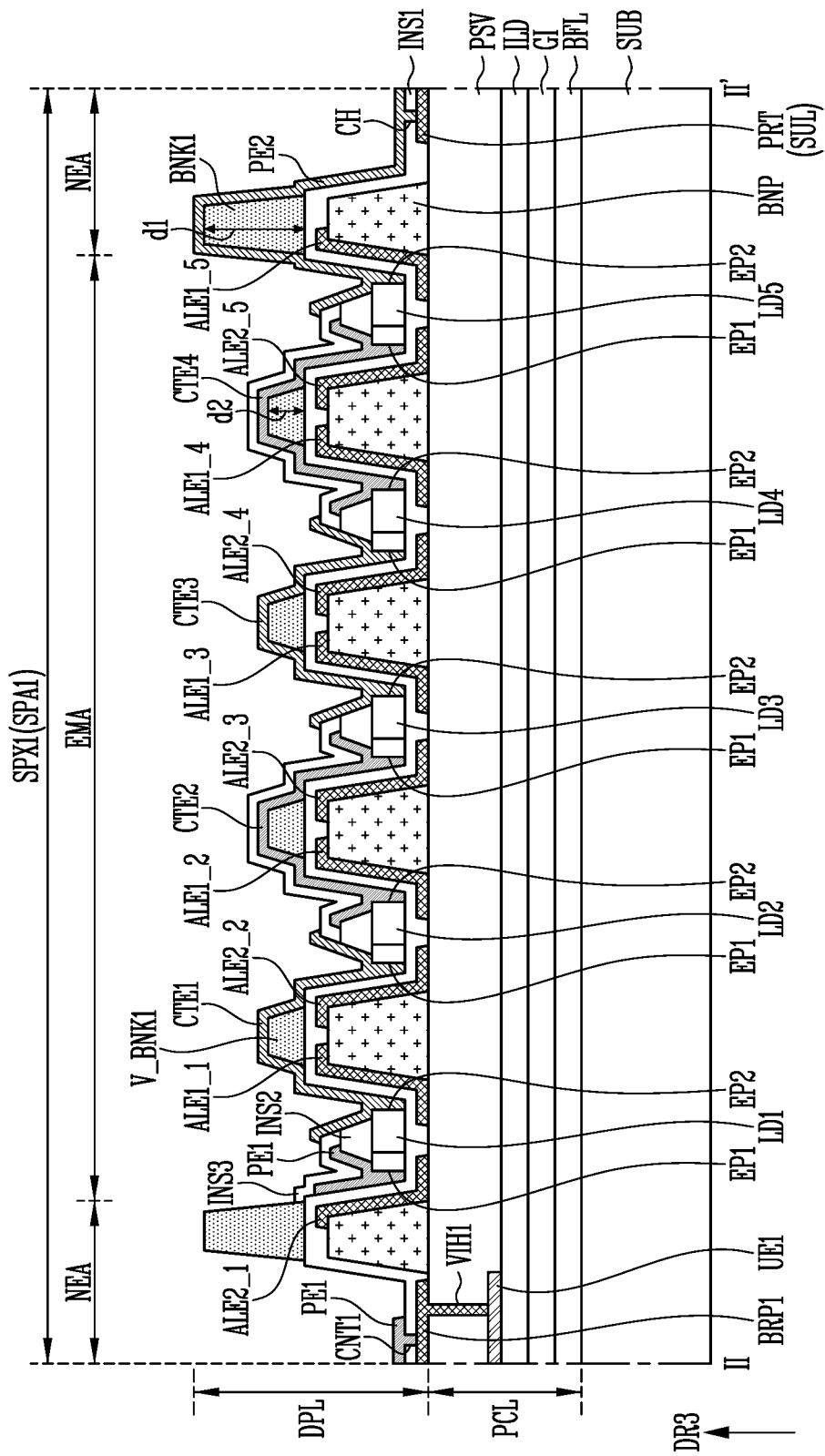
FIGS. 10 to 12 are schematic cross-sectional views taken along line II-II' of FIG. 7.
Figure 11:
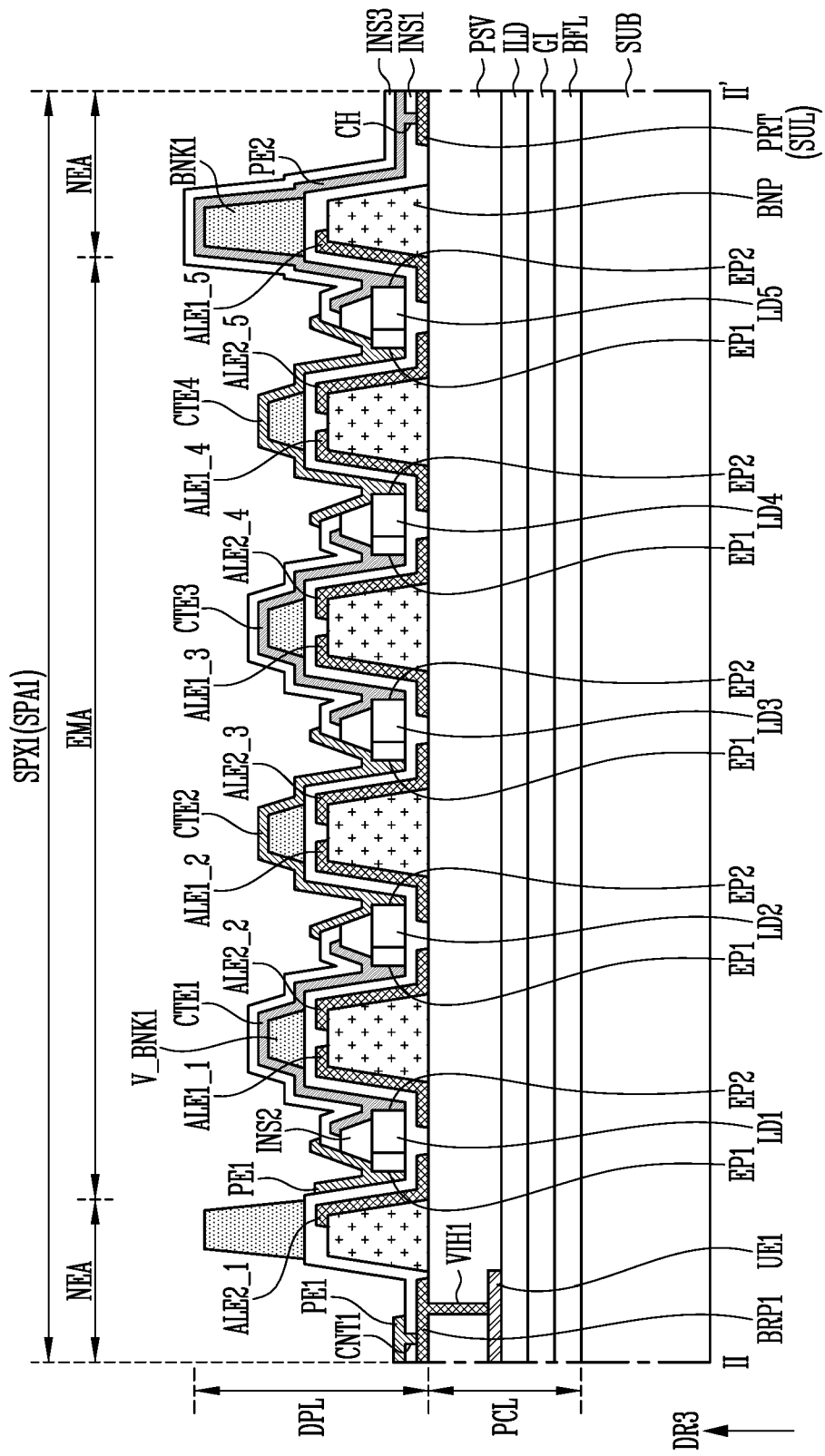
Figure 12:
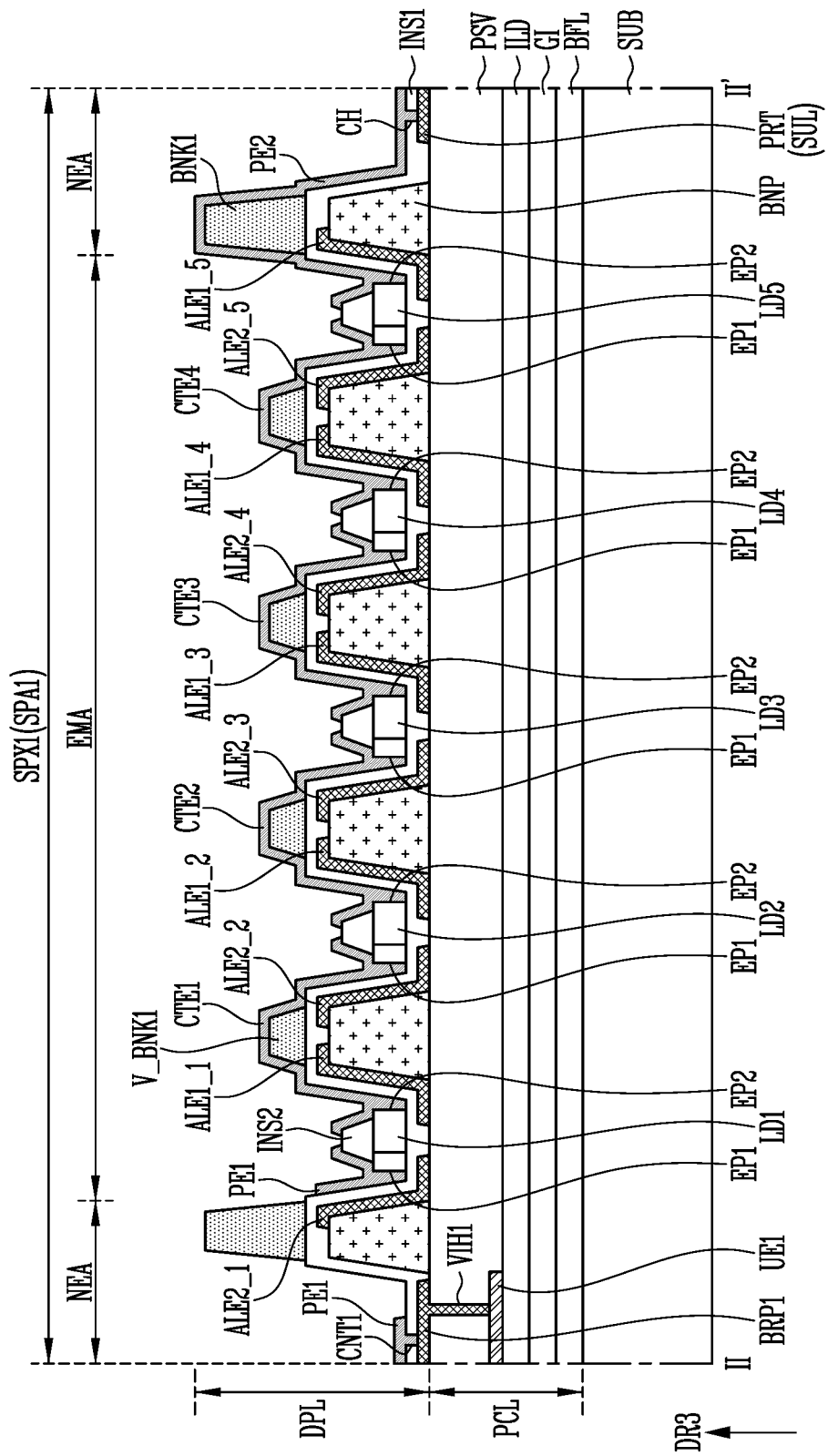
Figure 13:
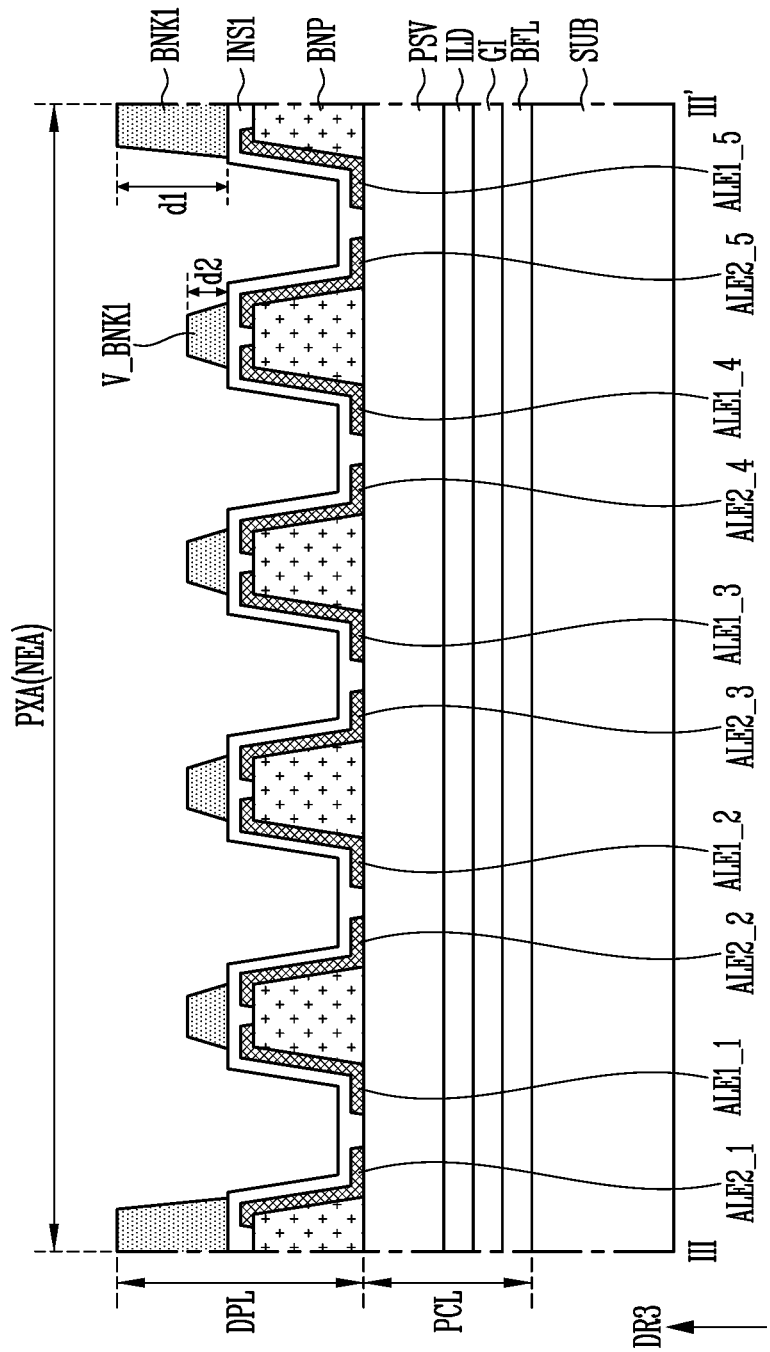
FIG. 13 is a schematic cross-sectional view taken along line III-III' of FIG. 7.
Figure 14:
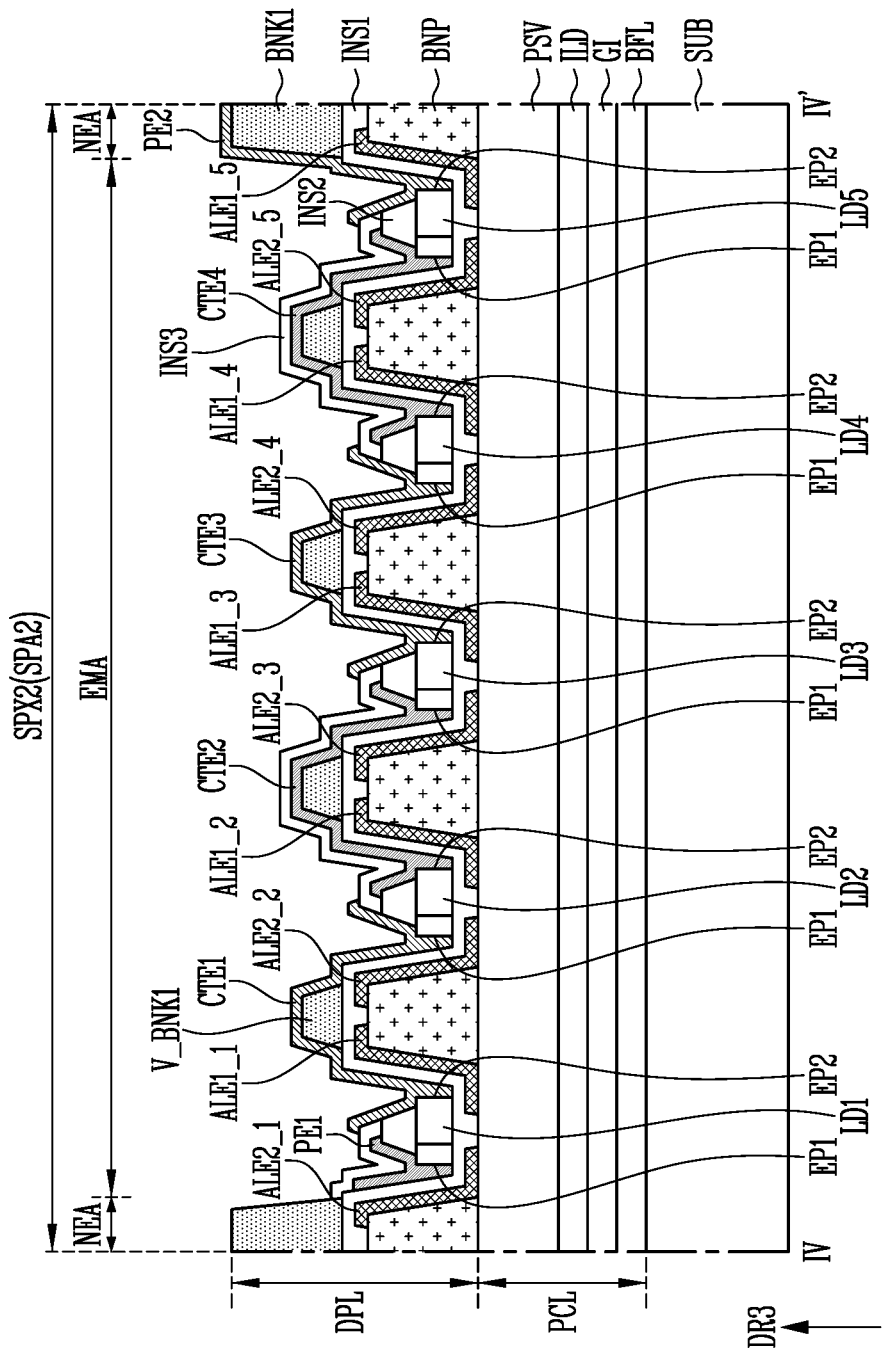
FIG. 14 is a schematic cross-sectional view taken along line IV-IV' of FIG. 7.
Figure 15:
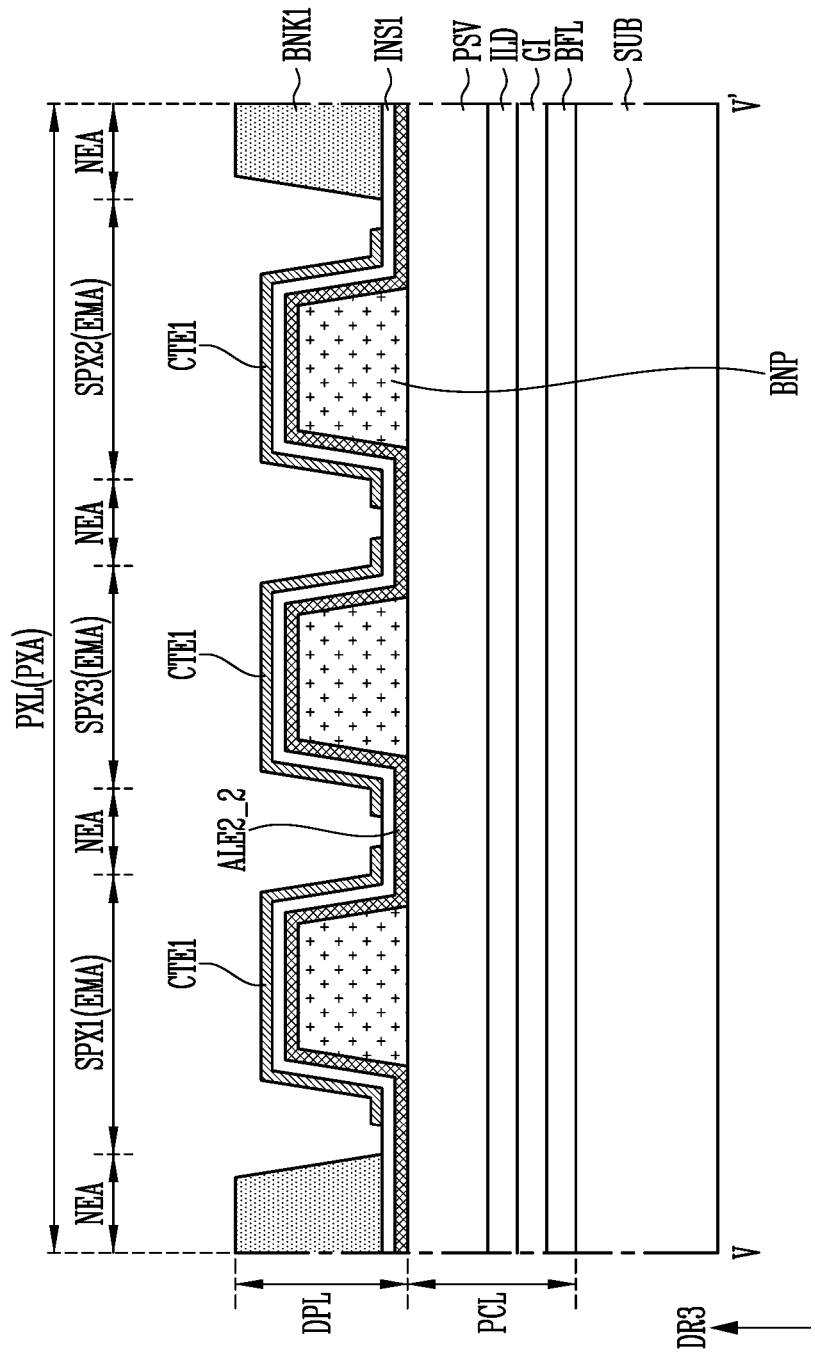
FIG. 15 is a schematic cross-sectional view taken along line V-V' of FIG. 7.

FIGS. 10 to 12 are schematic cross-sectional views taken along line II-II' of FIG. 7. FIG. 13 is a schematic cross-sectional view taken along line III-III' of FIG. 7. FIG. 14 is a schematic cross-sectional view taken along line IV-IV' of FIG. 7. FIG. 15 is a schematic cross-sectional view taken along line V-V' of FIG. 7.

The embodiments of FIGS. 11 and 12 illustrate modifications of the embodiment of FIG. 10 with regard to the step of forming the first and second electrodes PE1 and PE2 and the first to fourth intermediate electrodes CTE1, CTE2, CTE3, and CTE4 and whether the third insulating layer INS3 is present. For example, FIG. 11 illustrates an embodiment in which the first electrode PE1, the second intermediate electrode CTE2, and the fourth intermediate electrode CTE4 may be formed after the first intermediate electrode CTE1, the third intermediate electrode CTE3, the second electrode PE2, and the third insulating layer INS3 may be formed. FIG. 12 illustrates an embodiment in which the first and second electrodes PE1 and PE2 and the first to fourth intermediate electrodes CTE1, CTE2, CTE3, and CTE4 may be formed through the same process.

Although FIGS. 10 to 15 simply illustrate the pixel PXL, e.g., illustrating that each electrode is formed of a single electrode and each insulating layer is formed of a single insulating layer, the disclosure is not limited thereto.

The following description related to embodiments of FIGS. 10 to 15 will be focused on differences from the above-mentioned embodiments so as to avoid redundant description.

Referring to FIGS. 1 to 15, the pixel PXL may include a substrate SUB, a pixel circuit layer PCL, and a display element layer DPL.

The pixel circuit layer PCL and the display element layer DPL may be disposed on a surface of the substrate SUB and overlap each other. For example, the pixel area PXA of the substrate SUB may include the pixel circuit layer PCL disposed on a surface of the substrate SUB, and the display element layer DPL disposed on the pixel circuit layer PCL. The pixel circuit layer PCL may include a buffer layer BFL, a gate insulating layer GI, an interlayer insulating layer ILD, and a passivation layer PSV which may be successively stacked on the substrate SUB. The pixel circuit layer PCL may be the same as the pixel circuit layer PCL described with reference to FIGS. 5 and 6; therefore, detailed description thereof will be omitted.

The display element layer DPL may include first and second alignment electrodes ALE1 and ALE2, light emitting elements LD, first and second electrodes PE1 and PE2, and first to fourth intermediate electrodes CTE1, CTE2, CTE3, and CTE4.

The display element layer DPL may further include insulating patterns and/or insulating layers that may be successively disposed on a surface of the pixel circuit layer PCL. For example, the display element layer DPL may further include a bank pattern BNP, a first insulating layer INS1, a first bank BNK1, a second insulating layer INS2, and a third insulating layer INS3.

The bank pattern BNP may be provided and/or formed on the pixel circuit layer PCL.

The bank pattern BNP (referred also to as "support component", "wall pattern", or "wall structure") may be provided and/or formed on the passivation layer PSV of the pixel circuit layer PCL. In an embodiment, the bank pattern BNP may be formed of a separate pattern which may be individually disposed under each of the first and second alignment electrodes ALE1 and ALE2 such that the separate pattern overlaps a portion of a corresponding one of the first and second alignment electrodes ALE1 and ALE2.

The bank pattern BNP may be formed of a separate pattern which may be individually disposed under each of the 2-1-th alignment electrode ALE2_1 and the 1-5-th alignment electrode ALE1_5. The bank pattern BNP may be formed of a separate pattern which may be individually disposed under each of the 1-1-th and 2-2-th alignment electrodes ALE1_1 and ALE2_2, the 1-2-th and 2-3-th alignment electrodes ALE1_2 and ALE2_3, the 1-3-th and 2-4-th alignment electrodes ALE1_3 and ALE2_4, and the 1-4-th and 2-5-th alignment electrodes ALE1_4 and ALE2_5.

In an embodiment, the bank pattern BNP may be formed of an integrated pattern which have an opening or a concave portion corresponding to areas between the first and second alignment electrodes ALE1 and ALE2 in the emission area EMA and may be entirely integrally formed in the display area DA.

The bank pattern BNP may protrude in the third direction DR3 on a surface of the pixel circuit layer PCL. Hence, an area of each of the first and second alignment electrodes ALE1 and ALE2 disposed on the bank pattern BNP may protrude in the third direction DR3 (or the thickness direction of the substrate SUB).

The bank pattern BNP may be an inorganic insulating layer including inorganic material or an organic insulating layer including organic material. In an embodiment, the bank pattern BNP may include an organic layer having a single layer structure and/or an inorganic layer having a single layer structure, but the disclosure is not limited thereto. In an embodiment, the bank pattern BNP may be provided in the form of a multilayer structure formed by stacking at least one organic insulating layer and at least one inorganic insulating layer. However, the material of the bank pattern BNP is not limited to the foregoing embodiment. In an embodiment, the bank pattern BNP may include conductive material (or conductive substance). The shape of the bank pattern BNP may be changed in various ways within a range in which efficiency of light emitted from the light emitting element LD may be enhanced.

The bank pattern BNP may be used as a reflector. For example, the bank pattern BNP, along with the first alignment electrode ALE1 and the second alignment electrode ALE2 disposed thereover, may be used as a reflector which guides light emitted from the light emitting element LD in a desired direction so that the light output efficiency of each of the first, second, and third sub-pixels SPX1, SPX2, and SPX3 may be enhanced.

The first alignment electrode ALE1 and the second alignment electrode ALE2 may be provided and/or formed on the bank pattern BNP.

The first alignment electrode ALE1 and the second alignment electrode ALE2 may be provided and/or formed on the pixel circuit layer PCL (or the passivation layer PSV) and the bank pattern BNP.

The first alignment electrode ALE1 and the second alignment electrode ALE2 may be spaced apart from each other. The second alignment electrode ALE2 and the first alignment electrode ALE1 may be alternately arranged in a sequence of the 2-1-th alignment electrode ALE2_1, the 1-1-th alignment electrode ALE1_1, the 2-2-th alignment electrode ALE2_2, the 1-2-th alignment electrode ALE1_2, the 2-3-th alignment electrode ALE2_3, the 1-3-th alignment electrode ALE1_3, the 2-4-th alignment electrode ALE2_4, the 1-4-th alignment electrode ALE1_4, the 2-5-th alignment electrode ALE2_5, and the 1-5-th alignment electrode ALE1_5. The first alignment electrode ALE1 and the second alignment electrode ALE2 may be disposed on the same plane, and have the same thickness in the third direction DR3. The first alignment electrode ALE1 and the second alignment electrode ALE2 may be simultaneously formed through the same process, or be successively formed.

The first alignment electrode ALE1 and the second alignment electrode ALE2 each may have a shape corresponding to a profile of the bank pattern BNP disposed thereunder.

The first alignment electrode ALE1 and the second alignment electrode ALE2 each may be formed of material having a reflectivity (or a certain reflectivity) to allow light emitted from the light emitting elements LD to travel in an image display direction of the display device. For example, the first alignment electrode ALE1 and the second alignment electrode ALE2 each may be formed of conductive material (or substance). The conductive material may include opaque metal that may be suitable for reflecting, in the image display direction (or an upward direction of the display element layer DPL) of the display device, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and/or an alloy thereof. However, the material of the first alignment electrode ALE1 and the second alignment electrode ALE2 are not limited to the foregoing embodiment. In an embodiment, the first alignment electrode ALE1 and the second alignment electrode ALE2 each may include transparent conductive material (or substance). The transparent conductive material (or substance) may include transparent conductive oxides such as indium tin oxide (ITO), indium zinc oxide (IZO), zinc oxide ($ZnO_x$), indium gallium zinc oxide (IGZO), and indium tin zinc oxide (ITZO), and a conductive polymer such as PEDOT (poly(3,4-ethylenedioxythiophene)). In case that the first alignment electrode ALE1 and the second alignment electrode ALE2 each include transparent conductive material (or substance), a separate conductive layer formed of opaque metal for reflecting light emitted from the light emitting elements LD in the image display direction of the display device may be added. However, the material of the first alignment electrode ALE1 and the second alignment electrode ALE2 is not limited to the foregoing materials.

Although the first alignment electrode ALE1 and the second alignment electrode ALE2 each may be provided and/or formed in the form of a single layer structure, the disclosure is not limited thereto. In an embodiment, the first alignment electrode ALE1 and the second alignment electrode ALE2 each may be provided and/or formed to have a multilayer structure formed by stacking at least two materials among metals, alloys, conductive oxide, and conductive polymers. The first alignment electrode ALE1 and the second alignment electrode ALE2 each may be provided in the form of a multilayer structure including at least double layers to minimize a distortion due to a signal delay in case that signals are transmitted to the opposite ends EP1 and EP2 of the light emitting elements LD.

In case that the first alignment electrode ALE1 and the second alignment electrode ALE2 each are formed of conductive material having a reflectivity, light emitted from the opposite ends EP1 and EP2 of each of the light emitting elements LD may more reliably travel in the image display direction of the display device. For example, if the first alignment electrode ALE1 and the second alignment electrode ALE2 have inclined surfaces or curved surfaces that corresponds to the shape of the bank pattern BNP and are disposed to face the opposite ends EP1 and EP2 of each of the light emitting elements LD, light emitted from the opposite ends EP1 and EP2 of each of the light emitting elements LD may be reflected by the first alignment electrode ALE1 and the second alignment ALE2 and more reliably travel in the image display direction of the display device. Consequently, the efficiency of light emitted from the light emitting elements LD may be enhanced.

Each of the 1-1-th, 1-2-th, 1-3-th, 1-4-th, and 1-5-th alignment electrodes ALE1_1, ALE1_2, ALE1_3, ALE1_4, and ALE1_5 may be electrically connected to the first horizontal power line PL1$b$ through the corresponding fourth via hole VIH4. Hence, at the step of aligning the light emitting elements LD in the emission area EMA of each of the first, second, and third sub-pixels SPX1, SPX2, and SPX3, each of the 1-1-th, 1-2-th, 1-3-th, 1-4-th, and 1-5-th alignment electrodes ALE1_1, ALE1_2, ALE1_3, ALE1_4, and ALE1_5 may be supplied with a corresponding alignment signal from the first horizontal power line PL1$b$.

Each of the 2-1-th, 2-2-th, 2-3-th, 2-4-th, and 2-5-th alignment electrodes ALE2_1, ALE2_2, ALE2_3, ALE2_4, and ALE2_5 may be electrically connected to the second horizontal power line PL2$b$ through the corresponding fifth via hole VIH5. Hence, at the step of aligning the light emitting elements LD in the emission area EMA of each of the first, second, and third sub-pixels SPX1, SPX2, and SPX3, each of the 2-1-th, 2-2-th, 2-3-th, 2-4-th, and 2-5-th alignment electrodes ALE2_1, ALE2_2, ALE2_3, ALE2_4, and ALE2_5 may be supplied with a corresponding alignment signal from the second horizontal power line PL2$b$.

In an embodiment, the first bridge pattern BRP1, the second bridge pattern BRP2, and the third bridge pattern BRP3, and the auxiliary line SUL which may be spaced apart from the first and second alignment electrodes ALE1 and ALE2 may be disposed in the pixel area PXA in which the pixel PXL may be disposed. The first, second, and third bridge patterns BRP1, BRP2, and BRP3 and the auxiliary line SUL may be disposed on the same layer through the same process as the first and second alignment electrodes ALE1 and ALE2, and may have the same material as that of the first and second alignment electrodes ALE1 and ALE2.

The first bridge pattern BRP1 may be electrically connected to the first upper electrode UE1 of the first sub-pixel SPX1 through the first via hole VIH1 which passes through the passivation layer PSV. The first bridge pattern BRP1 may be electrically connected to the first electrode PE1 of the first sub-pixel SPX1 through the first contactor CNT1 which passes through the first insulating layer INS1.

The second bridge pattern BRP2 may be electrically connected to the second upper electrode UE2 of the second sub-pixel SPX2 through the second via hole VIH2 which passes through the passivation layer PSV. The second bridge pattern BRP2 may be electrically connected to the first electrode PE1 of the second sub-pixel SPX2 through the second contactor CNT2 which passes through the first insulating layer INS1.

The third bridge pattern BRP3 may be electrically connected to the third upper electrode UE3 of the third sub-pixel SPX3 through the third via hole VIH3 which passes through the passivation layer PSV. The third bridge pattern BRP3 may be electrically connected to the first electrode PE1 of the third sub-pixel SPX3 through the third contactor CNT3 which passes through the first insulating layer INS1.

The auxiliary line SUL may be electrically connected to the second horizontal power line PL2$b$ through the sixth via hole VIH6 which passes through the passivation layer PSV. The auxiliary line SUL may be electrically connected to the second electrode PE2 of each of the first, second, and third sub-pixels SPX1, SPX2, and SPX3 through the corresponding contact hole CH that passes through the first insulating layer INS1.

The first insulating layer INS1 may be disposed on the first and second alignment electrodes ALE1 and ALE2, the first to third bridge patterns BRP1 to BRP3, and the auxiliary line SUL.

The first insulating layer INS1 may be disposed on the overall surfaces of the first and second alignment electrodes ALE1 and ALE2, the first to third bridge patterns BRP1 to BRP3, and the auxiliary line SUL. The first insulating layer INS1 may be partially open in the non-emission area NEA so that components disposed thereunder may be exposed. For example, the first insulating layer INS1 may be partially open to include the first contactor CNT1 through which an area of the first bridge pattern BRP1 may be exposed, the second contactor CNT2 through which an area of the second bridge pattern BRP2 may be exposed, the third contactor CNT3 through which an area of the third bridge pattern BRP3 may be exposed, and a contact hole CH through which an area of the auxiliary line SUL (or the protrusion PRT) may be exposed.

The first insulating layer INS1 may be formed of an inorganic insulating layer made of inorganic material. For instance, the first insulating layer INS1 may include at least one of silicon nitride ($SiN_x$), silicon oxide ($SiO_x$), silicon oxynitride ($SiO_xN_y$), and aluminum oxide ($AlO_x$).

In an embodiment, the first insulating layer INS1 may be provided in the form of a single layer or multilayer structure. In case that the first insulating layer INS1 is provided in the form of a multilayer structure, the first insulating layer INS1 may have a distributed bragg reflector structure formed by alternately stacking first layers and second layers which may be formed of inorganic layers and have different refractive indexes.

The first bank BNK1 may be disposed on the first insulating layer INS1.

The first bank BNK1 may be provided and/or formed on the first insulating layer INS1 in the non-emission area NEA. The first bank BNK1 may enclose the emission area EMA of each pixel PXL. In an embodiment, the first bank BNK1 may include a vertical bank V_BNK1 disposed between the first alignment electrode ALE1 and the second alignment electrode ALE2 in at least the emission area EMA. The vertical bank V_BNK1 and the first bank BNK1 may have liquid repellency.

The vertical bank V_BNK1 may be a structure which covers an area between the first alignment electrode ALE1 and the second alignment electrode ALE2 and prevent the light emitting elements LD from being aligned in an undesired area, thus reducing removal of the light emitting elements LD from corrected positions thereof.

In an embodiment, the first bank BNK1 and the vertical bank V_BNK1 may have different thicknesses (or heights) in the third direction DR3. For example, a thickness d1 of the first bank BNK1 in the third direction DR3 may be greater than a thickness d2 of the vertical bank V_BNK1. The first bank BNK1 and the vertical bank V_BNK1 may be formed, using a halftone mask, to have different thicknesses. Because the vertical bank V_BNK1 may be designed to have the thickness d2 less than the thickness d1 of the first bank BNK1, the light emitting elements LD may be prevented from being aligned in an untargeted area (or an undesired area), for example, an area between the first alignment electrode ALE1 and the second alignment electrode ALE2, without affecting the amount of ink supplied to the pixel PXL (or the pixel area PXA).

The light emitting elements LD may be supplied to the emission area EMA of each of the first, second, and third sub-pixels SPX1, SPX2, and SPX3. For example, the light emitting elements LD may be supplied (or inputted) to the emission area EMA in an inkjet printing scheme or the like. The light emitting elements LD may be aligned on a surface of the first insulating layer INS1 disposed in the area between the second alignment electrode ALE2 and the first alignment electrode ALE1 by an electric field formed by signals (or alignment signals) that may be respectively applied to the first alignment electrode ALE1 and the second alignment electrode ALE2. For instance, the light emitting elements LD supplied to the emission area EMA may be arranged such that the first ends EP1 face the second alignment electrode ALE2, and the second ends EP2 face the first alignment electrodes ALE1.

The light emitting elements LD may include a first light emitting element LD1, a second light emitting element LD2, a third light emitting element LD3, a fourth light emitting element LD4, and a fifth light emitting element LD5.

The second insulating layer INS2 (or an insulating pattern) may be disposed on each of the first, second, third, fourth, and fifth light emitting elements LD1, LD2, LD3, LD4, and LD5. The second insulating layer INS2 may be disposed on each of the first, second, third, fourth, and fifth light emitting elements LD1, LD2, LD3, LD4, and LD5, and partially cover an outer circumferential surface (or a surface) of each of the first, second, third, fourth, and fifth light emitting elements LD1, LD2, LD3, LD4, and LD5 such that the first end EP1 and the second end EP2 of each of the first, second, third, fourth, and fifth light emitting elements LD1, LD2, LD3, LD4, and LD5 may be exposed to the outside.

The second insulating layer INS2 may include an inorganic insulating layer including inorganic material, or an organic insulating layer. For example, the second insulating layer INS2 may include an inorganic insulating layer suitable for protecting the active layer 12 of each of the first, second, third, fourth, and fifth light emitting elements LD1, LD2, LD3, LD4, and LD5 from external oxygen, water, or the like. However, the disclosure is not limited thereto. The second insulating layer INS2 may be formed of an organic insulating layer including organic material, depending on design conditions, etc. of the display device to which the first, second, third, fourth, and fifth light emitting elements LD1, LD2, LD3, LD4, and LD5 may be applied. The second insulating layer INS2 may be formed of a single layer or multiple layers.

In case that a gap (or space) is present between the first insulating layer INS1 and the light emitting elements LD before the formation of the second insulating layer INS2, the gap may be filled with the second insulating layer INS2 during a process of forming the second insulating layer INS2.

Because the second insulating layer INS2 may be formed on the first, second, third, fourth, and fifth light emitting elements LD1, LD2, LD3, LD4, and LD5 that may be completely aligned in the emission area EMA of each of the first, second, and third sub-pixels SPX1, SPX2, and SPX3, the first, second, third, fourth, and fifth light emitting elements LD1, LD2, LD3, LD4, and LD5 may be prevented from being removed from aligned positions.

Different electrodes among the first electrode PE1 (or the first pixel electrode), the second electrode PE2 (or the second pixel electrode), and the intermediate electrodes CTE may be formed on the opposite ends of the first, second, third, fourth, and fifth light emitting elements LD1, LD2, LD3, LD4, and LD5, e.g., the first and second ends EP1 and EP2, which may not be covered with the second insulating layer INS2. For example, the first electrode PE1 may be formed on the first end EP1 of the first light emitting element LD1. The first intermediate electrode CTE1 may be formed on the second end EP2 of the first light emitting element LD1. The first intermediate electrode CTE1 may be formed on the first end EP1 of the second light emitting element LD2. The second intermediate electrode CTE2 may be formed on the second end EP2 of the second light emitting element LD2. The second intermediate electrode CTE2 may be formed on the first end EP1 of the third light emitting element LD3. The third intermediate electrode CTE3 may be formed on the second end EP2 of the third light emitting element LD3. The third intermediate electrode CTE3 may be formed on the first end EP1 of the second light emitting element LD4. The fourth intermediate electrode CTE4 may be formed on the second end EP2 of the fourth light emitting element LD4. The fourth intermediate electrode CTE4 may be formed on the first end EP1 of the fifth light emitting element LD5. The second electrode PE2 may be formed on the second end EP2 of the fifth light emitting element LD5.

The first electrode PE1 may be disposed over the 2-1-th alignment electrode ALE2_1 and overlap the 2-1-th alignment electrode ALE2_1. Furthermore, the first electrode PE1 may be disposed over the corresponding bridge pattern BRP and overlap the corresponding bridge pattern BRP. The first electrode PE1 of the first sub-pixel SPX1 may be electrically connected to the first bridge pattern BRP1 through the first contactor CNT1. The first electrode PE1 of the second sub-pixel SPX2 may be electrically connected to the second bridge pattern BRP2 through the second contactor CNT2. The first electrode PE1 of the third sub-pixel SPX3 may be electrically connected to the third bridge pattern BRP3 through the third contactor CNT3.

The second electrode PE2 may be disposed over the 1-5-th alignment electrode ALE1_5 and overlap the 1-5-th alignment electrode ALE1_5. Furthermore, the second electrode PE2 may be disposed over the auxiliary line SUL and overlap an area of the auxiliary line SUL. The second electrode PE2 may be electrically connected to the auxiliary line SUL through the contact hole CH.

The first intermediate electrode CTE1 may be disposed over each of the 1-1-th alignment electrode ALE1_1 and the 2-2-th alignment electrode ALE2_2 and overlap each of the 1-1-th alignment electrode ALE1_1 and the 2-2-th alignment electrode ALE2_2. The second intermediate electrode CTE2 may be disposed over each of the 1-2-th alignment electrode ALE1_2 and the 2-3-th alignment electrode ALE2_3 and overlap each of the 1-2-th alignment electrode ALE1_2 and the 2-3-th alignment electrode ALE2_3. The third intermediate electrode CTE3 may be disposed over each of the 1-3-th alignment electrode ALE1_3 and the 2-4-th alignment electrode ALE2_4 and overlap each of the 1-3-th alignment electrode ALE1_3 and the 2-4-th alignment electrode ALE2_4. The fourth intermediate electrode CTE4 may be disposed over each of the 1-4-th alignment electrode ALE1_4 and the 2-5-th alignment electrode ALE2_5 and overlap each of the 1-4-th alignment electrode ALE1_4 and the 2-5-th alignment electrode ALE2_5.

In an embodiment, the first electrode PE1, the first intermediate electrode CTE1, the second intermediate electrode CTE2, the third intermediate electrode CTE3, the fourth intermediate electrode CTE4, and the second electrode PE2 may be formed on the same layer or different layers. For example, relative positions and/or a formation sequence of the first electrode PE1, the first intermediate electrode CTE1, the second intermediate electrode CTE2, the third intermediate electrode CTE3, the fourth intermediate electrode CTE4, and the second electrode PE2 may be changed in various ways.

In an embodiment of FIG. 10, the first electrode PE1, the second intermediate electrode CTE2, and the fourth intermediate electrode CTE4 may be first formed on the second insulating layer INS2. The first electrode PE1 may contact (e.g., directly contact) the first end EP1 of the first light emitting element LD1. The second intermediate electrode CTE2 may contact (e.g., directly contact) the second end EP2 of the second light emitting element LD2 and the first end EP1 of the third light emitting element LD3 and be connected between the second light emitting element LD2 and the third light emitting element LD3. The fourth intermediate electrode CTE4 may contact (e.g., directly contact) the second end EP2 of the fourth light emitting element LD4 and the first end EP1 of the fifth light emitting element LD5 and be connected between the fourth light emitting element LD4 and the fifth light emitting element LD5. Thereafter, the third insulating layer INS3 may be formed in the emission area EMA to cover the first electrode PE1, the second intermediate electrode CTE2, and the fourth intermediate electrode CTE4. The first electrode PE1, the second intermediate electrode CTE2, and the fourth intermediate electrode CTE4 may be simultaneously or successively formed.

The third insulating layer INS3 may be disposed on the first electrode PE1, the second intermediate electrode CTE2, and the fourth intermediate electrode CTE4 and cover the first electrode PE1, the second intermediate electrode CTE2, and the fourth intermediate electrode CTE4 (or prevent the first electrode PE1, the second intermediate electrode CTE2, and the fourth intermediate electrode CTE4 from being exposed to the outside), thus preventing corrosion or the like of the first electrode PE1, the second intermediate electrode CTE2, and the fourth intermediate electrode CTE4.

The third insulating layer INS3 may be formed of an inorganic insulating layer including inorganic material, or an organic insulating layer including organic material. For example, the third insulating layer INS3 may include at least one of silicon nitride $SiN_x$, silicon oxide $(SiO_x)$, silicon oxynitride $(SiO_xN_y)$, and aluminum oxide $(AlO_x)$, but the disclosure is not limited thereto. The third insulating layer INS3 may be formed of a single layer or multiple layers.

The first intermediate electrode CTE1, the third intermediate electrode CTE3, and the second electrode PE2 may be formed on the third insulating layer INS3. The second electrode PE2 may contact (e.g., directly contact) the second end EP2 of the fifth light emitting element LD5. The first intermediate electrode CTE1 may contact (e.g., directly contact) the second end EP2 of the first light emitting element LD1 and the first end EP1 of the second light emitting element LD2 and thus be connected between the first light emitting element LD1 and the second light emitting element LD2. The third intermediate electrode CTE3 may contact (e.g., directly contact) the second end EP2 of the third light emitting element LD3 and the first end EP1 of the fourth light emitting element LD4 and thus be connected between the third light emitting element LD3 and the fourth light emitting element LD4. The first intermediate electrode CTE1, the third intermediate electrode CTE3, and the second electrode PE2 may be simultaneously or successively formed.

In an embodiment of FIG. 11, the first intermediate electrode CTE1, the third intermediate electrode CTE3, and the second electrode PE2 may be first formed on the second insulating layer INS2. The first intermediate electrode CTE1, the third intermediate electrode CTE3, and the second electrode PE2 may be simultaneously or successively formed. Thereafter, the third insulating layer INS3 may be formed to cover the first intermediate electrode CTE1, the third intermediate electrode CTE3, and the second electrode PE2. The first electrode PE1, the second intermediate electrode CTE2, and the fourth intermediate electrode CTE4 may be formed in the emission area EMA in which the third insulating layer INS3 may be formed.

In the case in which, as illustrated in the embodiments of FIGS. 10 and 11, the electrodes that may be disposed on the respective first ends EP1 and the respective second ends EP2 of the first, second, third, fourth, and fifth light emitting elements LD1, LD2, LD3, LD4, and LD5 may be disposed on different layers, the electrodes may be reliably electrically separated from each other so that a short circuit between the electrodes may be prevented from occurring.

In an embodiment of FIG. 12, the first electrode PE1, the first intermediate electrode CTE1, the second intermediate electrode CTE2, the third intermediate electrode CTE3, the fourth intermediate electrode CTE4, and the second electrode PE2 may be formed on the same layer as the display element layer DPL, and be simultaneously or successively formed. The third insulating layer INS3 may be omitted. In an embodiment of FIG. 12, in the case in which the electrodes that may be disposed on the respective first ends EP1 and the respective second ends EP2 of the first, second, third, fourth, and fifth light emitting elements LD1, LD2, LD3, LD4, and LD5 are disposed on the same layer and are simultaneously formed, a process of fabricating the first sub-pixel SPX1 may be simplified, and the process efficiency may be enhanced. The third insulating layer INS3 may be omitted.

The first electrode PE1, the first intermediate electrode CTE1, the second intermediate electrode CTE2, the third intermediate electrode CTE3, the fourth intermediate electrode CTE4, and the second electrode PE2 may be formed of various transparent conductive materials to allow light emitted from each of the light emitting elements LD to travel in an image display direction (e.g., the third direction DR3) of the display device without loss. For example, the first electrode PE1 the first intermediate electrode CTE1, the second intermediate electrode CTE2, the third intermediate electrode CTE3, the fourth intermediate electrode CTE4, and the second electrode PE2 may include at least one of various transparent conductive materials including indium tin oxide (ITO), indium zinc oxide (IZO), zinc oxide (ZnO$_x$), indium gallium zinc oxide (IGZO), and indium tin zinc oxide (ITZO), and be substantially transparent or translucent to satisfy a transmittancy (or transmittance). However, the materials of the first electrode PE1 the first intermediate electrode CTE1, the second intermediate electrode CTE2, the third intermediate electrode CTE3, the fourth intermediate electrode CTE4, and the second electrode PE2 are not limited to the foregoing embodiment. In an embodiment, the first electrode PE1 the first intermediate electrode CTE1, the second intermediate electrode CTE2, the third intermediate electrode CTE3, the fourth intermediate electrode CTE4, and the second electrode PE2 may be formed of various opaque conductive materials (or substances). The first electrode PE1, the first intermediate electrode CTE1, the second intermediate electrode CTE2, the third intermediate electrode CTE3, the fourth intermediate electrode CTE4, and the second electrode PE2 each may be formed of a single layer or multiple layers.

In an embodiment, at least one overcoat layer (e.g., a layer for planarizing the upper surface of the display element layer DPL) may be further disposed over the first electrode PE1, the first intermediate electrode CTE1, the second intermediate electrode CTE2, the third intermediate electrode CTE3, the fourth intermediate electrode CTE4, and the second electrode PE2.

In an embodiment, an optical layer may be selectively disposed over the display element layer DPL of the pixel PXL. For example, the optical layer may further include a color conversion layer including color conversion particles for converting the color of light emitted from the light emitting elements LD to a specific color of light.

Figure 16:
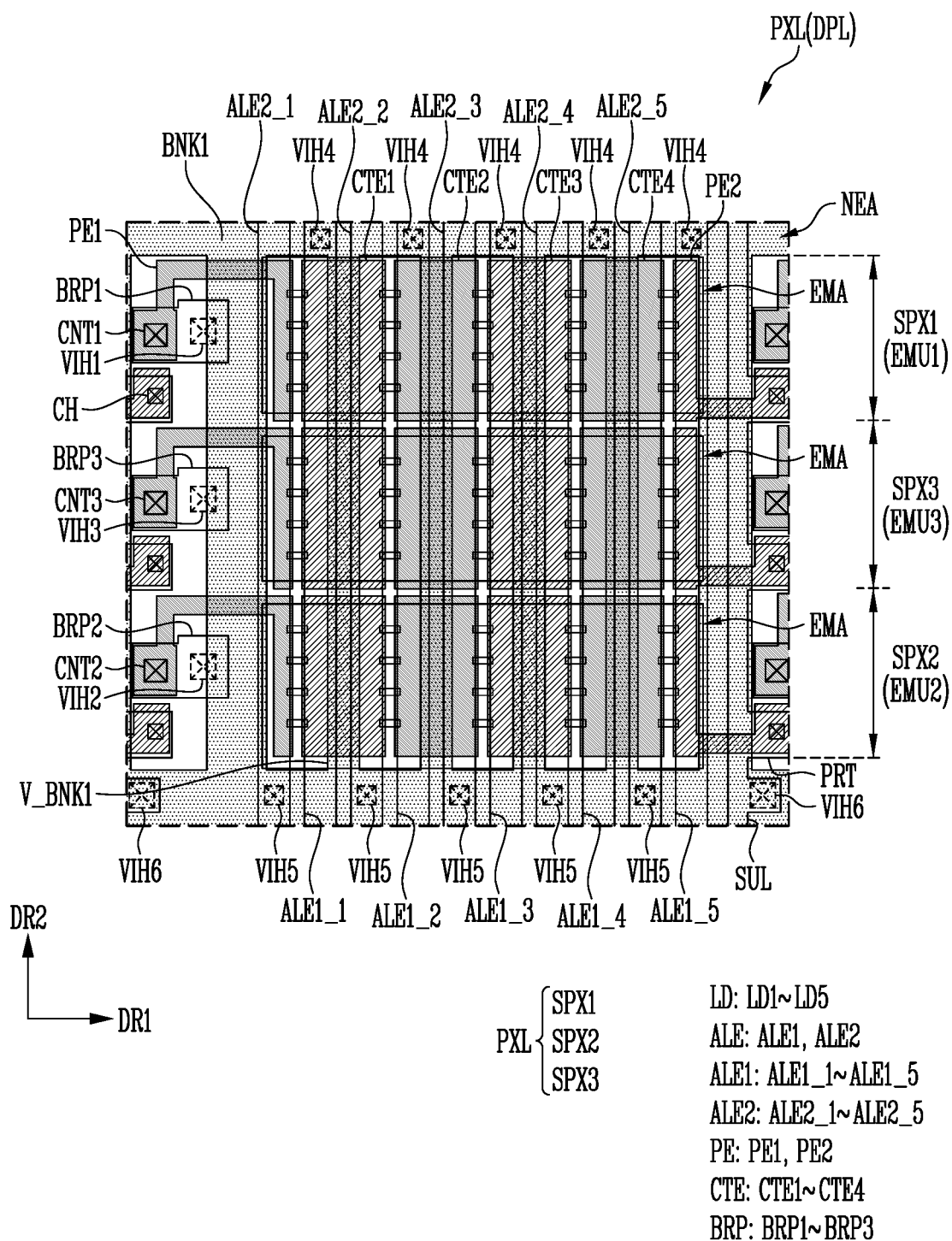
FIG. 16 is a schematic plan view illustrating a display element layer of a pixel in accordance with an embodiment.

FIG. 16 is a plan view schematically illustrating the display element layer DPL of the pixel PXL in accordance with an embodiment.

FIG. 16 illustrates a modification of the embodiment of FIG. 7 with regard to the alignment electrodes ALE, the emission area EMA, and the like. With regard to the embodiment of FIG. 16, the following description will be focused on differences from that of the foregoing embodiments, to avoid redundant explanation.

Referring to FIGS. 1 to 6, and 16, the display element layer DPL of the pixel PXL may include a first alignment electrode ALE1 and a second alignment electrode ALE2 which extend in the second direction DR2.

The first alignment electrode ALE1 and the second alignment electrode ALE2 each may be electrically connected to alignment electrodes ALE provided in pixels PXL adjacent thereto in the second direction DR2. For example, the first alignment electrode ALE1 may be electrically connected to first alignment electrodes ALE1 provided in the pixels PXL adjacent thereto in the second direction DR2. The second alignment electrode ALE2 may be electrically connected to second alignment electrodes ALE2 provided in the pixels PXL adjacent thereto in the second direction DR2.

In an embodiment, the first alignment electrode ALE1 and the second alignment electrode ALE2 may be used as only alignment lines for aligning the light emitting elements LD. The first electrode PE1 and the second electrode PE2 may be electrically separated or disconnected from the first and second alignment electrodes ALE1 and ALE2 and be used as driving electrodes for driving the light emitting elements LD. Because the alignment lines (or the first and second alignment electrodes ALE1 and ALE2) for aligning the light emitting elements LD may be separated from the driving electrodes (or the first and second electrodes PE1 and PE2) for driving the light emitting elements LD, the alignment electrodes ALE provided in the pixels PXL adjacent to each other in the second direction DR2 may not affect the operation of the light emitting elements LD in each pixel PXL even if the alignment electrodes ALE provided in the adjacent pixels PXL may be electrically and/or physically connected to each other.

Hence, the electrode separation area (refer to "ESA" of FIG. 7) provided to individually drive the pixels PXL may be omitted. In the case in which the electrode separation area ESA is omitted, the size (or the surface area) of the emission area EMA in each of the first, second, and third sub-pixels SPX1, SPX2, and SPX3 may be increased, so that the amount of ink to be supplied to each sub-pixel may be increased, and the number of valid light sources in each sub-pixel (or each pixel PXL) may be increased, whereby the light output efficiency may be further enhanced.

Figure 17:
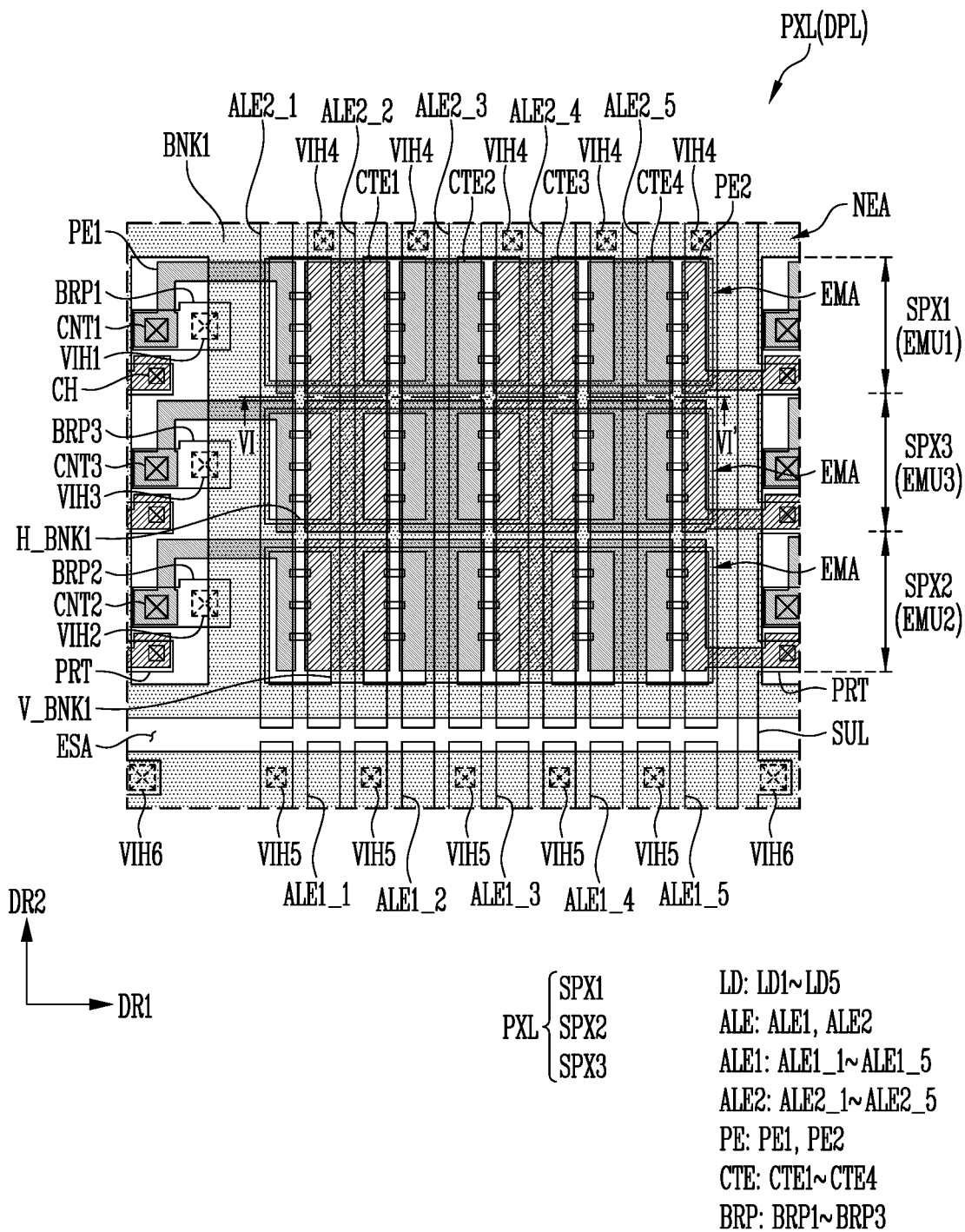
FIG. 17 is a schematic plan view illustrating a display element layer of a pixel in accordance with an embodiment.
Figure 18:
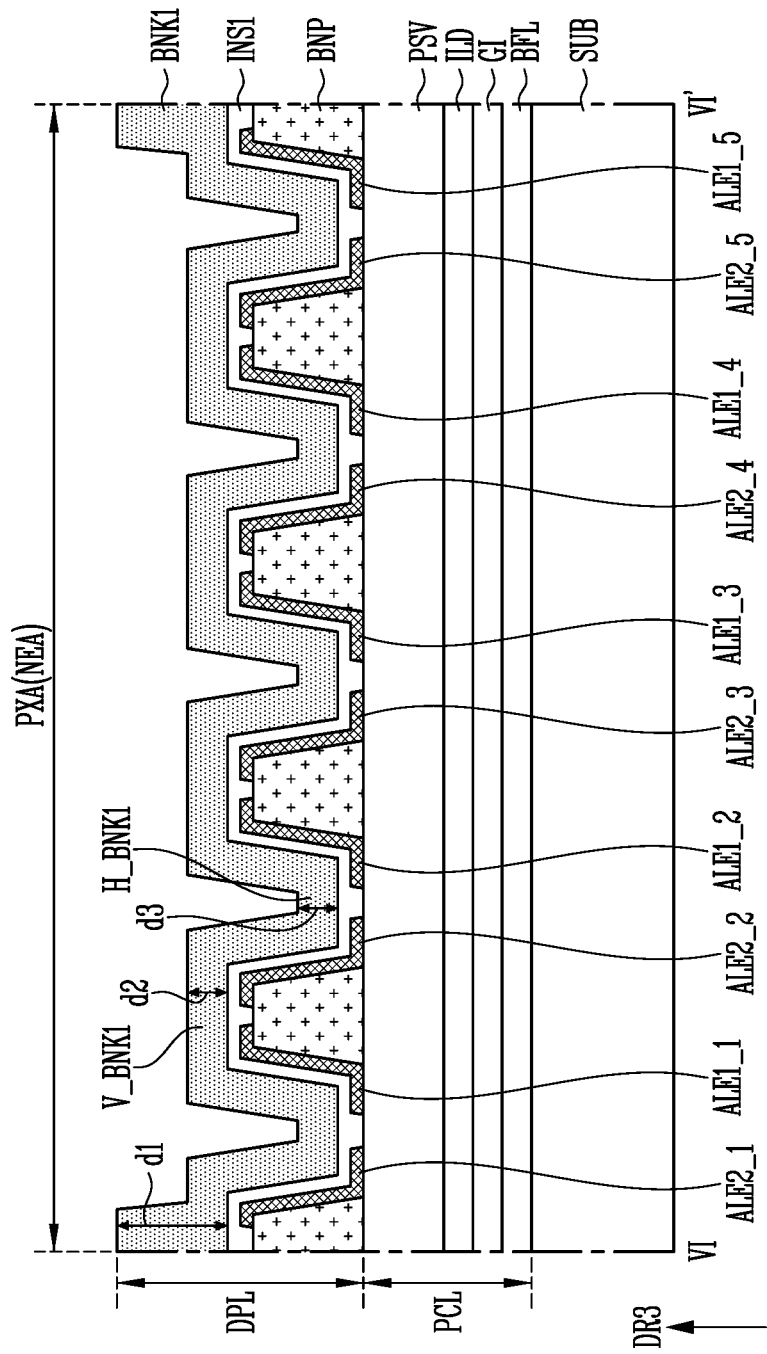
FIG. 18 is a schematic cross-sectional view taken along line VI-VI' of FIG. 17.

FIG. 17 is a schematic plan view illustrating the display element layer DPL of the pixel PXL in accordance with an embodiment. FIG. 18 is a schematic cross-sectional view taken along line VI-VI' of FIG. 17.

FIG. 17 illustrates a modification of the embodiment of FIG. 7 with regard to the first bank BNK1 or the like. The description of the embodiment of FIGS. 17 and 18 will be focused on differences from the above-mentioned embodiments so as to avoid redundant description.

Referring to FIGS. 1 to 6, 17, and 18, the display element layer DPL of the pixel PXL may include a first bank BNK1 disposed in the non-emission area NEA.

In an embodiment, the first bank BNK1 may include a vertical bank V_BNK1 which extends in the second direction DR2, and a first horizontal bank H_BNK1 which extends in the first direction DR1 and intersects the vertical bank V_BNK1.

The vertical bank V_BNK1 may be a structure which may be disposed between the first alignment electrode ALE1 and the second alignment electrode ALE2 in the emission area EMA of each sub-pixel and prevents the light emitting elements LD from being aligned in an undesired area.

The first horizontal bank H_BNK1 may be a structure which may be disposed between sub-pixels adjacent to each other in the second direction DR2 and defines the respective emission areas EMA of the adjacent sub-pixels. For example, the first horizontal bank H_BNK1 may be a pixel defining layer which defines the emission area EMA of the first sub-pixel SPX1, the emission area EMA of the second sub-pixel SPXL2, and the emission area EMA of the third sub-pixel SPX3. The first horizontal bank H_BNK1 may define a position to which light emitting elements LD may be to be supplied, during a process of supplying the light emitting elements LD to each of the first, second, and third sub-pixels SPX1, SPX2, and SPX3. For example, the emission area EMA of each of the first, second, and third sub-pixels SPX1, SPX2, and SPX3 may be partitioned (or defined) by the first horizontal bank H_BNK1, so that ink including a desired amount and/or kind of light emitting elements LD may be supplied to the corresponding emission area EMA.

In an embodiment, each of the first bank BNK1, the vertical bank V_BNK1, and the first horizontal bank H_BNK1 may have a certain thickness in the third direction DR3. For example, the first bank BNK1 may have a first thickness d1 in the third direction DR3. The vertical bank V_BNK1 may have a second thickness d2 less than the first thickness d1 in the third direction DR3. The first horizontal bank H_BNK1 may have a third thickness d3 less than the first thickness d2 in the third direction DR3. The second thickness d2 and the third thickness d3 may have the same as each other, but the disclosure is not limited thereto.

The first bank BNK1 including the vertical bank V_BNK1 and the first horizontal bank H_BNK1 may be formed using a halftone mask. Because the vertical bank V_BNK1 may be designed to have the thickness d2 less than that of the first bank BNK1, the light emitting elements LD may be prevented from being aligned in an untargeted area (or an undesired area), for example, an area between the first alignment electrode ALE1 and the second alignment electrode ALE2, without affecting the amount of ink supplied to the pixel PXL (or the pixel area PXA). As the first horizontal bank H_BNK1 having a thickness d3 less than that of the first bank BNK1 may be disposed between sub-pixels adjacent to each other in the second direction DR2, the emission area EMA of each of the first, second, and third sub-pixels SPX1, SPX2, and SPX3 may be defined.

Figure 19:
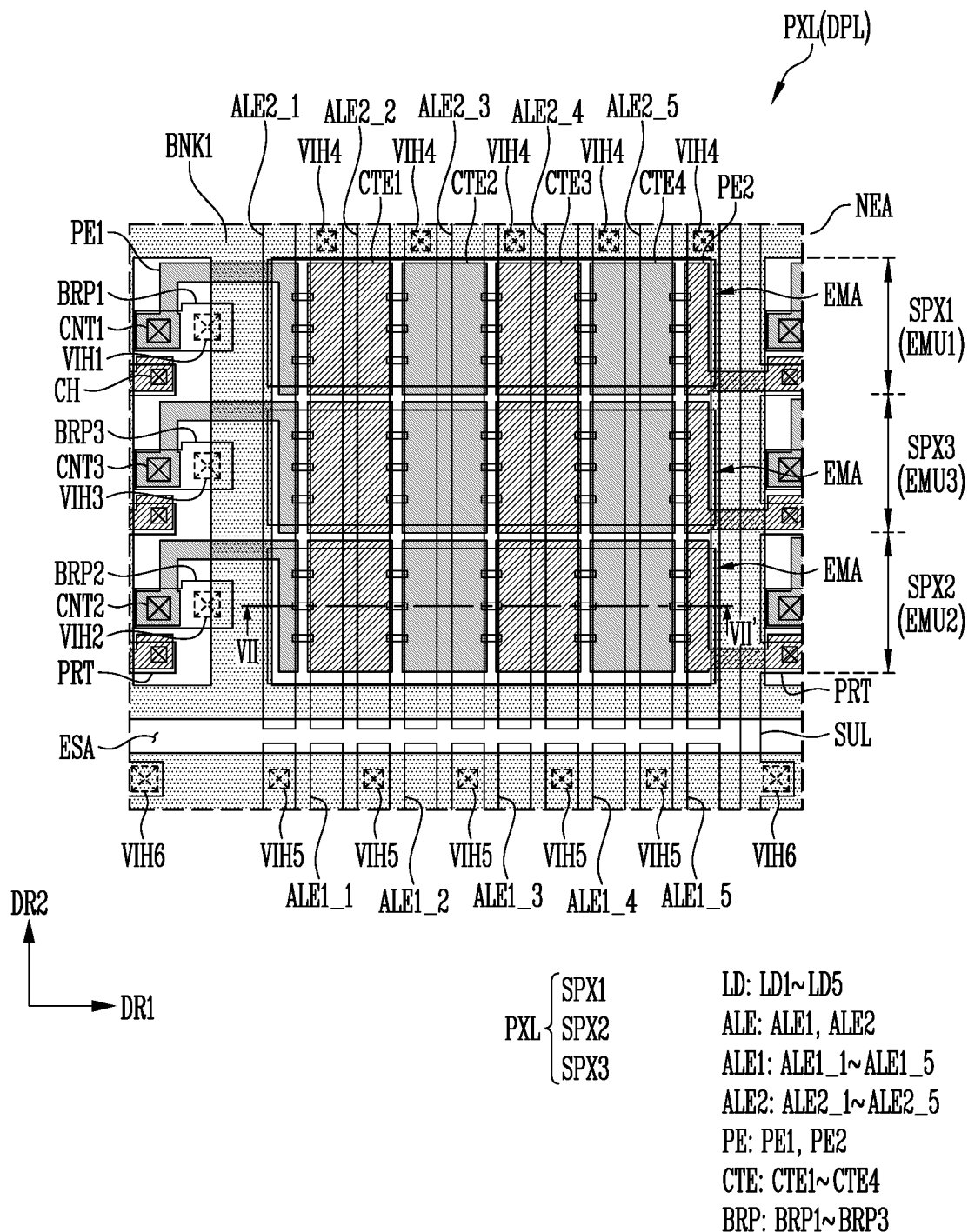
FIG. 19 is a schematic plan view illustrating a display element layer of a pixel in accordance with an embodiment.
Figure 20:
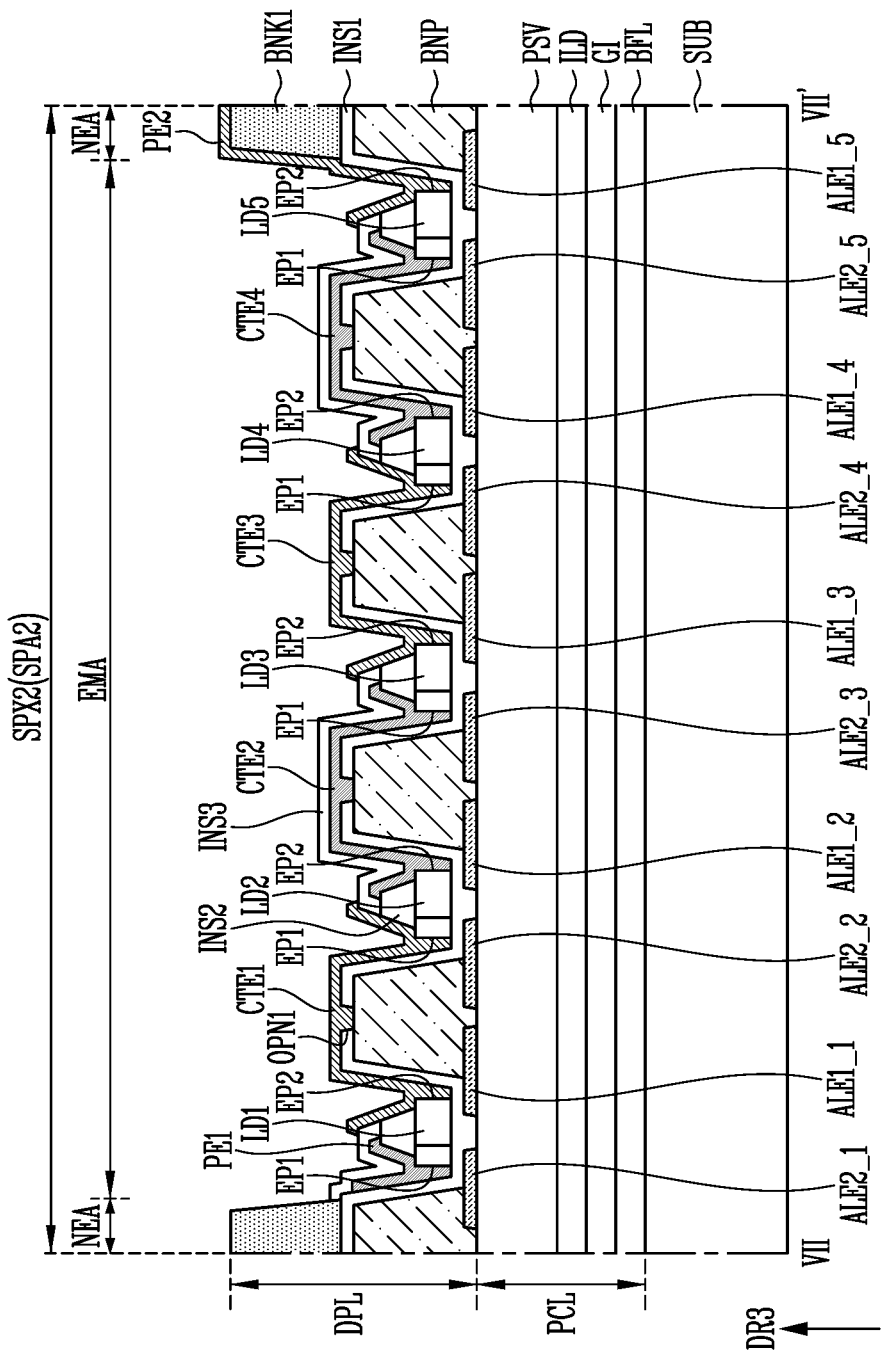
FIGS. 20 and 21 are schematic cross-sectional views taken along line VII-VII' of FIG. 19.
Figure 21:
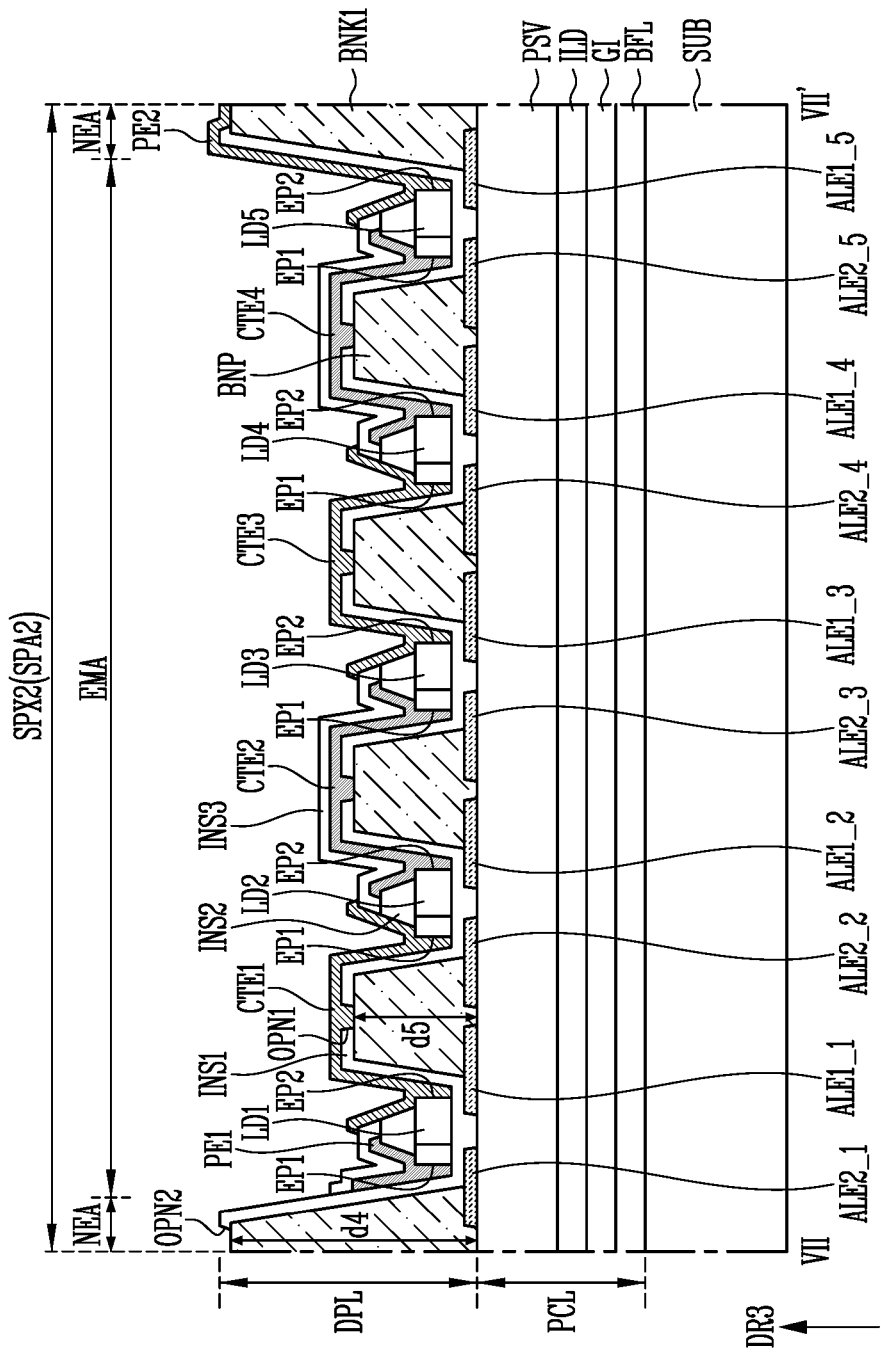

FIG. 19 is a schematic plan view illustrating the display element layer DPL of the pixel PXL in accordance with an embodiment. FIGS. 20 and 21 are schematic cross-sectional views taken along line VII-VII' of FIG. 19.

The description of the embodiment of FIGS. 19 to 21 will be focused on differences from the above-mentioned embodiments so as to avoid redundant description.

Referring to FIGS. 1 to 6, and 19 to 21, the display element layer DPL of the pixel PXL may include a first bank BNK1 disposed in the non-emission area NEA. The first bank BNK1 may be a structure that defines (or partitions) the emission area EMA of each pixel PXL.

In an embodiment of FIGS. 18 to 21, to discharge outgas generated from an organic layer to the first bank BNK1, the alignment electrode ALE, the bank pattern BNP, the first insulating layer INS1, the light emitting element LD, the electrode PE and/or the intermediate electrode CTE may be provided in the order listed, based on a surface of the pixel circuit layer PCL (or the passivation layer PSV).

The first alignment electrode ALE1 and the second alignment electrode ALE2 may be disposed on a surface of the passivation layer PSV and spaced apart from each other. The bank pattern BNP may be disposed on the first alignment electrode ALE1 and the second alignment electrode ALE2.

The bank pattern BNP may be disposed on the first alignment electrode ALE1 and the second alignment electrode ALE2 and overlap the first alignment electrode ALE1 and the second alignment electrode ALE2. The light emitting elements LD may be aligned (or disposed) between the bank pattern BNP that may be disposed on the second alignment electrode ALE2 and the bank pattern BNP that may be disposed on the first alignment electrode ALE1. In an embodiment, the bank pattern BNP may be a structure which accurately defines an alignment position of the light emitting elements LD.

The first insulating layer INS1 may be disposed on the first alignment electrode ALE1, the second alignment electrode ALE2, and the bank pattern BNP. The first insulating layer INS1 may be formed of an organic layer suitable for mitigating a step difference formed by the first alignment electrode ALE1, the second alignment electrode ALE2, and the bank pattern BNP and planarizing a support surface formed to support the light emitting elements LD, but the disclosure is not limited thereto. The first insulating layer INS1 may be provided on the passivation layer PSV and contact the passivation layer PSV.

The first insulating layer INS1 may be partially open in at least the emission area EMA. For example, the first insulating layer INS1 may be partially open to include, in at least the emission area EMA, openings that each expose an area of the bank pattern BNP. Each of the openings may be partially open to expose an area of the bank pattern BNP on the first alignment electrode ALE1 and the second alignment electrode ALE2. For example, the first insulating layer INS1 may include first openings OPN1 which expose an area of the bank pattern BNP on the 1-1-th alignment electrode ALE1_1 and the 2-2-th alignment electrode ALE2_2, an area of the bank pattern BNP on the 1-2-th alignment electrode ALE1_2 and the 2-3-th alignment electrode ALE2_3, an area of the bank pattern BNP on the 1-3-th alignment electrode ALE1_3 and the 2-4-th alignment electrode ALE2_4, and an area of the bank pattern BNP on the 1-4-th alignment electrode ALE1_4 and the 2-5-th alignment electrode ALE2_5.

The first bank BNK1 may be disposed on the first insulating layer INS1. The first bank BNK1 may be disposed on the first insulating layer INS1 in at least the non-emission area NEA of each pixel PXL. In an embodiment, the first bank BNK1 may not be disposed in at least the emission area EMA. The first bank BNK1 may include an organic layer. The first bank BNK1 may be connected to other insulating layers that may be disposed thereunder and formed of organic layers, and thus function as an outlet for discharging (or releasing) outgas that may be generated from the insulating layers.

The first bank BNK1 may be processed by liquid-repellent treatment so that the first bank BNK1 may have liquid repellency. During the liquid-repellent treatment process, the areas of the bank pattern BNP that may be exposed through the first openings OPN1 of the first insulating layer INS1 may have liquid repellency. The light emitting elements LD may not be aligned on the bank pattern BNP that may be exposed through the first opening OPN1. For example, the light emitting elements LD may not be aligned on each of the bank pattern BNP on the 1-1-th alignment electrode ALE1_1 and the 2-2-th alignment electrode ALE2_2, the bank pattern BNP on the 1-2-th alignment electrode ALE1_2 and the 2-3-th alignment electrode ALE2_3, the bank pattern BNP on the 1-3-th alignment electrode ALE1_3 and the 2-4-th alignment electrode ALE2_4, and the bank pattern BNP on the 1-4-th alignment electrode ALE1_4 and the 2-5-th alignment electrode ALE2_5. Hence, the number of light emitting elements LD aligned in an undesired area may be minimized, so that removal of the light emitting elements LD from desired positions may be reduced, whereby the number of valid light sources of each sub-pixel (or each pixel PXL) may be further increased.

In an embodiment, the bank pattern BNP and the first bank BNK1 may be formed through the same process. For example, as illustrated in the embodiment of FIG. 21, the bank pattern BNP and the first bank BNK1 may be formed on the same layer through the same process, and may include the same material. The first bank BNK1 disposed in the non-emission area NEA and the bank pattern BNP disposed in the emission area EMA may have different thicknesses (or heights) in the third direction DR3. For example, a thickness d4 of the first bank BNK1 in the third direction DR3 may be greater than a thickness d5 of the bank pattern BNP. The first bank BNK1 and the bank pattern BNP may be formed, using a halftone mask, to have different thicknesses.

In the case where the bank pattern BNP and the first bank BNK1 may be formed through the same process, the first insulating layer INS1 may be disposed on the bank pattern BNP and the first bank BNK1. The first insulating layer INS1 may be partially open to include a first opening OPN1 which exposes an area of the bank pattern BNP, and a second opening OPN2 which exposes an area of the first bank BNK1. After the first insulating layer INS1 including the first and second openings OPN1 and OPN2 may be formed, a liquid-repellent treatment process using fluorine-based plasma treatment may be performed, so that a surface of the bank pattern BNP that may be exposed through the first opening OPN1 and a surface of the first bank BNK1 that may be exposed through the second opening OPN2 may be fluorinated to have liquid repellency. Because the first bank BNK1 and the bank pattern BNP have liquid repellency, the light emitting elements LD may be aligned neither on the surface of the first bank BNK1 that has liquid repellency nor on the surface of the bank pattern BNP that has liquid repellency, during a process of supplying the light emitting elements LD to each pixel PXL. Hence, the number of light emitting elements LD aligned in an undesired area may be minimized, so that removal of the light emitting elements LD from desired positions may be reduced, whereby the number of valid light sources of each sub-pixel (or each pixel PXL) may be further increased.

Figure 22:
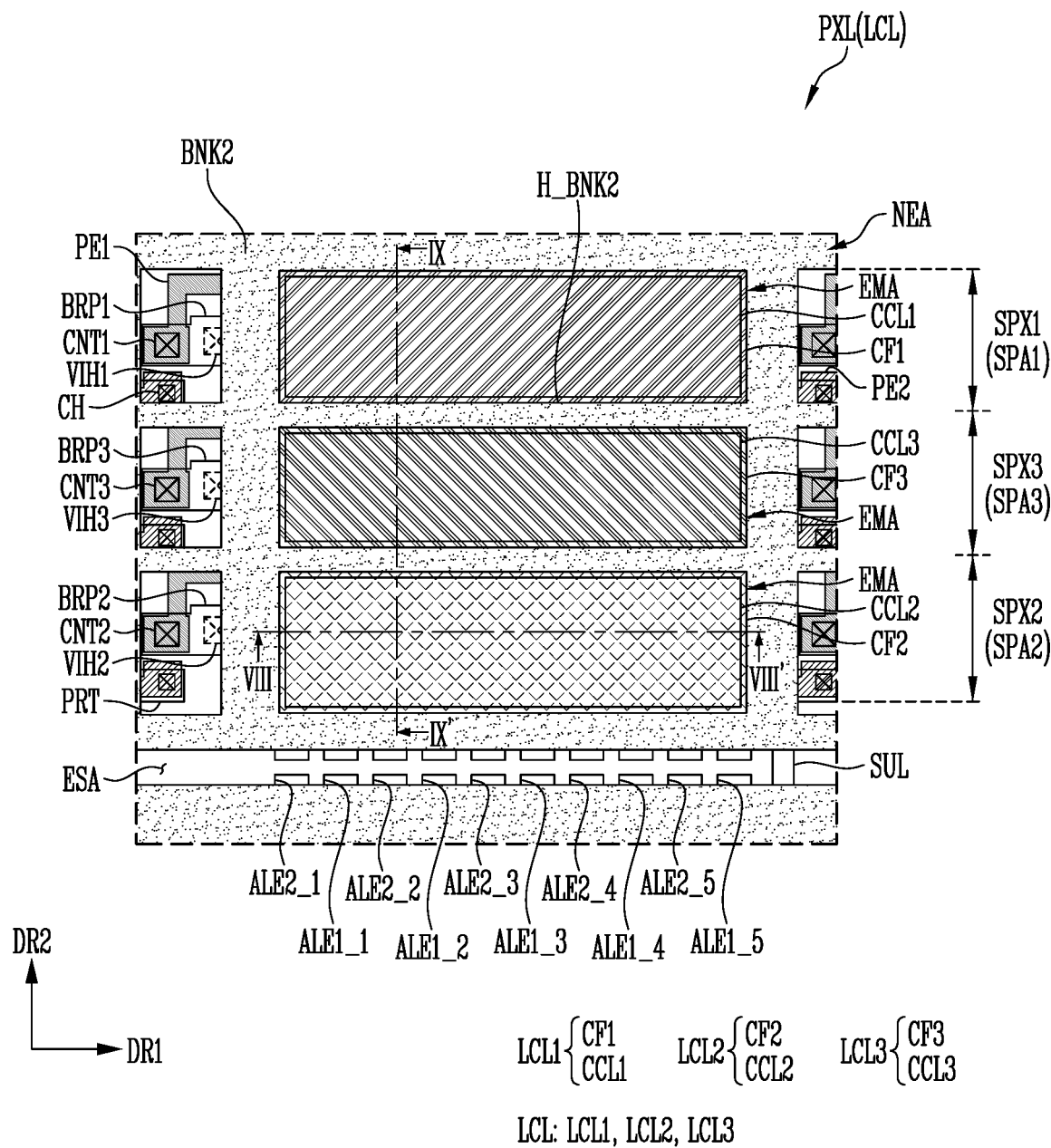
FIG. 22 is a schematic plan view illustrating an optical layer of a pixel in accordance with an embodiment.
Figure 23:
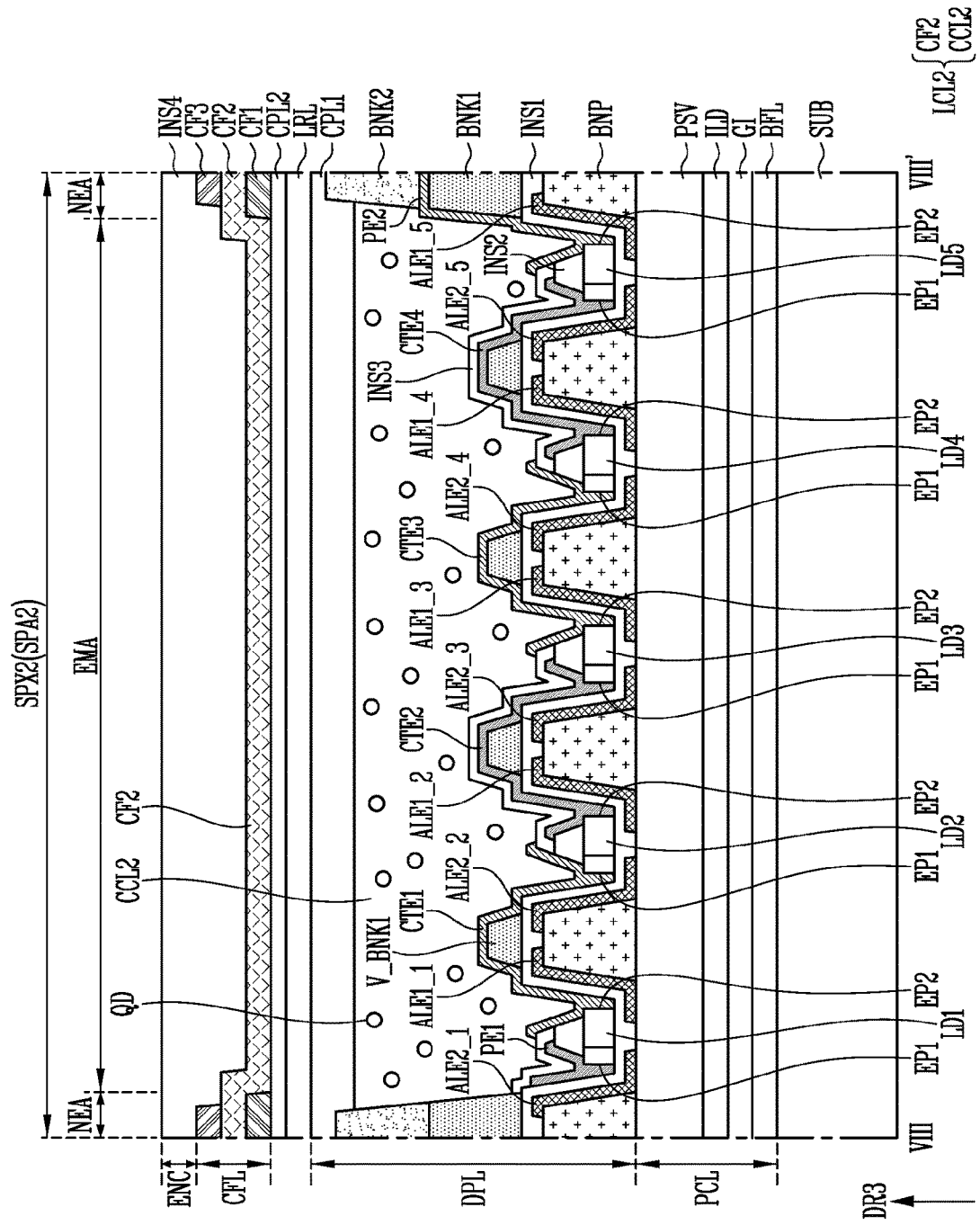
FIGS. 23 to 25 are schematic cross-sectional views taken along line VIII-VIII' of FIG. 22.
Figure 24:
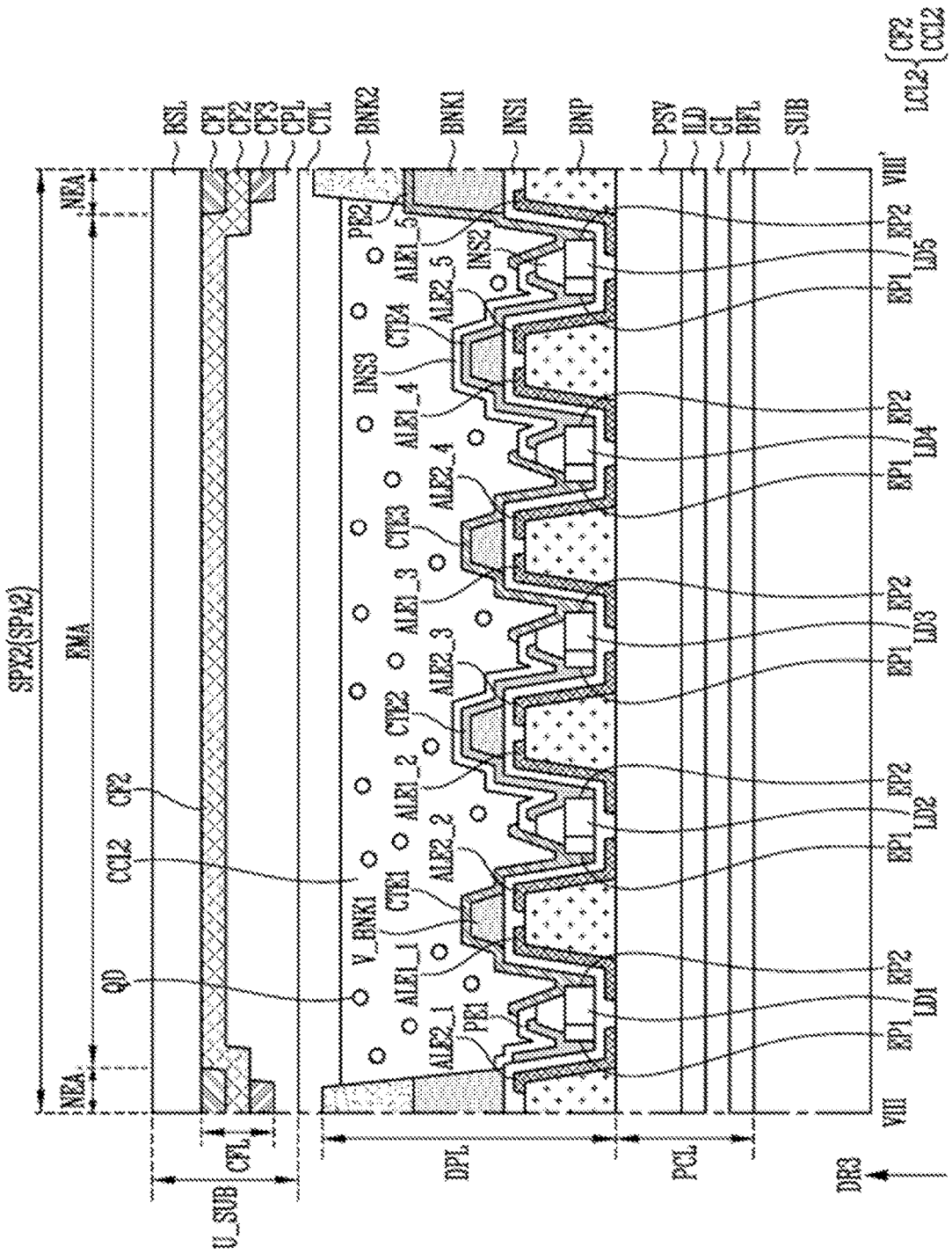
Figure 25:
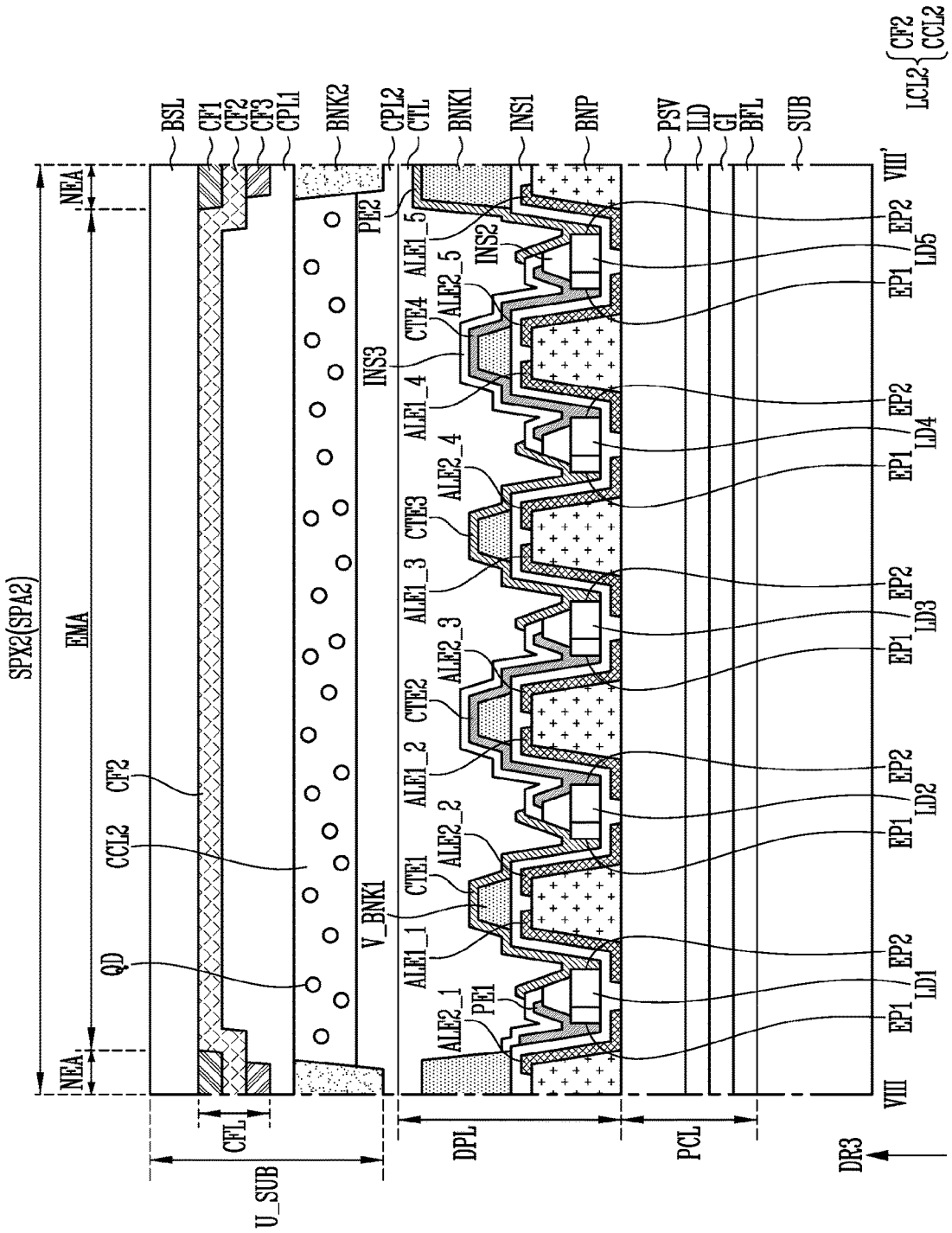
Figure 26:
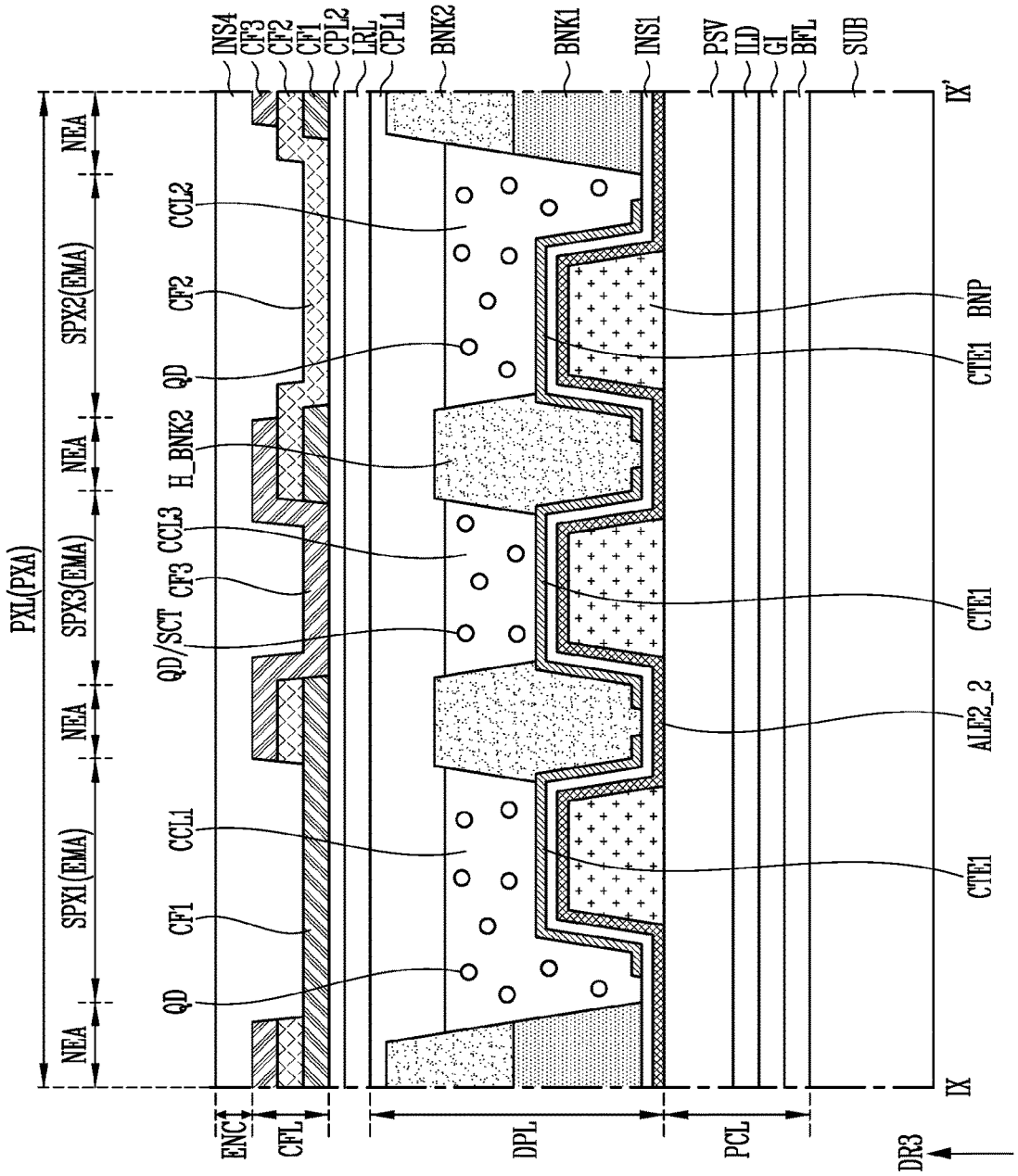
FIG. 26 is a schematic cross-sectional view taken along line IX-IX' of FIG. 22.

FIG. 22 is a schematic plan view illustrating the optical layer LCL of the pixel PXL in accordance with an embodiment. FIGS. 23 to 25 are schematic cross-sectional views taken along line VIII-VIII' of FIG. 22. FIG. 26 is a schematic cross-sectional view taken along line IX-IX' of FIG. 22.

FIGS. 23 to 25 illustrate different modification examples with regard to the position of a second color conversion layer CCL2. For example, FIG. 23 illustrates an embodiment in which the second color conversion layer CCL2 and a second color filter CF2 are disposed over the first and second electrodes PE1 and PE2 through successive processes. FIG. 24 illustrates an embodiment in which an upper substrate U_SUB including the second color filter CF2 may be disposed on the display element layer DPL including the second color conversion layer CCL2 through an adhesive process using an intermediate layer CTL. FIG. 25 illustrates an embodiment in which the upper substrate U_SUB including the second color conversion layer CCL2 and the second color filter CF2 may be disposed on the display element layer DPL through an adhesive process using the intermediate layer CTL.

The following description related to embodiments of FIGS. 22 to 26 will be focused on differences from the above-mentioned embodiments so as to avoid redundant description.

Referring to FIGS. 1 to 26, the optical layer LCL of the pixel PXL may include a first optical layer LCL1 disposed in the emission area EMA of the first sub-pixel SPX1, a second optical layer LCL2 disposed in the emission area EMA of the second sub-pixel SPX2, and a third optical layer LCL3 disposed in the emission area EMA of the third sub-pixel SPX3. The first optical layer LCL1 may include a first color conversion layer CCL1 and a first color filter CF1 which overlap each other. The second optical layer LCL2 may include a second color conversion layer CCL2 and a second color filter CF2 which overlap each other. The third optical layer LCL3 may include a third color conversion layer CCL3 and a third color filter CF3 which overlap each other.

In an embodiment, a second bank BNK2 may be disposed in the non-emission area NEA of each of the first, second, and third sub-pixels SPX1, SPX2, and SPX3.

The second bank BNK2 may be provided and/or formed on the first bank BNK1. The second bank BNK2 may include a second horizontal bank H_BNK2 which extends in the first direction DR1 and may be disposed between sub-pixels adjacent to each other in the second direction DR2. The second bank BNK2 including the second horizontal bank H_BNK2 may be a dam structure which encloses the emission area EMA of each of the first, second, and third sub-pixels SPX1, SPX2, and SPX3 and defines a position of each of the first, second, and third color conversion layers CCL1, CCL2, and CCL3 to ultimately define the emission area EMA. For example, the second bank BNK2 may be a dam structure which defines a position at which the first color conversion layer CCL1 may be supplied (or inputted) in the first sub-pixel SPX1, a position at which the second color conversion layer CCL2 may be supplied (or inputted) in the second sub-pixel SPX2, and a position at which the third color conversion layer CCL3 may be supplied (or inputted) in the third sub-pixel SPX3, thus ultimately defining (or partitioning) the respective emission area EMA of the first, second, and third sub-pixels SPX1, SPX2, and SPX3.

The second bank BNK2 may include light shielding material. For example, the second bank BNK2 may be a black matrix. In an embodiment, the second bank BNK2 may include at least one light shielding material and/or reflective material, and allow light emitted from the first, second, and third color conversion layers CCL1, CCL2, and CCL3 to more reliably travel in the image display direction (or the third direction DR3) of the display device, thus enhancing the light output efficiency of each of the first, second, and third color conversion layers CCL1, CCL2, and CCL3.

Each of the first, second, and third color conversion layers CCL1, CCL2, and CCL3 may be formed on (or over) the first electrode PE1, the first, second, third, and fourth intermediate electrodes CTE1, CTE2, CTE3, and CTE4, and the second electrode PE2 of the corresponding sub-pixel in the corresponding emission area EMA enclosed by the second bank BNK2.

Each of the first, second, and third color conversion layers CCL1, CCL2, and CCL3 may include color conversion particles QD corresponding to a specific color. For example, each of the first, second, and third color conversion layers CCL1, CCL2, and CCL3 may include color conversion particles QD which convert a first color of light emitted from each of the first, second, third, fourth, and fifth light emitting elements LD1, LD2, LD3, LD4, and LD5 to a second color (or a specific color) of light which may be different from the first color of light.

In the case where the first sub-pixel SPX1 among the first, second, and third sub-pixels SPX1, SPX2, and SPX3 is a red sub-pixel, the first color conversion layer CCL1 of the first sub-pixel SPX1 may include color conversion particles QD formed of red quantum dots which convert the first color of light emitted from each of the first, second, third, fourth, and fifth light emitting elements LD1, LD2, LD3, LD4, and LD5 to the second color of light, e.g., red light.

In the case where the second sub-pixel SPX2 among the first, second, and third sub-pixels SPX1, SPX2, and SPX3 is a green sub-pixel, the second color conversion layer CCL2 of the second sub-pixel SPX may include color conversion particles QD formed of green quantum dots which convert the first color of light emitted from each of the first, second, third, fourth, and fifth light emitting elements LD1, LD2, LD3, LD4, and LD5 to the second color of light, e.g., green light.

In the case where the third sub-pixel SPX3 among the first, second, and third sub-pixels SPX1, SPX2, and SPX3 is a blue sub-pixel, the third color conversion layer CCL3 of the third sub-pixel SPX3 may include the color conversion particles QD formed of blue quantum dots which convert the first color of light emitted from each of the first, second, third, fourth, and fifth light emitting elements LD1, LD2, LD3, LD4, and LD5 to the second color of light, e.g., blue light. In an embodiment, in case that the third sub-pixel SPX3 is a blue pixel, there may be provided a light scattering layer including light scattering particles SCT, in place of the third color conversion layer CCL3 including the color conversion particles QD. For example, in the case in which the first, second, third, fourth, and fifth light emitting elements LD1, LD2, LD3, LD4, and LD5 emit blue-based light, the third sub-pixel SPX3 may include a light scattering layer including the light scattering particles SCT. The light scattering layer may be omitted depending on embodiments. In an embodiment, in case that the third sub-pixel SPX3 is a blue pixel, there may be provided a transparent polymer, in place of the third color conversion layer CCL3.

The first optical layer LCL1, the second optical layer LCL2, and the third optical layer LCL3 may have structures which may be substantially similar or identical to each other. Hereinafter, an embodiment will be described based on the second optical layer LCL2 among the first, second, and third optical layers LCL1, LCL2, and LCL3.

A first capping layer CPL1 may be disposed both on the second conversion layer CCL2 of the second optical layer LCL2 disposed in the emission area EMA of the second sub-pixel SPX2 and on the second bank BNK2 disposed in the non-emission area NEA of the second sub-pixel SPX2.

The first capping layer CPL1 may be provided, to cover the second bank BNK2 and the second color conversion layer CCL2, in the overall surface (or the entirety) of the display area DA (or the second sub-pixel area SPA2) in which the second sub-pixel SPX2 may be disposed. The first capping layer CPL1 may be disposed on (e.g., directly disposed on) the second bank BNK2 and the second color conversion layer CCL2. The first capping layer CPL1 may be an inorganic insulating layer including inorganic material. The first capping layer CPL1 may include at least one of silicon nitride ($SiN_x$), silicon oxide ($SiO_x$), silicon oxynitride ($SiO_xN_y$), and aluminum oxide ($AlO_x$). The first capping layer CPL1 may cover the entirety of the second bank BNK2 and the second color conversion layer CCL2 and thus prevent external water or moisture from being drawn into the display element layer DPL.

The first capping layer CPL1 may mitigate a step difference formed by components disposed thereunder and have a planar surface. For example, the first capping layer CPL1 may include an organic insulating layer including organic material. The first capping layer CPL1 may be a common layer provided in common in the display area DA, but the disclosure is not limited thereto.

A low refractive layer LRL may be disposed on the first capping layer CPL. The low refractive layer LRL may change, using a difference in refractive index, a path of light to be lost among light (or rays) emitted from the second color conversion layer CCL2 to the front direction (or the image display direction of the display device), thus enhancing frontal output light luminance. Furthermore, the low refractive layer LRL may recycle blue-based light, which does not react with the second color conversion layer CCL2, to enable the blue-based light to react with the second color conversion layer CCL2, thus increasing the output light luminance of the second color conversion layer CCL2.

The low refractive layer LRL may include resin and hollow particles distributed in the resin and have a refractive index ranging from 1.1 to 1.3, but the disclosure is not limited thereto. In an embodiment, the low refractive layer LRL may include an anti-reflective film formed by alternately stacking layers made of different materials. Each layer may be formed of an organic insulating layer including organic material, but the disclosure is not limited thereto. In an embodiment, each layer may be formed of an inorganic insulating layer including inorganic material.

A second capping layer CPL2 may be disposed on the low refractive layer LRL. The second capping layer CPL2 may include at least one of silicon nitride ($SiN_x$), silicon oxide ($SiO_x$), silicon oxynitride ($SiO_xN_y$), and aluminum oxide ($AlO_x$), but the disclosure is not limited thereto. In an embodiment, the second capping layer CPL2 may be formed of an organic layer including organic material. The second capping layer CPL2 may be disposed on the low refractive layer LRL and the second color conversion layer CCL2 and protect the low refractive layer LRL and the second color conversion layer CCL2 from external water or moisture, thus further enhancing the reliability of the second color conversion layer CCL2.

A color filter layer CFL may be provided and/or formed on the second capping layer CPL2. The color filter layer CFL may include color filters CF1, CF2, and CF3 corresponding to the respective colors of adjacent sub-pixels. For example, the color filter layer CFL may include a first color filter CF1 disposed on the first color conversion layer CCL1 of the first sub-pixel SPX1, a second color filter CF2 disposed on the second color conversion layer CCL2 of the second sub-pixel SPX2, and a third color filter CF3 disposed on the third color conversion layer CCL3 of the third sub-pixel SPX3. The first, second, and third color filters CF1, CF2, and CF3 may be disposed in the non-emission area NEA and overlap each other, thus functioning as a light shielding component for preventing optical interference between adjacent sub-pixels from occurring. The first, second, and third color filters CF1, CF2, and CF3 each may include color filter material that allows the second color of light converted by the corresponding color conversion layer to selectively pass therethrough. For example, the first color filter CF1 may be a red color filter, the second color filter CF2 may be a green color filter, and the third color filter CF3 may be a blue color filter, but the disclosure is not limited thereto. The second color filter CF2 may be disposed on a surface of the second capping layer CPL2 and correspond to the second color conversion layer CCL2 in at least the emission area EMA of the second sub-pixel SPX2. The first color filter CF1 may be disposed on a surface of the second capping layer CPL2 and correspond to the first color conversion layer CCL1 in at least the emission area EMA of the first sub-pixel SPX1. The third color filter CF3 may be disposed on a surface of the second capping layer CPL2 and correspond to the third color conversion layer CCL3 in at least the emission area EMA of the third sub-pixel SPX3.

An encapsulation layer ENC may be provided and/or formed on the color filter layer CFL.

The encapsulation layer ENC may include a fourth insulating layer INS4. The fourth insulating layer INS4 may be an inorganic insulating layer including inorganic material or an organic insulating layer including organic material. The fourth insulating layer INS4 may cover the entirety of components disposed thereunder and prevent external water or moisture from being drawn into the color filter layer CFL and the display element layer DPL.

In the second sub-pixel SPX2 in accordance with the foregoing embodiment, the second optical layer LCL2 including the second color conversion layer CCL2 and the second color filter CF2 may be disposed on the first, second, third, fourth, and fifth light emitting elements LD1, LD2, LD3, LD4, and LD5 through successive processes, so that light having excellent color reproducibility may be emitted through the second color conversion layer CCL2 and the second color filter CF2, whereby the light output efficiency may be enhanced.

In an embodiment, the fourth insulating layer INS4 may be formed of multiple layers. For example, the fourth insulating layer INS4 may be formed of at least two inorganic insulating layers, and at least one organic insulating layer interposed between the at least two inorganic insulating layers. Here, the constituent material and/or structure of the fourth insulating layer INS4 may be changed in various ways. In some embodiments, at least one overcoat layer, at least one filler layer, and/or at least one upper substrate, etc., may be further disposed over the fourth insulating layer INS4.

Although in the foregoing embodiment the second color conversion layer CCL2 and the second color filter CF2 that form the second optical layer LCL2 may be formed on the first electrode PE1, the first, second, third, and fourth intermediate electrodes CTE1, CTE2, CTE3, and CTE4, and the second electrode PE2 through the successive processes, the disclosure is not limited thereto. In an embodiment, as illustrated in FIG. 24, the upper substrate U_SUB including the second color filter CF2 may be disposed over the display element layer DPL including the second color conversion layer CCL2, so that the display element layer DPL and the upper substrate U_SUB may be coupled to each other by an intermediate layer CTL or the like.

The intermediate layer CTL may be a transparent adhesive layer (or a transparent bonding layer), e.g., an optically clear adhesive layer, for enhancing the adhesive force between the display element layer DPL including the second color conversion layer CCL2 and the upper substrate U_SUB including the second color filter CF2, but the disclosure is not limited thereto. In an embodiment, the intermediate layer CTL may be a refractive index conversion layer provided to convert an refractive index of light that may be emitted from the first, second, third, fourth, and fifth light emitting elements LD1, LD2, LD3, LD4, and LD5 and travels to the upper substrate U_SUB, thus enhancing the light emitting luminance of the second sub-pixel SPX2 (or the pixel PXL). In an embodiment, the intermediate layer CTL may include a filler formed of insulating material having insulation property and adhesion property.

In an embodiment of FIG. 24, the upper substrate U_SUB may form, for example, an encapsulation substrate, a window component, and/or an overcoat layer of the display device. The upper substrate U_SUB may include a base layer BSL (or a base substrate), a color filter layer CFL, and a capping layer CPL.

The base layer BSL may be a rigid or flexible substrate, and the material or properties thereof are not particularly limited. The base layer BSL may be formed of the same material as that of the substrate SUB, or may be formed of material different from that of the substrate SUB.

The color filter layer CFL may be disposed on a surface of the base layer BSL and face the display element layer DPL. The second color filter CF2 may be disposed on a surface of the base layer BSL and face the second color conversion layer CCL2.

The capping layer CPL may be disposed between the color filter layer CFL and the intermediate layer CTL. The capping layer CPL may be disposed on the color filter layer CFL and cover the color filter layer CFL, thus protecting the color layer CFL. The capping layer CPL may be an inorganic layer including inorganic material or an organic layer including organic material.

Although, in the above-mentioned embodiment, there is illustrated the case where the second color conversion layer CCL2 and the second color filter CF2 that form the second optical layer LCL2 may be disposed on different substrates and face each other with the intermediate layer CTL interposed therebetween, the disclosure is not limited thereto. In an embodiment, the second color conversion layer CCL2 and the second color filter CF2 may be formed on a separate substrate, e.g., the upper substrate U_SUB, through successive processes, as illustrated in FIG. 25, and be coupled to the display element layer DPL including the first electrode PE1, the first, second third, and fourth intermediate electrodes CTE1, CTE2, CTE3, and CTE4, and the second electrode PE2 by the intermediate layer CTL or the like.

In an embodiment of FIG. 25, the upper substrate U_SUB may include a base layer BSL, a color filter layer CFL, a first capping layer CPL1, a second bank BNK2, a second color conversion layer CCL2, and a second capping layer CPL2.

The second color filter CF2 of the color filter layer CFL may be provided on a surface of the base layer BSL to correspond to the second color conversion layer CCL2 in the emission area EMA. The first, second, and third color filters CF1, CF2, and CF3 of the color filter layer CFL may be disposed in the non-emission area NEA and overlap each other, thus functioning as a light shielding component.

The first capping layer CPL1 may be disposed on the color filter layer CFL. The first capping layer CPL1 may be disposed on the color filter layer CFL and cover the color filter layer CFL, thus protecting the color layer CFL. The first capping layer CPL1 may be an inorganic layer including inorganic material or an organic layer including organic material.

The second bank BNK2 and the second color conversion layer CCL2 may be disposed on a surface of the first capping layer CPL1.

The second bank BNK2 may be a dam structure which ultimately defines the emission area EMA of the second sub-pixel SPX2. At the step of supplying the second color conversion layer CCL2, the second bank BNK2 may be a dam structure which ultimately defines the emission area EMA to which the second color conversion layer CCL2 may be supplied.

The second capping layer CPL2 may be disposed on the overall surfaces of the second bank BNK2 and the second color conversion layer CCL2.

The second capping layer CPL2 may include at least one of silicon nitride ($SiN_x$), silicon oxide ($SiO_x$), silicon oxynitride ($SiO_xN_y$), and aluminum oxide ($AlO_x$), but the disclosure is not limited thereto.

The upper substrate U_SUB may be connected with the display element layer DPL by the intermediate layer CTL.

In a pixel and a display device including the pixel in accordance with an embodiment, each of an anode contactor (or a first contactor) of a first sub-pixel, an anode contactor (or a second contactor) of a second sub-pixel, and a contactor (or a third contactor) of a third sub-pixel may be spaced apart from a signal line (or a scan line) to which a scan signal may be applied, so that the probability of a defect occurring due to parasitic capacitance which may be formed by overlap between the signal line and electrode patterns (e.g., upper electrodes) that respectively overlap the first to third contactors may be reduced or minimized.

Furthermore, in the pixel and the display device including the pixel in accordance with an embodiment, an auxiliary line and a bridge pattern spaced apart from alignment electrodes may be provided. The bridge pattern may be electrically connected to an anode (or a first electrode), and the auxiliary line may be electrically connected to a cathode (or a second electrode). Therefore, in case that the light emitting elements are driven, the alignment electrodes may be electrically separated from the anode and the cathode, so that a separate process for separating the alignment electrodes from each other may be omitted, whereby the fabrication process efficiency may be enhanced.

The effects of the disclosure are not limited by the foregoing, and other various effects are anticipated herein.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure.

What is claimed is:

1. A pixel comprising a first sub-pixel, a third sub-pixel, and a second sub-pixel arranged in a second direction, and each including an emission area and a non-emission area,
wherein each of the first sub-pixel, the second sub-pixel, and the third sub-pixel comprise:
a pixel circuit including at least one transistor and a storage capacitor;
a first alignment electrode disposed on the pixel circuit, and extending in the second direction;
a second alignment electrode extending in the second direction, and spaced apart from the first alignment electrode in a first direction intersecting the second direction;
a light emitting element disposed between the second alignment electrode and the first alignment electrode, and including a first end adjacent to the second alignment electrode and a second end adjacent to the first alignment electrode; and
a bridge pattern spaced apart from the first alignment electrode and the second alignment electrode, and electrically connected to the storage capacitor, wherein
the bridge pattern comprises:
a first bridge pattern electrically connected to the storage capacitor of the first sub-pixel;
a second bridge pattern electrically connected to the storage capacitor of the second sub-pixel; and
a third bridge pattern electrically connected to the storage capacitor of the third sub-pixel, and
in a plan view, the first bridge pattern, the third bridge pattern, and the second bridge pattern are located at a same column.

2. The pixel according to claim 1, wherein
each of the first, second, and third sub-pixels further comprises a first electrode and a second electrode which are electrically connected to the light emitting element and are spaced apart from each other in the first direction,
the first electrode of the first sub-pixel overlaps the first bridge pattern,
the first electrode of the second sub-pixel overlaps the second bridge pattern, and
the first electrode of the third sub-pixel overlaps the third bridge pattern.

3. The pixel according to claim 2, wherein
the first electrode of the first sub-pixel is electrically connected to the first bridge pattern through a first contactor,
the first electrode of the second sub-pixel is electrically connected to the second bridge pattern through a second contactor,
the first electrode of the third sub-pixel is electrically connected to the third bridge pattern through a third contactor, and
the first contactor, the third contactor, and the second contactor are arranged in the second direction in an order listed.

4. The pixel according to claim 3, wherein
the storage capacitor includes a lower electrode, and an upper electrode overlapping the lower electrode,
the first bridge pattern is electrically connected to the upper electrode of the storage capacitor of the first sub-pixel through a first via hole,
the second bridge pattern is electrically connected to the upper electrode of the storage capacitor of the second sub-pixel through a second via hole, and
the third bridge pattern is electrically connected to the upper electrode of the storage capacitor of the third sub-pixel through a third via hole.

5. The pixel according to claim 4, wherein
the first contactor overlaps the upper electrode of the first sub-pixel,
the second contactor overlaps the upper electrode of the second sub-pixel, and
the third contactor overlaps the upper electrode of the third sub-pixel.

6. The pixel according to claim 5, wherein
each of the first sub-pixel, the second sub-pixel, and the third sub-pixel further comprises an auxiliary line spaced apart from the first alignment electrode, the second alignment electrode, and the first to the third bridge patterns, and
the auxiliary line is electrically connected to the second electrode of each of the first sub-pixel, the second sub-pixel, and the third sub-pixel.

7. The pixel according to claim 6, further comprising:
a first power line to which a voltage of a first driving power supply is to be supplied; and
a second power line to which a voltage of a second driving power supply different from the voltage of the first driving power supply is to be applied, wherein
the first power line is electrically connected to the upper electrode of each of the first sub-pixel, the second sub-pixel, and the third sub-pixel, and
the second power line is electrically connected to the auxiliary line.

8. The pixel according to claim 3, wherein
the first alignment electrode of the first sub-pixel, the first alignment electrode of the third sub-pixel, and the first alignment electrode of the second sub-pixel are integrally formed and electrically connected to each other, and
the second alignment electrode of the first sub-pixel, the second alignment electrode of the third sub-pixel, and the second alignment electrode of the second sub-pixel are integrally formed and electrically connected to each other.

9. The pixel according to claim 8, further comprising:
a bank pattern disposed under each of the first alignment electrode and the second alignment electrode;
an insulating layer disposed on the first alignment electrode and the second alignment electrode; and
a first bank disposed on the insulating layer in the non-emission area, wherein
the first bank comprises a vertical bank disposed between the first alignment electrode and the second alignment electrode in at least the emission area, and extending in the second direction, and
in a cross-sectional view, a thickness of the vertical bank is less than a thickness of the first bank.

10. The pixel according to claim 9, wherein the first bank is disposed neither between the first sub-pixel and the third sub-pixel nor between the third sub-pixel and the second sub-pixel.

11. The pixel according to claim 9, wherein the first bank further comprises first horizontal banks respectively disposed between the first sub-pixel and the third sub-pixel and between the third sub-pixel and the second sub-pixel, each of the first horizontal banks extending in the first direction and intersecting the vertical bank.

12. The pixel according to claim 8, further comprising:
a bank pattern disposed on each of the first alignment electrode and the second alignment electrode;
an insulating layer disposed on the bank pattern and including a first opening formed to expose an area of the bank pattern; and
a first bank disposed in the non-emission area.

13. The pixel according to claim 12, wherein
the bank pattern and the first bank are integrally formed and disposed on a same layer, and
the insulating layer includes a second opening formed to expose an area of the first bank.

14. The pixel according to claim 9, wherein
the first alignment electrode comprises a 1-1-th alignment electrode, a 1-2-th alignment electrode, a 1-3-th alignment electrode, a 1-4-th alignment electrode, and a 1-5-th alignment electrode spaced apart from each other in the first direction and each extending in the second direction,
the second alignment electrode comprises a 2-1-th alignment electrode, a 2-2-th alignment electrode, a 2-3-th alignment electrode, a 2-4-th alignment electrode, and a 2-5-th alignment electrode spaced apart from each other in the first direction and each extending in the second direction, and
the first alignment electrode and the second alignment electrode are alternately disposed in the first direction.

15. The pixel according to claim 14, wherein
the first electrode of each of the first sub-pixel, the second sub-pixel, and the third sub-pixel overlaps the 2-1-th alignment electrode, and
the second electrode of a corresponding sub-pixel overlaps the 1-5-th alignment electrode.

16. The pixel according to claim 15, wherein each of the first sub-pixel, the second sub-pixel, and the third sub-pixel further comprise:
a first intermediate electrode disposed between the first electrode and the second electrode at a position spaced apart from the first and the second electrodes in the first direction, and overlapping the 1-1-th alignment electrode and the 2-2-th alignment electrode;
a second intermediate electrode disposed between the first intermediate electrode and the second electrode at a position spaced apart from the first intermediate electrode and the second electrode in the first direction, and overlapping the 1-2-th alignment electrode and the 2-3-th alignment electrode;
a third intermediate electrode disposed between the second intermediate electrode and the second electrode at a position spaced apart from the second intermediate electrode and the second electrode in the first direction, and overlapping the 1-3-th alignment electrode and the 2-4-th alignment electrode; and
a fourth intermediate electrode disposed between the third intermediate electrode and the second electrode at a position spaced apart from the third intermediate electrode and the second electrode in the first direction, and overlapping the 1-4-th alignment electrode and the 2-5-th alignment electrode.

17. The pixel according to claim 16, wherein the light emitting element of each of the first sub-pixel, the second sub-pixel, and the third sub-pixel comprises:
a first light emitting element disposed between the 2-1-th alignment electrode and the 1-1-th alignment electrode, and including a first end electrically connected to the first electrode, and a second end electrically connected to the first intermediate electrode;
a second light emitting element disposed between the 2-2-th alignment electrode and the 1-2-th alignment electrode, and including a first end electrically connected to the first intermediate electrode, and a second end electrically connected to the second intermediate electrode;
a third light emitting element disposed between the 2-3-th alignment electrode and the 1-3-th alignment electrode, and including a first end electrically connected to the second intermediate electrode, and a second end electrically connected to the third intermediate electrode;
a fourth light emitting element disposed between the 2-4-th alignment electrode and the 1-4-th alignment electrode, and including a first end electrically connected to the third intermediate electrode, and a second end electrically connected to the fourth intermediate electrode; and
a fifth light emitting element disposed between the 2-5-th alignment electrode and the 1-5-th alignment electrode, and including a first end electrically connected to the fourth intermediate electrode, and a second end electrically connected to the second electrode.

18. The pixel according to claim 17, wherein each of the first, the second, and the third sub-pixels comprises:
a second bank disposed on the first bank in the non-emission area;
a color conversion layer disposed over the first to the fifth light emitting elements in the emission area, and that converts a first color of light emitted from the first to the fifth light emitting elements to a second color of light; and
a color filter disposed on the color conversion layer and that allows the second color of light to selectively pass therethrough.

19. The pixel according to claim 18, wherein the second bank further comprises second horizontal banks respectively disposed between the first sub-pixel and the third sub-pixel and between the third sub-pixel and the second sub-pixel, each of the second horizontal banks extending in the first direction.

20. A display device comprising:
a substrate including a display area and a non-display area; and at least one pixel disposed in the display area, and comprising a first sub-pixel, a third sub-pixel, and a second sub-pixel each including an emission area and a non-emission area and arranged in a second direction, wherein each of the first sub-pixel, the second sub-pixel, and the third sub-pixel comprise:

a pixel circuit including at least one transistor and a storage capacitor;

a first alignment electrode disposed on the pixel circuit, and extending in the second direction;

a second alignment electrode extending in the second direction, and spaced apart from the first alignment electrode in a first direction intersecting the second direction;

a light emitting element disposed between the second alignment electrode and the first alignment electrode, and including a first end adjacent to the second alignment electrode and a second end adjacent to the first alignment electrode; and a bridge pattern spaced apart from the first alignment electrode and the second alignment electrode, and electrically connected to the storage capacitor, wherein the bridge pattern comprises:

a first bridge pattern electrically connected to the storage capacitor of the first sub-pixel;

a second bridge pattern electrically connected to the storage capacitor of the second sub-pixel; and a third bridge pattern electrically connected to the storage capacitor of the third sub-pixel, and in a plan view, the first bridge pattern, the third bridge pattern, and the second bridge pattern are located at a same column.

\* \* \* \* \*